(12) United States Patent
Yoshimura et al.

(10) Patent No.: US 11,824,095 B2
(45) Date of Patent: Nov. 21, 2023

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventors: Takashi Yoshimura, Matsumoto (JP); Yuichi Onozawa, Matsumoto (JP); Hiroshi Takishita, Matsumoto (JP); Misaki Meguro, Matsumoto (JP); Motoyoshi Kubouchi, Matsumoto (JP); Naoko Kodama, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/577,361

(22) Filed: Jan. 17, 2022

(65) Prior Publication Data
US 2022/0140091 A1    May 5, 2022

Related U.S. Application Data

(60) Division of application No. 16/799,733, filed on Feb. 24, 2020, now Pat. No. 11,239,324, which is a
(Continued)

(30) Foreign Application Priority Data

Mar. 19, 2018  (JP) ................ 2018-051655

(51) Int. Cl.
*H01L 29/36* (2006.01)
*H01L 21/22* (2006.01)
(Continued)

(52) U.S. Cl.
CPC .............. *H01L 29/36* (2013.01); *H01L 21/22* (2013.01); *H01L 21/265* (2013.01);
(Continued)

(58) Field of Classification Search
CPC ......... H01L 29/36; H01L 21/22; H01L 29/06; H01L 29/12; H01L 29/739; H01L 29/78;
(Continued)

(56) References Cited

U.S. PATENT DOCUMENTS

2005/0116249 A1   6/2005   Mauder
2008/0315364 A1  12/2008   Nemoto
(Continued)

FOREIGN PATENT DOCUMENTS

CN   105814694 A    7/2016
CN   106062960 A   10/2016
(Continued)

OTHER PUBLICATIONS

International Search Report and (ISA/237) Written Opinion of the International Search Authority for International Patent Application No. PCT/JP2019/011180, dated Jun. 4, 2019.
(Continued)

*Primary Examiner* — Shahed Ahmed

(57) ABSTRACT

Provided is a semiconductor device including a semiconductor substrate; a hydrogen donor that is provide inside the semiconductor substrate in a depth direction, has a doping concentration that is higher than a doping concentration of a dopant of the semiconductor substrate, has a doping concentration distribution peak at a first position that is a predetermined distance in the depth direction of the semiconductor substrate away from one main surface of the semiconductor substrate, and has a tail of the doping concentration distribution where the doping concentration is lower than at the peak, farther on the one main surface side than where the first position is located; and a crystalline defect region having a crystalline defect density center peak at a position shallower than the first position, in the depth direction of the semiconductor substrate.

12 Claims, 28 Drawing Sheets

Related U.S. Application Data continuation of application No. PCT/JP2019/011180, filed on Mar. 18, 2019.

(51) Int. Cl.

| | | |
|---|---|---|
| *H01L 21/265* | (2006.01) | |
| *H01L 21/322* | (2006.01) | |
| *H01L 29/06* | (2006.01) | |
| *H01L 29/12* | (2006.01) | |
| *H01L 29/739* | (2006.01) | |
| *H01L 29/78* | (2006.01) | |
| *H01L 29/861* | (2006.01) | |

(52) U.S. Cl.
CPC ............ *H01L 21/322* (2013.01); *H01L 29/06* (2013.01); *H01L 29/12* (2013.01); *H01L 29/739* (2013.01); *H01L 29/78* (2013.01); *H01L 29/861* (2013.01)

(58) Field of Classification Search
CPC ............. H01L 29/861; H01L 29/66348; H01L 29/0834; H01L 29/7397; H01L 29/8613; H01L 29/407; H01L 29/32; H01L 21/26506; H01L 21/322–3228; H01L 21/3115–31155; H01L 21/3215–32155; H01L 21/046–047; H01L 29/30–34; H01L 21/265–266; H01L 21/425–426; H01L 29/04–045
See application file for complete search history.

(56) References Cited

U.S. PATENT DOCUMENTS

| | | | |
|---|---|---|---|
| 2009/0224284 A1 | 9/2009 | Nemoto | |
| 2010/0187598 A1 | 7/2010 | Endo | |
| 2013/0093065 A1* | 4/2013 | Kachi | H01L 29/861 |
| | | | 257/E29.002 |
| 2013/0249058 A1 | 9/2013 | Neidhart | |
| 2014/0117502 A1 | 5/2014 | Laven | |
| 2014/0246750 A1 | 9/2014 | Takishita | |
| 2014/0246755 A1 | 9/2014 | Yoshimura | |
| 2014/0291723 A1 | 10/2014 | Miyazaki | |
| 2014/0302621 A1* | 10/2014 | Niimura | H01L 21/765 |
| | | | 438/798 |
| 2014/0357026 A1 | 12/2014 | Kobayashi | |
| 2014/0374793 A1 | 12/2014 | Miyazaki | |
| 2015/0024556 A1 | 1/2015 | Miyazaki | |
| 2015/0050754 A1 | 2/2015 | Ploss | |
| 2015/0050798 A1 | 2/2015 | Kobayashi | |
| 2015/0179441 A1 | 6/2015 | Onozawa | |
| 2015/0214347 A1 | 7/2015 | Falck | |
| 2015/0228717 A1 | 8/2015 | Hara | |
| 2015/0270132 A1 | 9/2015 | Laven | |
| 2015/0311279 A1 | 10/2015 | Onozawa | |
| 2015/0357229 A1 | 12/2015 | Schulze | |
| 2015/0371858 A1 | 12/2015 | Laven | |
| 2016/0141399 A1 | 5/2016 | Jelinek | |
| 2016/0172438 A1 | 6/2016 | Jelinek | |
| 2016/0276446 A1 | 9/2016 | Wakimoto | |
| 2016/0276470 A1* | 9/2016 | Gouda | H01L 21/324 |
| 2017/0018434 A1 | 1/2017 | Onozawa | |
| 2017/0222029 A1* | 8/2017 | Kono | H01L 29/0821 |
| 2017/0271447 A1 | 9/2017 | Tamura | |
| 2017/0373141 A1* | 12/2017 | Yoshida | H01L 27/0664 |
| 2018/0005829 A1* | 1/2018 | Takishita | H01L 21/8222 |
| 2018/0005831 A1 | 1/2018 | Schulze | |
| 2018/0012762 A1 | 1/2018 | Mukai | |
| 2018/0122895 A1 | 5/2018 | Jelinek | |
| 2018/0166279 A1 | 6/2018 | Tamura | |
| 2018/0248004 A1 | 8/2018 | Majhi | |
| 2018/0350962 A1 | 12/2018 | Naito | |
| 2019/0139772 A1 | 5/2019 | Kodama | |
| 2021/0082702 A1 | 3/2021 | Agata | |
| 2021/0104407 A1 | 4/2021 | Meguro | |

FOREIGN PATENT DOCUMENTS

| | | |
|---|---|---|
| CN | 107004723 A | 8/2017 |
| CN | 107408581 A | 11/2017 |
| JP | 2008091853 A | 4/2008 |
| JP | 2008227414 A | 9/2008 |
| JP | 2009188336 A | 8/2009 |
| JP | 2010147239 A | 7/2010 |
| JP | 2015153784 A | 8/2015 |
| JP | 2016046480 A | 4/2016 |
| JP | 2017034273 A | 2/2017 |
| WO | 2007055352 A1 | 5/2007 |
| WO | 2013089256 A1 | 6/2013 |
| WO | 2013100155 A1 | 7/2013 |
| WO | 2013108911 A1 | 7/2013 |
| WO | 2013141141 A1 | 9/2013 |
| WO | 2013141221 A1 | 9/2013 |
| WO | 2013147274 A1 | 10/2013 |
| WO | 2013147275 A1 | 10/2013 |
| WO | 2014065080 A1 | 5/2014 |
| WO | 2016051973 A1 | 4/2016 |
| WO | 2016157935 A1 | 10/2016 |
| WO | 2017047285 A1 | 3/2017 |
| WO | 2017048275 A1 | 3/2017 |
| WO | 2017146148 A1 | 8/2017 |
| WO | 2018030444 A1 | 2/2018 |
| WO | 2018105299 A1 | 6/2018 |
| WO | 2020080295 A1 | 4/2020 |
| WO | 2020138218 A1 | 7/2020 |

OTHER PUBLICATIONS

U.S. Appl. No. 16/799,733, filed Feb. 24, 2020, to Takashi Yoshimura et al.

Office Action issued for counterpart Chinese Application 201980004053.1, issued by The State Intellectual Property Office of People's Republic of China dated Mar. 13, 2023.

Office Action issued for counterpart Japanese Application No. 2022-019310, issued by the Japanese Patent Office dated Mar. 28, 2023 (drafted on Mar. 27, 2023).

International Search Report and (ISA/237) Written Opinion of the International Search Authority for International Patent Application No. PCT/JP2020/034016, mailed by the Japan Patent Office dated Nov. 24, 2020.

\* cited by examiner

SEMICONDUCTOR DEVICE AND SEMICONDUCTOR DEVICE MANUFACTURING METHOD

CROSS-REFERENCE TO RELATED APPLICATIONS

This application is a divisional of U.S. patent application Ser. No. 16/799,733, filed on Feb. 24, 2020, which is a continuation of International Patent Application No. PCT/JP2019/011180, filed on Mar. 18, 2019, the entirety of each of which is incorporated herein by reference. The application also claims priority from the following Japanese patent application, which is explicitly incorporated herein by reference:

No. 2018-051655 filed in JP on Mar. 19, 2018.

BACKGROUND

1. Technical Field

The present invention relates to a semiconductor device and a semiconductor device manufacturing method.

2. Related Art

A conventional semiconductor device such as an insulated gate bipolar transistor (IGBT) is known, as shown in Patent Document 1, for example.

Patent Document 1: US Patent Application Publication 2005/0116249

In a semiconductor device, it is preferable to control the carrier lifetime.

SUMMARY

According to a first aspect of the present invention, provided is a semiconductor device. comprising a semiconductor substrate. The semiconductor device may include a hydrogen donor. The hydrogen donor may be provided inside the semiconductor substrate in a depth direction, and may have a doping concentration that is higher than a doping concentration of a dopant of the semiconductor substrate. The hydrogen donor may have a doping concentration distribution peak at a first position that is a predetermined distance in the depth direction of the semiconductor substrate away from one main surface of the semiconductor substrate. The hydrogen donor may have a tail in the doping concentration distribution where the doping concentration is lower than at the peak, farther on the one main surface side than where the first position is located. The semiconductor device may comprise a crystalline defect region having a crystalline defect density center peak at a position shallower than the first position, in the depth direction of the semiconductor substrate.

The semiconductor substrate may include a drift region of a first conductivity type provided to include the first position. The semiconductor substrate may include an anode region of a second conductivity type provided between the drift region and one main surface of the semiconductor substrate.

The semiconductor substrate may include a buffer region of a first conductivity type and a higher doping concentration than the drift region, between the drift region and the other main surface of the semiconductor substrate.

A doping concentration distribution of the hydrogen donor may have donor peaks at a plurality of positions in the buffer region. The crystalline defect region may have a crystalline defect density center peak, between a plurality of donor peaks of the hydrogen donor, in the depth direction of the semiconductor substrate.

The doping concentration distribution of the hydrogen donor may have donor peaks at a plurality of positions in the buffer region. The crystalline defect region may have a center peak of the crystalline defect density farther on the other main surface side of the semiconductor substrate than where the plurality of donor peaks of the hydrogen donors are located, in the depth direction of the semiconductor substrate.

The crystalline defect region may be provided from the center peak to the one main surface, in the depth direction of the semiconductor substrate.

The doping concentration of the hydrogen donor concentration distribution at the first position may be greater than or equal to $1 \times 10^{14}$ (/cm$^3$) and less than or equal to $1 \times 10^{15}$ (/cm$^3$).

The semiconductor device may comprise a transistor portion in which a collector region of a second conductivity type is provided in a region in contact with the other main surface of the semiconductor substrate. The semiconductor device may comprise a diode portion in which a cathode region of a first conductivity type with a higher doping concentration than the concentration of the dopant in the semiconductor substrate is provided in the region in contact with the other main surface of the semiconductor substrate. The diode portion may include the first crystalline defect region. The transistor portion may include the first crystalline defect region. The transistor portion may include the first crystalline defect region in a region in contact with the diode portion. The semiconductor device may further comprise an edge termination structure portion arranged between an outer circumferential edge of the semiconductor substrate and an active portion in which the transistor portion and the diode portion are provided, on a top surface of the semiconductor substrate. The edge termination structure portion may include the first crystalline defect region.

The crystalline defect density distribution may have a tail from the center peak toward the one main surface of the semiconductor substrate. The crystalline defect density of the anode region may be less than or equal to half of the crystalline density distribution at the center peak.

The crystalline defect density of the anode region may be the same as a minimum value of the crystalline defect density in the drift region.

According to a second aspect of the present invention, provided is a semiconductor device manufacturing method. The manufacturing method may comprise a step of implanting hydrogen ions in a depth direction of a semiconductor substrate through one main surface of the semiconductor substrate. The manufacturing method may comprise a step of annealing the semiconductor substrate at a first temperature. The annealing step may reduce the crystalline defects generated at a position where the hydrogen ion implantation causes a maximum hydrogen concentration. The annealing step may form a position where a defect density of crystalline defects formed by the hydrogen ion implantation is at a maximum value farther on the one main surface side than where a position of the maximum hydrogen concentration is located.

The manufacturing method may comprise, before the step of implanting hydrogen ions in the depth direction of the semiconductor substrate through the one main surface side of the semiconductor substrate, a step of implanting hydrogen ions in the depth direction of the semiconductor substrate through the other main surface side of the semiconductor substrate. The manufacturing method may comprise, before the step of implanting hydrogen ions in the depth direction of the semiconductor substrate through the one main surface side of the semiconductor substrate, a step of annealing the semiconductor substrate, into which the hydrogen ions have been implanted from the other main surface, at a second temperature that is higher than the first temperature.

The step of implanting hydrogen ions in the depth direction of the semiconductor substrate through the other main surface side of the semiconductor substrate may include a step of implanting the hydrogen ions a plurality of times, such that peaks of a hydrogen ion concentration distribution are at different positions in the depth direction of the semiconductor substrate.

The manufacturing method may comprise a step of forming the semiconductor substrate into chips after the step of annealing at the first temperature. The manufacturing method may comprise a soldering step of soldering the semiconductor substrate that has been formed into chips at a third temperature onto a circuit board. The third temperature may be lower than the first temperature.

In the step of implanting the hydrogen ions, the hydrogen ions may be implanted with an acceleration energy resulting in a range of 8 μm or more from the one main surface of the semiconductor substrate.

An acceleration energy in the step of implanting the hydrogen ions may be greater than or equal to 1.0 MeV. The acceleration energy may be greater than or equal to 1.5 MeV. An acceleration energy in the step of implanting the hydrogen ions may be less than or equal to 11.0 MeV. The acceleration energy may be less than or equal to 5.0 MeV. The acceleration energy may be less than or equal to 2.0 MeV.

The dose amount of the hydrogen ions in the step of implanting the hydrogen ions may be greater than or equal to $1.0 \times 10^{12}/cm^2$. The dose amount of the hydrogen ions in the step of implanting the hydrogen ions may be less than or equal to $1.0 \times 10^{15}/cm^2$.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

In this specification, one side of the semiconductor substrate in one direction parallel to a depth direction is referred to as the "top" and the side of the semiconductor substrate in the other direction parallel to the depth direction is referred to as the "bottom". Among the two surfaces of each of a substrate, layers, and other components, one surface is referred to as the "top surface" and the other surface is referred to as the "bottom surface."

The directions of the "top" and "bottom" are not limited to the direction of gravity or to the direction of attachment to the substrate or the like when the semiconductor device is implemented.

In this specification, there are cases where technical concepts are described using orthogonal coordinate axes of the X-axis, the Y-axis, and the Z-axis. In this specification, a plane parallel to the top surface of the semiconductor substrate is the XY-plane, and a depth direction that is perpendicular to the top surface of the semiconductor substrate is the Z-axis.

In each embodiment, an example is described in which a first conductivity type is N type and a second conductivity type is P type, but instead a first conductivity type may be P type and a second conductivity type may be N type. In this case, the conductivity type of each substrate, layer, region, and the like in each embodiment may have the opposite polarity. Furthermore, when P+ type (or N+ type) is used in this specification, this means that the doping concentration is higher than when P type (or N type) is used, and when P− type (or N-type) is used, this means that the doping concentration is lower than when P type (or N type) is used.

In this specification, the doping concentration refers to the concentration of impurities that have become donors or acceptors. In this specification, the difference between the concentration of the donors and the concentration of the acceptors (that is, the net doping concentration), may be referred to as the doping concentration. Furthermore, the peak value of the doping concentration distribution in a doping region may be referred to as the doping concentration in this doping region.

Figure 1A:
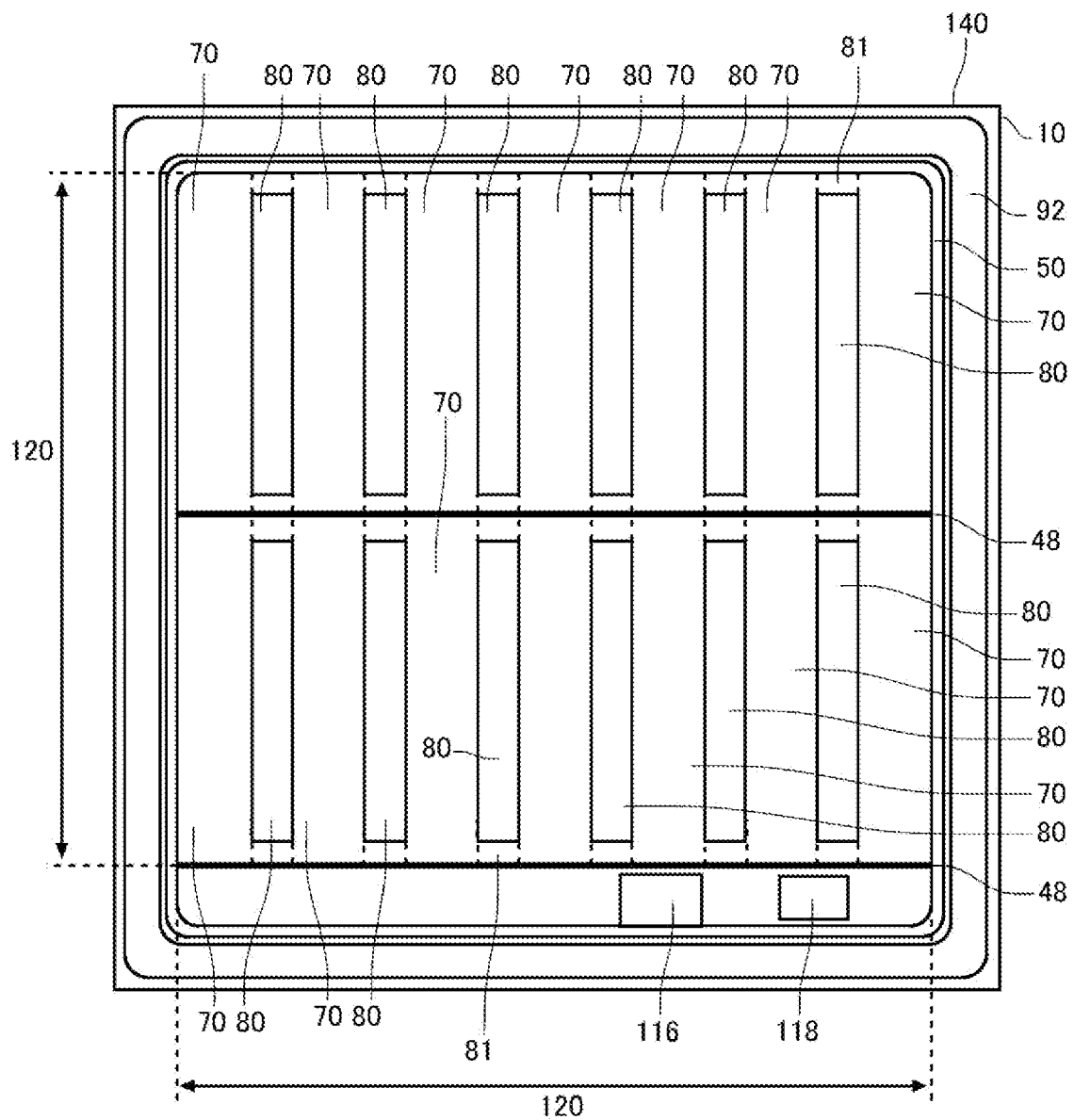
FIG. 1A is a top surface view of an example of a semiconductor device 100 according to one embodiment of the present invention.

FIG. 1A is a top surface view of an example of a semiconductor device 100 according to one embodiment of the present invention. The semiconductor device 100 includes a semiconductor substrate 10. The semiconductor substrate 10 may be a silicon substrate, a silicon carbide substrate, a nitride semiconductor substrate such as a gallium nitride substrate, a diamond semiconductor substrate, or an oxide semiconductor substrate such as a gallium oxide substrate. The semiconductor substrate 10 in the present example is a silicon substrate. In FIG. 1A, the end portion at the periphery of the semiconductor substrate 10 is a peripheral edge 140.

The semiconductor device 100 includes an active portion 120 and an edge termination structure portion 92. The active portion 120 is a region in which a main current flows between the top surface and the bottom surface of the semiconductor substrate 10 when the semiconductor device 100 is controlled to be in the ON state. In other words, the active portion 120 is a region in which current flows in the depth direction inside the semiconductor substrate 10, from the top surface to the bottom surface of the semiconductor substrate 10 or from the bottom surface to the top surface of the semiconductor substrate 10. An interlayer dielectric, an emitter electrode, and the like, which are described further below, are provided above the active portion 120, but are omitted from FIG. 1A. The region covered by the emitter electrode may be the active portion 120.

At least one of a transistor portion 70 and a diode portion 80 is provided in the active portion 120. The transistor portion 70 includes a transistor such as an insulated gate bipolar transistor (IGBT). The diode portion 80 includes a diode such as a free wheel diode (FWD). In the example of FIG. 1A, transistor portions 70 and diode portions 80 are arranged along a prescribed arrangement direction (Y-axis direction). The transistor portions 70 and the diode portions 80 may be arranged in contact with each other in an alternating manner along the arrangement direction. In the active portion 120, a transistor portion 70 may be provided at each end in the Y-axis direction. In another example, the diode portion 80 may be provided in the active portion 120 while the transistor portion 70 is not provided in the active portion 120.

Each diode portion 80 is provided with an N+ type cathode region, in a region in contact with the bottom surface of the semiconductor substrate 10. In FIG. 1A, the diode portions 80 indicated by solid lines are regions where the cathode region 82 is provided on the bottom surface 23 of the semiconductor substrate 10. In the semiconductor device 100 of the present example, among the regions in contact with the bottom surface of the semiconductor substrate 10, a collector region 22 is provided in the region that is not the cathode region 82.

The diode portions 80 are regions where the cathode region 82 is projected in the Z-axis direction. The transistor portions 70 are regions where the collector region 22 is provided on the bottom surface of the semiconductor substrate 10 and unit structures, which each include an emitter region and a gate trench portion described further below, are provided periodically on the top surface of the semiconductor substrate 10. Extending regions 81 (the portions indicated by the dashed lines extending from the diode portions 80 in FIG. 1A) in which the regions where the cathode region 82 is projected extend in the X-axis direction to the end portion of the active portion 120 or the gate runner 48, may also be included in the diode portions 80.

The semiconductor device 100 of the present example further includes a gate metal layer 50 and a gate runner 48. Furthermore, the semiconductor device 100 may include pads such as a gate pad 116 and an emitter pad 118. The gate pad 116 is electrically connected to the gate metal layer 50 and the gate runner 48. The emitter pad 118 is electrically connected to the emitter electrode 52.

The gate metal layer 50 may be provided surrounding the active portion 120 in the top surface view of the semiconductor substrate 10. The gate pad 116 and the emitter pad 118 may be arranged within the region surrounded by the gate metal layer 50. The gate metal layer 50 may be formed of a metal material such as aluminum or an aluminum-silicon alloy. The gate metal layer 50 is insulated from the semiconductor substrate 10 by an interlayer dielectric film. Furthermore, the gate metal layer 50 is provided to be separated from the emitter electrode. The gate metal layer 50 transmits the gate voltage applied to the gate pad 116 to the transistor portions 70.

The gate runner 48 connects the gate metal layer 50 and the transistor portions 70. The gate runner 48 may be formed of a semiconductor material such as polysilicon doped with impurities. A portion of the gate runner 48 may be provided above the active portion 120. The gate runner 48 shown in FIG. 1A is provided traversing the active portion 120 in the Y-axis direction. In this way, it is possible to restrict delays and a decrease in the gate voltage even at the inside of the active portion 120, which is distanced from the gate metal layer 50. A portion of the gate runner 48 may be arranged surrounding the active portion 120, along the gate metal layer 50. The gate runner 48 may be connected to the transistor portion 70 at an end portion of the active portion 120.

The edge termination structure portion 92 is provided between the active portion 120 and the peripheral edge 140 of the semiconductor substrate 10, on the top surface of the semiconductor substrate 10. In the present example, the gate metal layer 50 is arranged between the edge termination structure portion 92 and the active portion 120. The edge termination structure portion 92 may be arranged with an annular shape surrounding the active portion 120 on the top surface of the semiconductor substrate 10. The edge termination structure portion 92 of the present example is arranged along the peripheral edge 140 of the semiconductor substrate 10. The edge termination structure portion 92 relaxes the electric field concentration on the top surface side of the semiconductor substrate 10. The edge termination structure portion 92 has a guard ring, a field plate, a RESURF, and a structure in which these components are combined, for example.

Figure 1B:
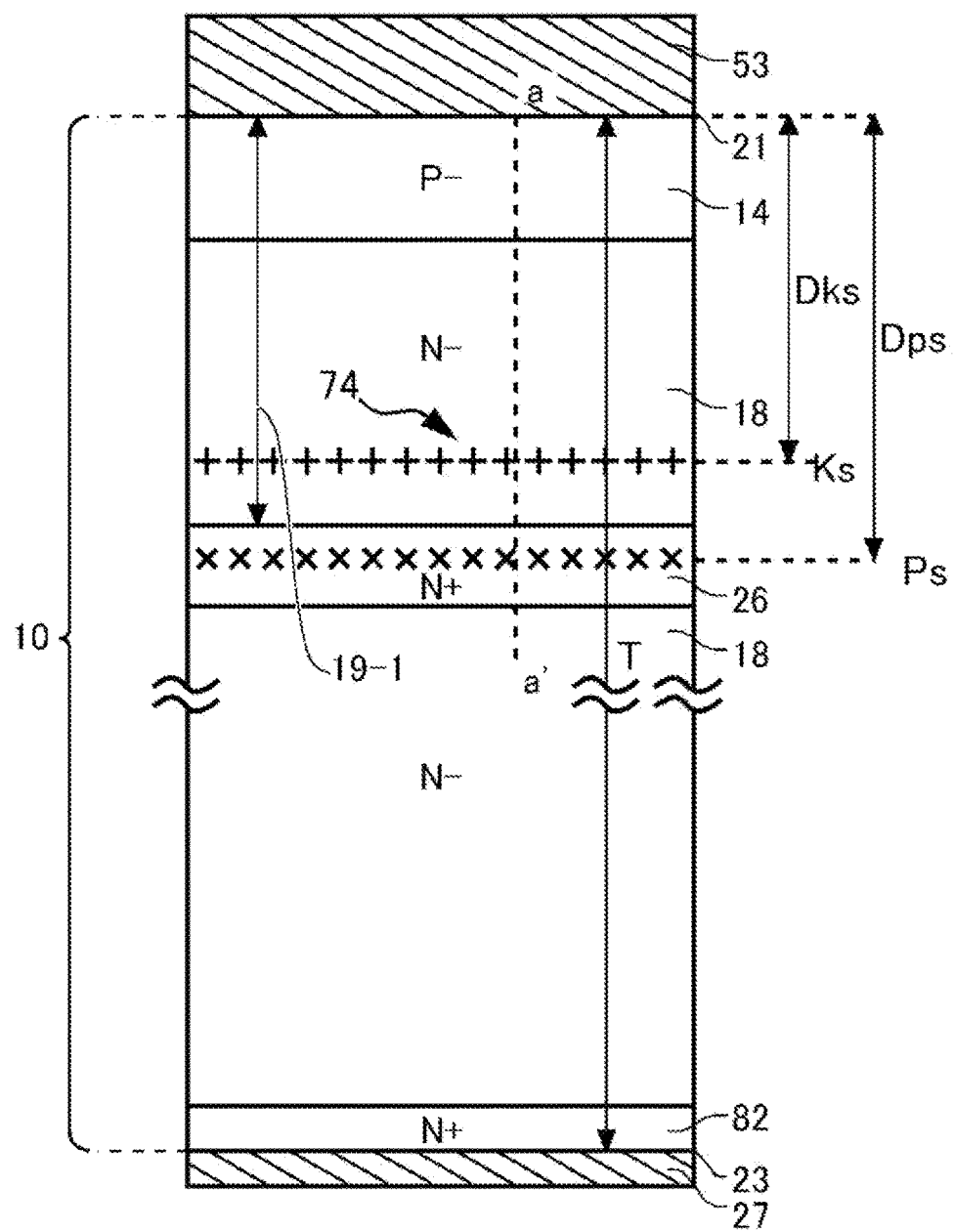
FIG. 1B shows an example of a portion of the semiconductor device 100 in a YZ cross-sectional plane.
Figure 1B:
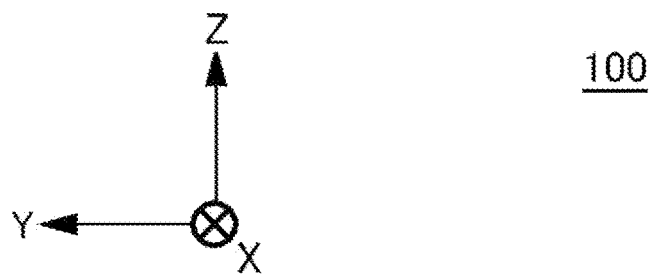

FIG. 1B shows an example of a portion of the semiconductor device 100 in a YZ cross-sectional plane. In the present example, part of a diode portion 80 described in FIG. 1A in the YZ cross-sectional plane is shown. As described above, the semiconductor device 100 may be a chip in which the diode portion 80 shown in FIG. 1B is provided in the active portion 120 and a transistor portion 70 is not provided, or may be a chip in which both the diode portion 80 and the transistor portion 70 are provided in the active portion 120. In the case of either chip, the diode portion 80 may have the same structure as in the semiconductor device 100 described in FIGS. 1B to 7D. Furthermore, in the same manner as the semiconductor device 100 described in FIGS. 9A to 9C, 16, and 17, the diode portion 80 may include a dummy trench portion 30. In FIG. 1B showing the present example, the dummy trench portion 30 is omitted. The dummy trench portion 30 does not need to be included in the diode portion 80. The semiconductor device 100 of the present example includes the semiconductor substrate 10, a top-surface-side electrode 53, and a bottom-surface-side electrode 27. The top-surface-side electrode 53 is provided on the top surface 21 of the semiconductor substrate 10. The bottom-surface-side electrode 27 is provided on the bottom surface 23 of the semiconductor substrate 10. The top-surface-side electrode 53 and the bottom-surface-side electrode 27 are formed of a conductive material such as metal. The top surface 21 and the bottom surface 23 are the main surfaces of the semiconductor substrate 10.

The semiconductor substrate 10 includes a drift region 18 of a first conductivity type. The drift region 18 of the present example is of N− type. The drift region 18 may be a region in the semiconductor substrate 10 where other doping regions are not provided. The dopant of the semiconductor substrate 10 may be N type donors such as phosphorus or antimony. As an example, the dopant of the semiconductor substrate 10 of the present example is phosphorus. The ratio of the donor concentration to the chemical concentration of the dopant is referred to as the donor activation ratio. The donor activation ratio of the dopant in the semiconductor substrate 10 may be greater than or equal to 90% of the chemical concentration of the dopant and less than or equal to 100% of the chemical concentration of the dopant. The donor activation ratio of the phosphorus or antimony of the present example may be greater than or equal to 95% and less than or equal to 100%.

The doping concentration of the drift region 18 may match the doping concentration of the semiconductor substrate 10. If the doping concentration of the drift region 18 matches the doping concentration of the semiconductor substrate 10, the dopant of the drift region 18 may match the dopant of the semiconductor substrate 10. Alternatively, the doping concentration of the drift region 18 may be two or more times higher than that of the doping concentration of the semiconductor substrate 10. In this case, the dopant of the drift region 18 may be different from the dopant of the semiconductor substrate 10. As an example, the dopant of the drift region 18 is hydrogen and the dopant of the semiconductor substrate 10 is phosphorus or antimony.

A single-crystal wafer of the semiconductor substrate 10 may be manufactured from an ingot formed using the Czochralski method (CZ method), the magnetic field application Czochralski method (MCZ method), the float zone method (FZ method), or the like. As an example, the single-crystal wafer of the semiconductor substrate 10 is a wafer manufactured using the magnetic field application Czochralski method (MCZ method).

An anode region 14 of a first conductivity type is provided above the drift region 18. The anode region 14 of the present example is P− type, for example. The anode region 14 may be provided between the drift region 18 and the top surface 21 in the Z-axis direction. In the present example, the top surface of the anode region 14 is provided in contact with the top surface 21. Furthermore, in the present example, the anode region 14 is provided in contact with the drift region 18.

The cathode region 82 of a first conductivity type, which has a higher doping concentration than the drift region 18, is provided below the drift region 18. The cathode region 82 of the present example is N+ type, for example. The cathode region 82 is provided in contact with the bottom surface 23. Furthermore, in the present example, the cathode region 82 and the drift region 18 are provided in contact with each other. The cathode region 82 may be formed by implanting ions such as phosphorus ions through the bottom surface 23 of the semiconductor substrate 10 and performing annealing.

The semiconductor device 100 of the present example has a high concentration region 26 provided inside the semiconductor substrate 10. The high concentration region 26 may be formed by implanting hydrogen ions through the top surface 21. The hydrogen ions may be protons, deuterons, or tritons. The hydrogen ions are protons in the present example. The concentration distribution of the hydrogen in the depth direction of the semiconductor substrate 10 has a concentration distribution peak at a first position Ps, which is a predetermined distance DPs away from one main surface of the semiconductor substrate 10 (the top surface 21 in the present example) in the depth direction of the semiconductor substrate 10. In FIG. 1B, the hydrogen concentration distribution peak at the first position Ps is indicated by the symbol (marker) "x". The first position Ps may be arranged farther on the top surface 21 side than ½ of the width of the semiconductor substrate.

The hydrogen concentration distribution in the depth direction of the semiconductor substrate 10 has a hydrogen concentration tail, where the concentration is less than the peak described above, farther on the top surface 21 side than where the first position Ps is located. The hydrogen concentration distribution and the concentration distribution tail are described further below.

The high concentration region 26 is provided in a range including the first position Ps. The high concentration region 26 includes hydrogen donors. The high concentration region 26 may include, as the hydrogen donors, VOH complex defects in which one or more hydrogen atoms (H), one or more oxygen atoms (O), and one or more vacancies (V) are bonded in a cluster. There are cases where the VOH complex defects become N type donors. In this specification, the VOH complex defects are referred to simply as hydrogen donors. Furthermore, there are cases where the chemical concentration of hydrogen is referred to as the hydrogen concentration. The high concentration region 26 of the present example is N+ type, for example.

The oxygen of the semiconductor substrate 10 may be introduced intentionally, or may be introduced unintentionally. The oxygen of the semiconductor substrate 10 may be introduced from an oxide film formed on a main surface of the semiconductor substrate 10. The oxygen concentration of the semiconductor substrate 10 may be greater than or equal to $1 \times 10^{16}$ (/cm$^3$) and less than or equal to $1 \times 10^{18}$ (/cm$^3$), or may be greater than or equal to $5 \times 10^{16}$ (/cm$^3$) and less than or equal to $5 \times 10^{17}$ (/cm$^3$).

The hydrogen donors are formed after hydrogen ions are implanted through a main surface of the semiconductor substrate 10 (the top surface 21 in the present example). After the implantation of the hydrogen ions, the donor activation ratio of the hydrogen donors may be increased by thermally annealing the semiconductor substrate 10. By implanting the hydrogen ions, the hydrogen donors are formed in a region where the hydrogen concentration is at a maximum (that is, a region corresponding to a range Rp of the hydrogen ions). Furthermore, by annealing the semiconductor substrate 10, the formation of the VOH complex defects is encouraged and the hydrogen donor concentration increases. In this way, the high concentration region 26 having a higher doping concentration than the drift region 18 is formed. The high concentration region 26 may be formed in a manner to be sandwiched between the drift regions 18 in the Z-axis direction (the depth direction perpendicular to the main surfaces of the semiconductor substrate 10). The method for forming the high concentration region 26 is described further below.

The first position Ps may be a peak position of the doping concentration of the high concentration region 26, in the Z-axis direction. In this specification, there are cases where the peak of the hydrogen donor concentration at the first position Ps is referred to as the donor peak. The doping concentration of the high concentration region 26 at the first position Ps may be greater than or equal to $1 \times 10^{13}$ (/cm$^3$) and less than or equal to $1 \times 10^{17}$ (/cm$^3$), may be greater than or equal to $1 \times 10^{14}$ (/cm$^3$) and less than or equal to $1 \times 10^{16}$ (/cm$^3$), or may be greater than or equal to $1 \times 10^{14}$ (/cm$^3$) and less than or equal to $1 \times 10^{15}$ (/cm$^3$).

A crystalline defect region 19-1 is provided above the high concentration region 26. The crystalline defect region 19-1 may be a region that includes crystalline defects formed due to the implantation of hydrogen ions through the top surface 21. In FIG. 1B, the range in the Z-axis direction in which the crystalline defect region 19-1 is provided is indicated by a double-sided arrow symbol.

The crystalline defect region 19-1 has a crystalline defect density peak at a position Ks that is a distance Dks away from the top surface 21 in the Z-axis direction. The crystalline defect region 19-1 may be provided from the position Ks to the top surface 21. The crystalline defects may be defects that serve as carrier recombination centers, and may be mainly composed of vacancies (V) and double vacancies (VV). The crystalline defect density may be the density of the recombination centers. Usually, dopants such as donors or acceptors are also included in the crystalline defects, but in this specification, crystalline defects refer to defects that mainly function as recombination centers to recombine carriers.

In the present example, the crystalline defect density peak of the crystalline defect region 19-1 in the Z-axis direction is referred to as the center peak. The position of the center peak in the Z-axis direction is the position Ks. The position Ks is provided at a position shallower than the first position Ps, which is the position of the doping concentration peak of the high concentration region 26, using the top surface 21 as a reference. In other words, the distance Dks is less than the distance Dps. In FIG. 1B, the center peak of the crystalline defect density at the position Ks is indicated by the symbol (marker) "+".

In the semiconductor device 100 of the present example, the carrier lifetime is controlled by the crystalline defects generated by the hydrogen ion implantation. In the present example, the region in which the lifetime is controlled (reduced) is provided at a different position in the Z-axis direction than the position (range Rp) at which the hydrogen concentration has the maximum value, where the hydrogen ions stop and the greatest amount of hydrogen is present. In the present example, the region in which the lifetime is reduced is a region that is closer to the top surface 21 than the position where the hydrogen concentration has the maximum value, in other words, a hydrogen ion passed-through region. When the hydrogen ions pass through the semiconductor substrate 10, these hydrogen ions collide with the atoms (silicon in the present) of the semiconductor, thereby having their energy attenuated and causing damage to the crystal, which forms a large number of crystalline defects in the region (passed-through region) that is shallower than the range Rp of the hydrogen ions. In this way, the crystalline defect region is formed in the hydrogen ion passed-through region, and the lifetime is controlled.

On the other hand, by having a large amount of hydrogen near the position where the hydrogen concentration is at the maximum, the hydrogen terminates dangling bonds in vacancies and double vacancies. Therefore, in the vicinity of the position where the hydrogen concentration is at the maximum, the recombination center density is much lower than in the passed-through region, and the effect on the carrier recombination is almost nonexistent compared to this effect in the passed-through region.

The center peak of the crystalline defect density in the crystalline defect region 19-1 may be a top-surface-side lifetime control region 74. The top-surface-side lifetime control region 74 has a higher crystalline defect density than other regions of the semiconductor substrate 10. The range in which the lifetime control region of the present example is formed is described further below.

Figure 2:
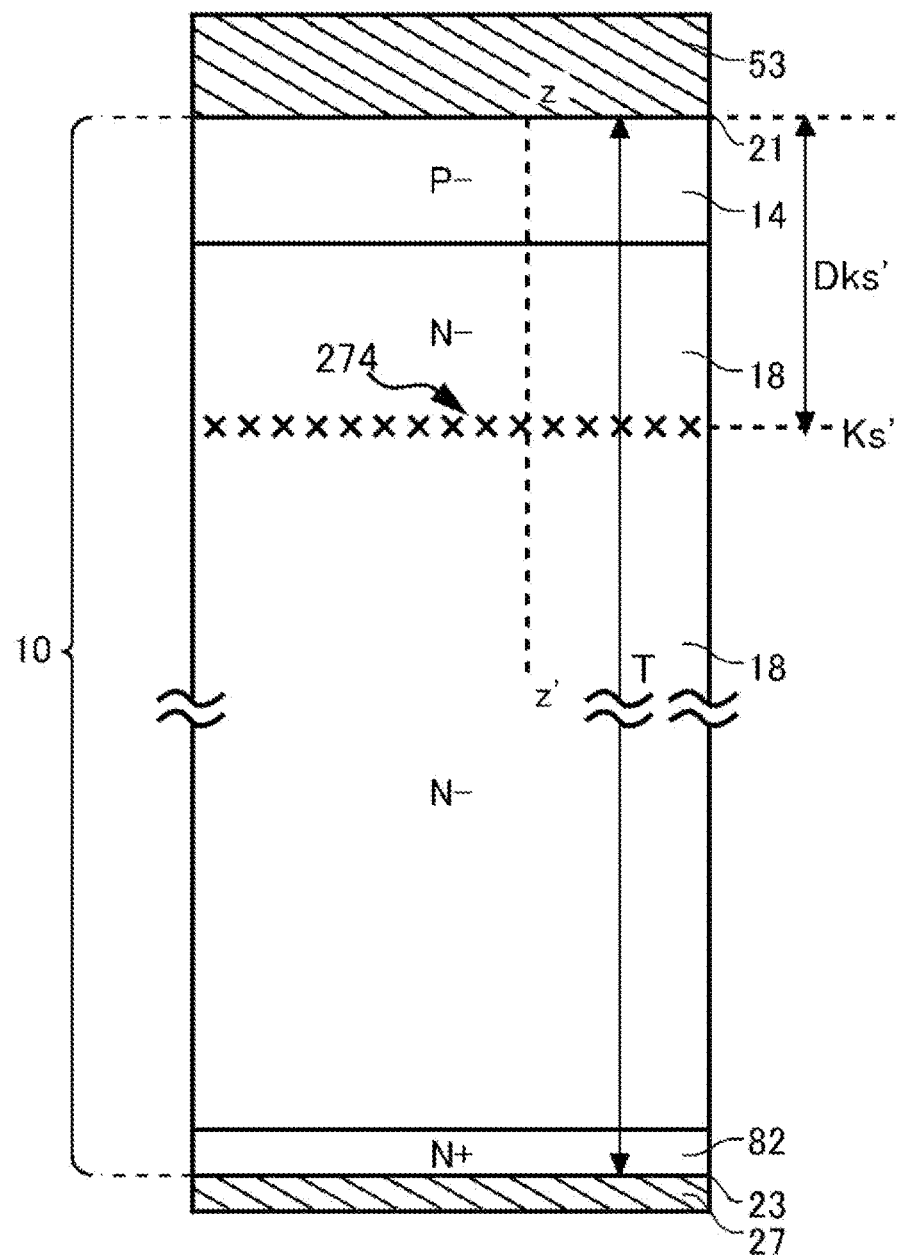
FIG. 2 shows a cross section of a semiconductor device 150 serving as a comparative example.
Figure 2:
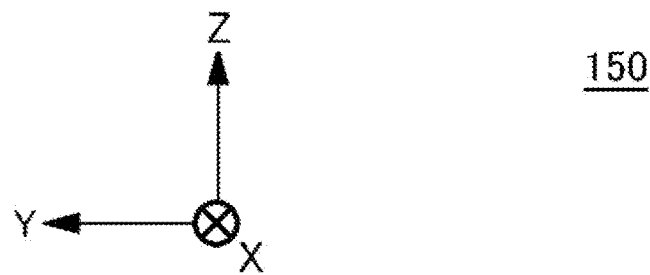

FIG. 2 shows a cross section of a semiconductor device 150 serving as a comparative example. The semiconductor device 150 of the comparative example differs from the semiconductor device 100 shown in FIG. 1B in that the semiconductor device 150 is not provided with the high concentration region 26 and is provided with a top-surface-side lifetime control region 274 instead of the top-surface-side lifetime control region 74 in the semiconductor device 100 of the present example shown in FIG. 1B. The top-surface-side lifetime control region 274 is formed by implanting helium through the top surface 21.

In the semiconductor device 150 of the comparative example, the top-surface-side lifetime control region 274 is provided at a position Ks' in the Z-axis direction. The distance Dks' in the Z-axis direction from the top surface 21 to the position Ks' is less than the distance Dks in the semiconductor device 100 shown in FIG. 1B.

When the helium ions and hydrogen ions are implanted through the top surface 21 of the semiconductor substrate 10 with the same acceleration energy, the hydrogen ions are implanted to a deeper position in the depth direction of the semiconductor substrate 10 from the top surface 21 than the helium ions. Therefore, the distance Dks is greater than the distance Dks'.

In the semiconductor device 150 of the comparative example, the helium implanted into the semiconductor substrate 10 is barely activated as donors in comparison to the hydrogen, even when annealing is performed. Therefore, in the semiconductor device 150 of the comparative example, the high concentration region 26 is not provided. Furthermore, unlike the semiconductor device 100 of the present example, in the semiconductor device 150 of the comparative example, there is no hydrogen (or the hydrogen concentration is extremely low) for terminating the dangling bonds present in the vacancies and double vacancies, and therefore the peak position at which the crystalline defect density is at a maximum, which is the recombination center, overlaps with the peak position of the helium concentration at which the largest amount of helium is present in the semiconductor substrate 10. Therefore, the position at which the carrier recombination occurs most frequently is the peak position of the helium concentration.

Figure 3:
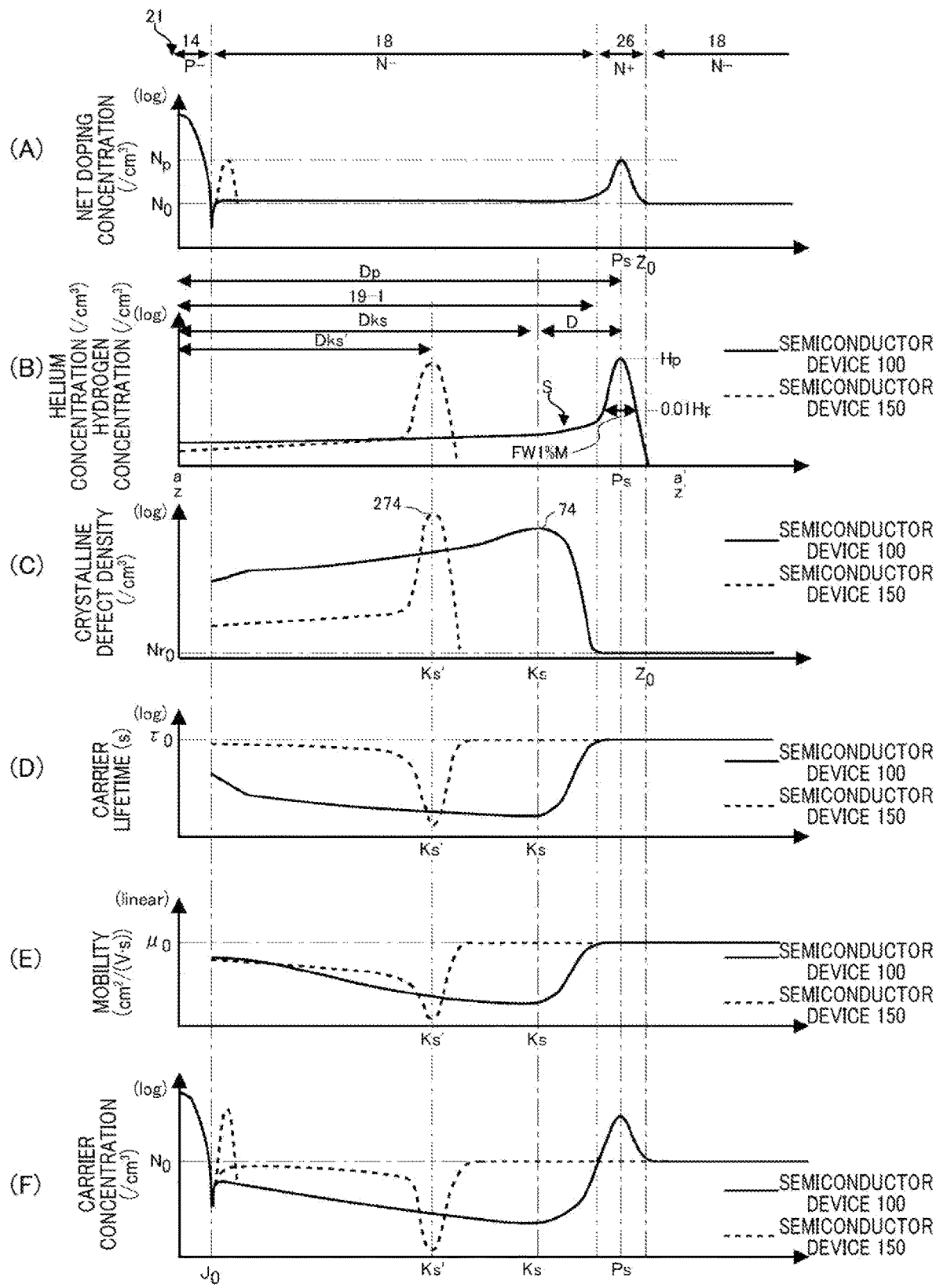
FIG. 3 shows distributions of each of the net doping concentration (A), the hydrogen concentration and the helium concentration (B), the crystalline defect density (C), the carrier lifetime (D), the carrier mobility (E), and the carrier concentration (F), along the line a-a' in the semiconductor device 100 according to the embodiment shown in FIG. 1B and along the line z-z' in the semiconductor device 150 of the comparative example.

FIG. 3 shows distributions of each of the net doping concentration (A), the hydrogen concentration and the helium concentration (B), the crystalline defect density (C), the carrier lifetime (D), the carrier mobility (E), and the carrier concentration (F), along the line a-a' in the semiconductor device 100 according to the embodiment shown in FIG. 1B and along the line z-z' in the semiconductor device 150 of the comparative example. As described above, the top-surface-side lifetime control region 74 is formed by implanting the hydrogen ions into the semiconductor substrate 10 in the semiconductor device 100, and the top-surface-side lifetime control region 274 is formed by implanting helium ions into the semiconductor substrate 10 in the semiconductor device 150. It should be noted that the net doping concentration (A) shows only an example of the semiconductor device 100. In FIG. 3, each distribution drawing for the semiconductor device 100 is indicated by a solid line, and each distribution drawing for the semiconductor device 150 is indicated by a dashed line.

The vertical axes of the distribution drawings (A), (B), (C), (D), and (F) are each displayed in a logarithmic (log) scale, and the vertical axis of the distribution drawing (E) is displayed in a linear scale. In FIG. 3, in each of the distribution drawings in which the vertical axis displays a logarithmic scale, the value on the vertical axis at the point of intersection with the horizontal axis is not 0, and is instead a prescribed value greater than 0. In each distribution drawing, the horizontal axis is displayed in a linear scale. The horizontal axis in each distribution drawing in FIG. 3 indicates the depth from the top surface 21 of the semiconductor substrate 10.

The distribution drawing (A) shows the net doping concentration distribution of donors and acceptors that have been electrically activated (in other words, the distribution of the difference between the donor concentration and the acceptor concentration). As shown in FIG. 1B, the net doping concentration has a peak (donor peak) at the position Ps. In the present example, a region that includes the position Ps and has a higher net doping concentration than the drift region 18 is the high concentration region 26. The high concentration region 26 may be a region in which the net doping concentration is greater than a half-value of the net doping concentration at the position Ps. The peak concentration of the net doping concentration of the high concentration region 26 at the position Ps is referred to as Np.

In the distribution drawing (A), the N type region in which the doping concentration is higher than the doping concentration $N_0$ of the semiconductor substrate 10 is N+ type. In the present example, the doping concentration of the drift region 18 provided at a position deeper than the high concentration region 26 matches the doping concentration $N_0$. The hydrogen ions implanted through the top surface 21 of the semiconductor substrate 10 pass through the drift region 18 provided between the anode region 14 and the high concentration region 26. The doping concentration of this drift region 18 may become higher than the doping concentration $N_0$ of the semiconductor substrate 10 due to remaining hydrogen donors. The average value of the doping concentration of this drift region 18 may be less than or equal to three times the doping concentration $N_0$ of the semiconductor substrate 10.

An N type accumulation region 16 with a higher concentration than the drift region 18 may be included between the anode region 14 and the drift region 18. The accumulation region 16 is a portion where the donor dopant is accumulated with a higher concentration than in the drift region 18. Two or more accumulation regions 16 may be included in the depth direction. The two or more accumulation regions 16 may have two or more peaks in the doping concentration. The region between two adjacent peaks may be N type. The two or more accumulation regions 16 may be kink-shaped.

The distribution drawing (B) shows the chemical concentration of the implanted hydrogen or helium. The hydrogen concentration is shown for the semiconductor device 100 and the helium concentration is shown for the semiconductor device 150. As an example, the chemical concentration of atoms can be measured using secondary ion mass spectrometry (SIMS). The helium and hydrogen concentrations have distributions in which the implanted helium ions and hydrogen ions are diffused due to annealing. The degree of diffusion can be controlled according to the annealing time, the annealing temperature, and the like. The hydrogen concentration has a peak at the position Ps. The helium concentration has a peak at the position Dks'.

The hydrogen concentration is the chemical concentration of hydrogen, and the concentration at the position Ps of the peak where the hydrogen concentration is highest is referred to as Hp. The peak concentration Hp of the hydrogen concentration is higher than the peak concentration Np of the net doping concentration at the position Ps. With a representing the donor activation ratio of the hydrogen donors, Np=αHp, and α may be from 0.001 to 0.5. In other words, there are cases where the hydrogen concentration is one order of magnitude greater than the donor concentration, and cases where the hydrogen concentration is two or more orders of magnitude greater than the donor concentration.

As described above, the hydrogen concentration distribution has a tail S from the peak position Ps toward one main surface (the top surface 21 in the present example). The tail S refers to the concentration distribution having a gentler change, in a case where the hydrogen concentration distribution in a region shallower than the peak position Ps is compared to the hydrogen concentration distribution in a region deeper than the peak position Ps. In other words, the hydrogen concentration distribution has the tail S diminishing as moving toward the main surface through which the hydrogen ions were implanted. The tail S may reach the top surface 21, but does not need to reach the top surface 21. Furthermore, as shown in the distribution drawing (A), by comparing the average doping concentration of the drift region 18 on the side shallower than the high concentration region 26 to the average doping concentration of the drift region 18 on the side deeper than the high concentration region 26, it may be judged that the tail S of the hydrogen concentration distribution is present on the side with the higher average doping concentration.

The distribution drawing (C) shows the crystalline defect density after the hydrogen ions or helium ions were implanted into the semiconductor substrate 10 and annealing was then performed with prescribed conditions. In the semiconductor device 150 into which the helium ions have been implanted, the crystalline defect density distribution and the helium concentration distribution have similar shapes. For example, the position Dks' of the helium concentration peak and the position Ks' of the crystalline defect density peak match.

The position where the net doping concentration of the high concentration region 26 substantially matches the doping concentration $N_0$ of the semiconductor substrate 10 farther on the bottom surface 23 side than where the position Ps is located is referred to as the position $Z_0$. The crystalline defect density farther on the bottom surface 23 side than where the position $Z_0$ is located may have a sufficiently small value $Nr_0$. Having the crystalline defect density be a sufficiently small value $Nr_0$ means that the crystalline defect density has a value low enough that the carrier lifetime does not become less than $\tau_0$, which is described further below. As an example, with $Nr_0$ representing the concentration of vacancies or double vacancies, at a temperature of 300 K, $Nr_0$ may be less than or equal to $1 \times 10^{12}$ atoms/cm$^3$, less than or equal to $1 \times 10^{11}$ atoms/cm$^3$, or less than or equal to $1 \times 10^{10}$ atoms/cm$^3$. At the position $J_0$ of the pn junction between the anode region 14 and the drift region 18 or accumulation region 16, the crystalline defect density may be higher than $Nr_0$.

The density of crystalline defects such as vacancies and double vacancies that occur due to the helium ion implantation is highest in the vicinity of the position Dks' at which the most helium ions are implanted. As described above, there is almost no hydrogen in the substrate in the semiconductor device 150, and therefore the crystalline defects barely decrease when annealing is performed. Therefore, the distribution of the crystalline defect density remains the same before and after the annealing.

In contrast to this, in the semiconductor device 100 into which the hydrogen ions have been implanted, the crystalline defects are terminated by the hydrogen, and therefore the crystalline defect density distribution and the hydrogen concentration distribution have different shapes. For example, the position Ps of the hydrogen concentration peak and the position Ks of the crystalline defect density peak do not match. The position Ks of the crystalline defect density peak of the present example is arranged farther on the top surface 21 side of the semiconductor substrate 10 than where the hydrogen concentration peak position Ps is located. The crystalline defect density may decrease monotonically on the top surface 21 side of the position Ks. The crystalline defect density may decrease monotonically and more steeply on the bottom surface 23 side of the position Ks than on the top surface 21 side of the position Ks.

In the vicinity of the position Ps of the hydrogen concentration peak, a large amount of hydrogen terminates the dangling bonds of the vacancies, double vacancies, and the like. Therefore, the crystalline defect density in the vicinity of the position Ps of the hydrogen concentration peak is much smaller than the crystalline defect density at the position Ks of the crystalline defect density peak. In this specification, a width of the distribution indicating a concentration that is greater than 1% of the peak concentration (Hp) is referred to as 1% full width or FW1% M. The vicinity of the peak position Ps may refer to a region in a range of the 1% full width centered on the peak position Ps. The position Ks of the crystalline defect density peak may be provided at a position shallower than the range of the 1% full width centered on the peak position Ps.

However, the distance D between the position Ks of the crystalline defect density peak and the position Ps of the hydrogen concentration peak is determined according to the distance that the hydrogen diffuses within the semiconductor substrate 10 due to the annealing. The distance D may be less than or equal to 40 μm, less than or equal to 20 μm, or less than or equal to 10 μm. The distance D may be greater than or equal to 1 μm, greater than or equal to 3 μm, or greater than or equal to 5 μm. The distance D may be greater than or equal to the 1% full width of the hydrogen concentration. The distance D may be greater than or equal to the 1% full width of the net doping concentration at the position Ps. In this case, the 1% full width of the net doping concentration is the width of the peak at 0.01 Np. The range for the value of the distance D may be a combination of the upper limit values and lower limit values described above. The crystalline defect density distribution can be observed by measuring the density distribution of the vacancies and double vacancies, using the positron annihilation method, for example.

The distribution drawing (D) shows the carrier lifetime distribution after the hydrogen ions or helium ions were implanted into the semiconductor substrate 10 and annealing was then performed with prescribed conditions. In the semiconductor device 150 into which the helium ions have been implanted, the carrier lifetime distribution has a shape obtained by inverting the vertical axis of the crystalline defect density distribution. For example, the position at which the carrier lifetime has the minimum value matches the center peak position Ks' of the crystalline defect density.

Also in the semiconductor device 100 into which the hydrogen ions are implanted, the carrier lifetime distribution has a shape obtained by inverting the vertical axis of the crystalline defect density distribution. For example, the position at which the carrier lifetime has the minimum value matches the center peak position Ks of the crystalline defect density. In the region that is within a range of the FW1% M centered on the peak position Ps of the hydrogen concentration, the carrier lifetime of the semiconductor device 100 may have the maximum value $\tau_0$. The maximum value $\tau_0$ may be the carrier lifetime in the drift region 18 farther on the bottom surface 23 side than where the hydrogen concentration peak position Ps is located.

The carrier lifetime may have a sufficiently large value $\tau_0$ farther on the bottom surface 23 side than where the position $Z_0$ is located. The carrier lifetime having the sufficiently large value $\tau_0$ refers to a carrier lifetime in a case where defects made up mainly of vacancies or double vacancies or a lifetime killer are not intentionally introduced to the semiconductor substrate 10. At a temperature of 300 K, $\tau_0$ may be greater than or equal to 10 µs or greater than or equal to 30 µs. As an example, $\tau_0$ is 10 µs. The carrier lifetime may be less than $\tau_0$ at the position $J_0$ of the pn junction between the anode region 14 and the drift region 18 or accumulation region 16.

The distribution drawing (E) shows the carrier mobility distribution after the hydrogen ions or helium ions were implanted into the semiconductor substrate 10 and annealing was then performed with prescribed conditions. The carrier mobility, farther on the bottom surface 23 side than where the position $Z_0$ is located, may be a mobility $N_0$ in the case of an ideal crystalline structure. In a case of silicon at a temperature of 300 K, for example, the mobility $\mu_0$ is 1360 cm$^2$/(vs) for electrons and 495 cm$^2$/(Vs) for holes. The carrier mobility may be less than $N_0$ at the position $J_0$ of the pn junction between the anode region 14 and the drift region 18 or accumulation region 16.

The distribution drawing (F) shows the carrier concentration distribution after the hydrogen ions or helium ions were implanted into the semiconductor substrate 10 and annealing was then performed with prescribed conditions. The carrier concentration can be measured using the spread resistance measurement method (SR measurement method), for example.

With the SR measurement method, the spread resistance is converted into the specific resistance and the carrier concentration is calculated from the specific resistance. With the specific resistance being $\rho$ ($\Omega \cdot$cm), the mobility being $\mu$ (cm$^2$/(V·s)), the elementary charge being q (C), and the carrier concentration being N (/cm$^3$), N=1/(µqρ) is established.

In the SR measurement method, a value of the semiconductor substrate 10 with an ideal crystalline state is used for the carrier mobility. However, when damage remains in the semiconductor substrate 10 due to the ion implantation, the crystalline state of the semiconductor substrate 10 degrades and enters a disordered state, and the mobility is reduced in actuality. Properly, the reduced mobility should be used as the mobility in the SR measurement, but it is difficult to measure the value of the decreased mobility. Therefore, in the SR measurement in the example of the distribution drawing (F), the ideal value is used for the mobility. Therefore, the denominator of the carrier concentration equation described above increases, and the carrier concentration decreases. In other words, in the distribution drawing (F), the measured carrier concentration experiences an overall drop in the region through which the hydrogen ions pass (the region from the bottom end of the anode region 14 to the high concentration region 26 of the semiconductor substrate 10). However, in the high concentration region 26 near the range Rp of the hydrogen ions, the hydrogen concentration is high, and therefore, the disordered state is ameliorated due to the hydrogen termination effect, and the mobility approaches the value of the crystalline state. In addition, hydrogen donors are formed. Therefore, the carrier concentration becomes higher than the carrier concentration $N_0$ of the semiconductor substrate 10.

In the semiconductor device 150 into which the helium ions are implanted, the carrier concentration becomes low in a narrow region in the vicinity of the peak position Ks' of the helium concentration (that is, the vicinity of the peak position of the crystalline defect density). In a case where the crystalline defects are formed by implanting helium ions into the semiconductor substrate 10, the peak position of the helium concentration, the position where the carrier concentration exhibits a local minimum, the peak position of the crystalline defect density, and the position where the carrier lifetime exhibits a local minimum all match the position Ks'.

Also in a case where the crystalline defects are formed by implanting hydrogen ions into the semiconductor substrate 10, there are many cases where the peak position Ps of the hydrogen concentration and the peak position of the crystalline defect density match before the annealing. However, when the annealing is performed after the hydrogen ion implantation, the hydrogen is diffused from the peak position of the hydrogen concentration toward the top surface 21 of the semiconductor substrate 10, and the hydrogen terminates the dangling bonds included in the vacancies and double vacancies. Therefore, the crystalline defect density after the annealing decreases around the peak position Ps of the hydrogen concentration. Due to this, the carrier lifetime in the vicinity of the position Ps where the hydrogen concentration forms a peak increases to become approximately $\tau_0$.

The lifetime control region (the top-surface-side lifetime control region 74 in the present example) may be a region in which the carrier concentration becomes lower than the carrier concentration $N_0$ of the semiconductor substrate 10, as shown in the distribution drawing (F), on the main surface side (top surface 21 side in the present example) where the hydrogen concentration exhibits the tail from the peak, as shown in the distribution drawing (B). Furthermore, the density distribution of the vacancies and double vacancies such as shown in the distribution drawing (C) may be measured, and a region in which the vacancy and double vacancy density is higher farther on the top surface 21 side of the peak position Ps than on the bottom surface 23 side of the peak position Ps may be the lifetime control region. Alternatively, a region that is a width (FW1% M) between two positions which sandwich the position Ks of the maximum value and at which the vacancy and double vacancy density distribution has 1% of the maximum value may be the lifetime control region. Yet further, the position Ks at which the crystalline defect density has a peak in the manner described above may simply be the lifetime control region.

Figure 4:
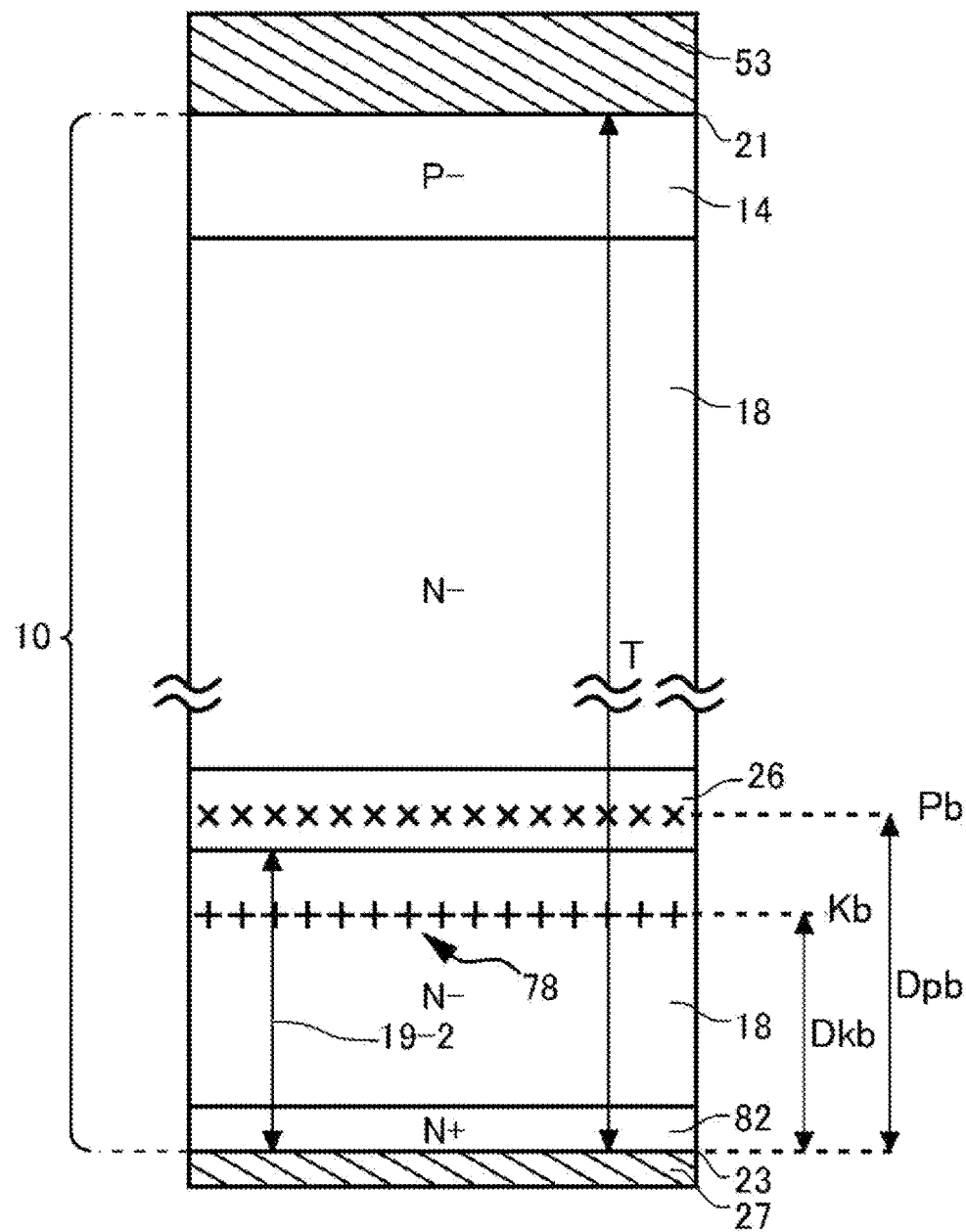
FIG. 4 shows another example of a cross section of the semiconductor device 100 according to the present embodiment.

FIG. 4 shows another example of a cross section of the semiconductor device 100 according to the present embodiment. The semiconductor device 100 of the present example differs from the semiconductor device 100 shown in FIG. 1B in that hydrogen ions are implanted through the bottom surface 23, the high concentration region 26 is provided on the bottom surface 23 side, and a crystalline defect region 19-2 is provided on the bottom surface 23 side. The bottom surface 23 side refers to the region on the bottom surface 23 side of the center of the semiconductor substrate 10 in the Z-axis direction.

In the semiconductor device 100 of the present example, the hydrogen concentration distribution in the depth direction of the semiconductor substrate 10 has a concentration distribution peak at a first position Pb that is a predetermined distance Dpb away, in the depth direction of the semiconductor substrate 10, from one main surface of the semiconductor substrate 10 (the bottom surface 23 in the present example). In FIG. 4, the peak of the hydrogen concentration distribution at the first position Pb is indicated by the symbol (marker) "x". The first position Pb may be arranged farther on the bottom surface 23 side than where ½ the thickness T of the semiconductor substrate is located.

The hydrogen concentration distribution in the depth direction of the semiconductor substrate 10 has a concentration distribution tail S (see FIG. 3) where the concentration is less than the peak described above, farther on the bottom surface 23 side than where the first position Pb is located. The first position Pb may be arranged below the first position Ps in the Z-axis direction.

In the semiconductor device 100 of the present example, the semiconductor substrate 10 may include the high concentration region 26, where the doping concentration is higher than that of the drift region 18, between the drift region 18 and the bottom surface 23 of the semiconductor substrate 10. The high concentration region 26 is provided to include the first position Pb. The high concentration region 26 of the present example may be a region formed by annealing the semiconductor substrate 10 into which hydrogen ions have been implanted through the bottom surface 23. By annealing the semiconductor substrate 10 after implanting the hydrogen ions, the hydrogen is activated as a donor and the high concentration region 26 having a higher doping concentration than the drift region 18 is formed.

In the semiconductor device 100 of the present example, the high concentration region 26 is provided in a manner to be sandwiched by drift regions 18 in the Z-axis direction. Since the high concentration region 26 has a higher doping concentration than the drift region 18, the depletion layer that spreads from the bottom surface side of the anode region 14 can be prevented from reaching the cathode region 82.

The crystalline defect region 19-2 is provided below the high concentration region 26. The crystalline defect region 19-2 may be a region that includes crystalline defects formed by implanting hydrogen ions through the bottom surface 23. In FIG. 4, the range in which the crystalline defect region 19-2 is provided in the Z-axis direction is indicated by a double-sided arrow symbol.

The crystalline defect region 19-2 includes the center peak of the crystalline defect density at a position Kb that is a distance Dkb away from the bottom surface 23 in the Z-axis direction. The crystalline defect region 19-2 may be provided from the position Kb to the bottom surface 23.

In the present example, the peak in the Z-axis direction of the crystalline defect density in the crystalline defect region 19-2 is the center peak. The position of the center peak in the Z-axis direction is the position Kb. As described in FIG. 3, in a case where the crystalline defects are formed by implanting hydrogen ions, the peak position of the crystalline defect density is arranged on the side of the main surface through which the hydrogen ions were implanted (the bottom surface 23 in the present example), compared to the peak position of the hydrogen concentration. Therefore, the position Kb is provided at a position shallower than the first position Pb, which is the peak position of the doping concentration of the high concentration region 26, using the bottom surface 23 as a reference. In other words, the distance Dkb is less than the distance Dpb. In FIG. 4, the center peak of the crystalline defect density at the position Kb is indicated by the symbol (marker) "+".

In the semiconductor device 100 of the present example, the carrier lifetime is controlled by the crystalline defects generated due to the hydrogen ion implantation. In the semiconductor device 100 of the present example, the center peak of the crystalline defect density in the crystalline defect region 19-2 may be the bottom-surface-side lifetime control region 78. The bottom-surface-side lifetime control region 78 has a higher crystalline defect density than the other regions of the semiconductor substrate 10.

Figure 5:
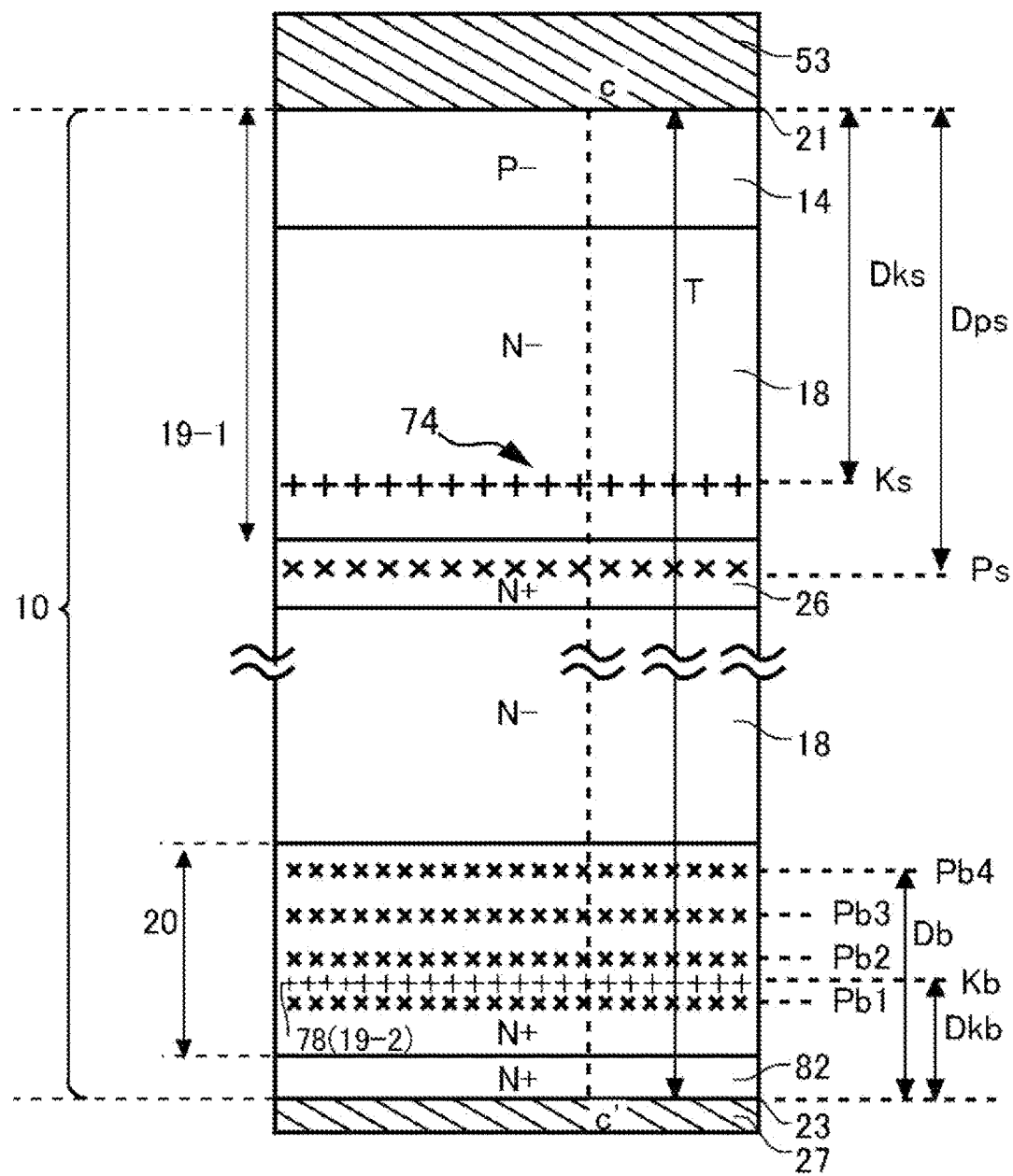
FIG. 5 shows another example of a cross section of the semiconductor device 100 according to the present embodiment.
Figure 5:
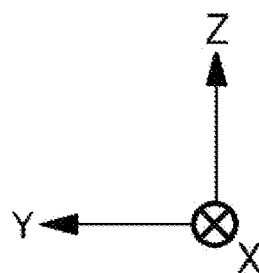

FIG. 5 shows another example of a cross section of the semiconductor device 100 according to the present embodiment. In the semiconductor device 100 of the present example, in addition to the configuration of the semiconductor device 100 shown in FIG. 1B, a buffer region 20 of a first conductivity type with a higher doping concentration than the drift region 18 is provided below the drift region 18. The buffer region 20 of the present example is N+ type, for example. The buffer region 20 may be provided between the drift region 18 and the bottom surface 23 in the Z-axis direction. In the present example, the buffer region 20 is provided in contact with the drift region 18. The buffer region 20 can function as a field stop region that prevents the depletion layer, which spreads from the bottom surface side of the anode region 14, from reaching the cathode region 82.

In the semiconductor device 100 of the present example, the hydrogen concentration distribution has concentration distribution peaks at a plurality of positions in the buffer region 20. Specifically, there are concentration distribution peaks at four locations that are a position Pb4, a position Pb3, a position Pb2, and a position Pb1, in order from the top surface side toward the bottom surface side of the buffer region 20. In FIG. 5, the peaks of the hydrogen concentration distribution at the plurality of positions in the Z-axis direction are indicated by the symbol (marker) "x". The buffer region 20 of the present example may be a region formed by annealing the semiconductor substrate 10 after hydrogen ions have been implanted through the bottom surface 23 into the semiconductor substrate 10 at the position Pb4, the position Pb3, the position Pb2, and the position Pb1.

The semiconductor device 100 of the present example is provided with a plurality of crystalline defect regions 19. The crystalline defect region 19-1 is provided on the top surface 21 side of the semiconductor substrate 10, and the crystalline defect region 19-2 is provided on the bottom surface 23 side of the semiconductor substrate 10.

The crystalline defect region 19-1 is a region including crystalline defects formed by implanting hydrogen ions through the top surface 21. The crystalline defect region 19-1 is the same as the crystalline defect region 19-1 shown in FIG. 1B. The crystalline defect region 19-2 is a region including crystalline defects formed by implanting hydrogen ions or helium ions through the bottom surface 23. The crystalline defect region 19-2 is not a necessary configuration, and is a region that may be included as needed. The crystalline defect region 19-2 may be provided within the buffer region 20. In FIG. 5, the range in the Z-axis direction in which the crystalline defect region 19-1 is provided is indicated by a double-sided arrow symbol.

The crystalline defect region 19-2 may include a center peak of the crystalline defect density between a plurality of peaks of the hydrogen concentration, in the depth direction of the semiconductor substrate 10. Specifically, the crystalline defect region 19-2 may include the center peak of the crystalline defect density at any one of a position between the position Pb1 and the position Pb2, a position between the position Pb2 and the position Pb3, and a position between the position Pb3 and the position Pb4, where the positions Pbs 1 to 4 are the peak positions of the hydrogen concentration of the buffer region 20, in the Z-axis direction. Furthermore, the entire crystalline defect region 19-2 may be provided between any peak positions of the hydrogen concentration. The crystalline defect region 19-2 of the present example shows one example in which the center peak of the crystalline defect density is included at the position Kb between the position Pb1 and the position Pb2. In FIG. 5, the center peak of the crystalline defect density between the position Pb1 and the position Pb2 is indicated by the symbol (marker) "+".

In the semiconductor device 100 of the present example, the carrier lifetime is controlled with the crystalline defects generated due to the hydrogen ion implantation. In the semiconductor device 100 of the present example, the center peak of the crystalline defect density in the crystalline defect region 19-2 is the bottom-surface-side lifetime control region 78.

The crystalline defect region 19-2 of the present example includes crystalline defects formed by implanting hydrogen ions or helium ions to the position Pb2 through the bottom surface 23. As described in FIG. 3, in a case where the crystalline defects are formed by implanting hydrogen ions, the peak position of the crystalline defect density is arranged on the side of the main surface through which the hydrogen ions were implanted, compared to the peak position of the hydrogen concentration.

Figure 6:
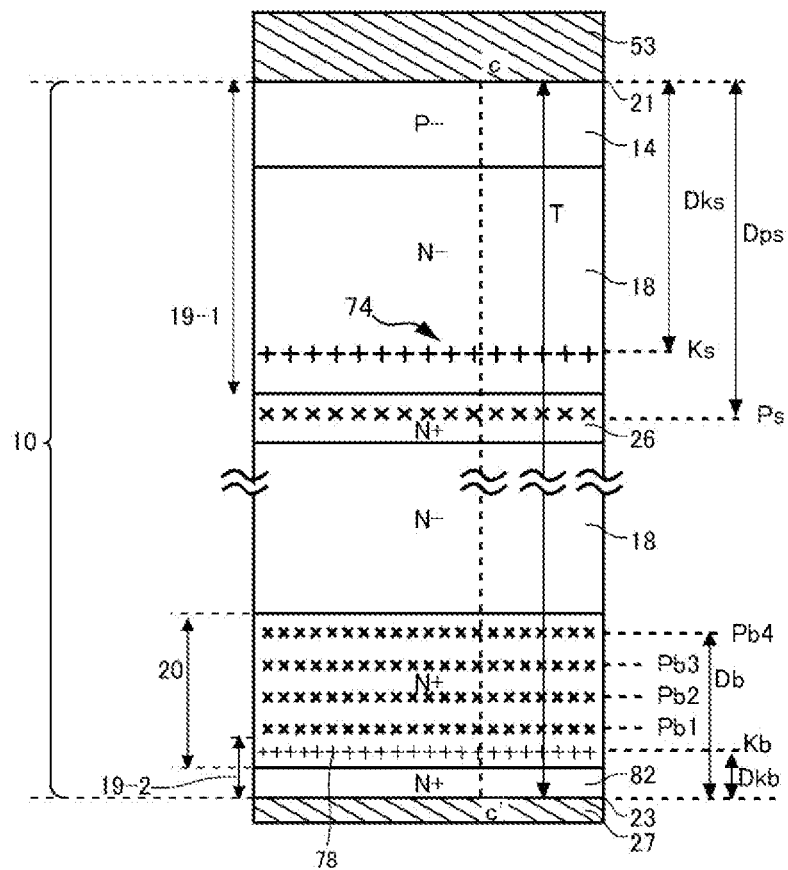
FIG. 6 shows another example of a cross section of the semiconductor device 100 according to the present embodiment.

FIG. 6 shows another example of a cross section of the semiconductor device 100 according to the present embodiment. The semiconductor device 100 shown in FIG. 6 differs from the semiconductor device 100 shown in FIG. 5 in that the bottom-surface-side lifetime control region 78 is provided below the position Pb1 in the Z-axis direction. The crystalline defect region 19-2 may be provided up to the bottom surface 23 of the semiconductor substrate 10.

The position of the bottom-surface-side lifetime control region 78 in the Z-axis direction can be adjusted by adjusting the order of the step (process) of implanting hydrogen ions to a plurality of positions in the Z-axis direction and the step of annealing the semiconductor substrate 10 into which the hydrogen ions have been implanted. The hydrogen ion implantation step and the annealing step are described further below.

Figure 7A:
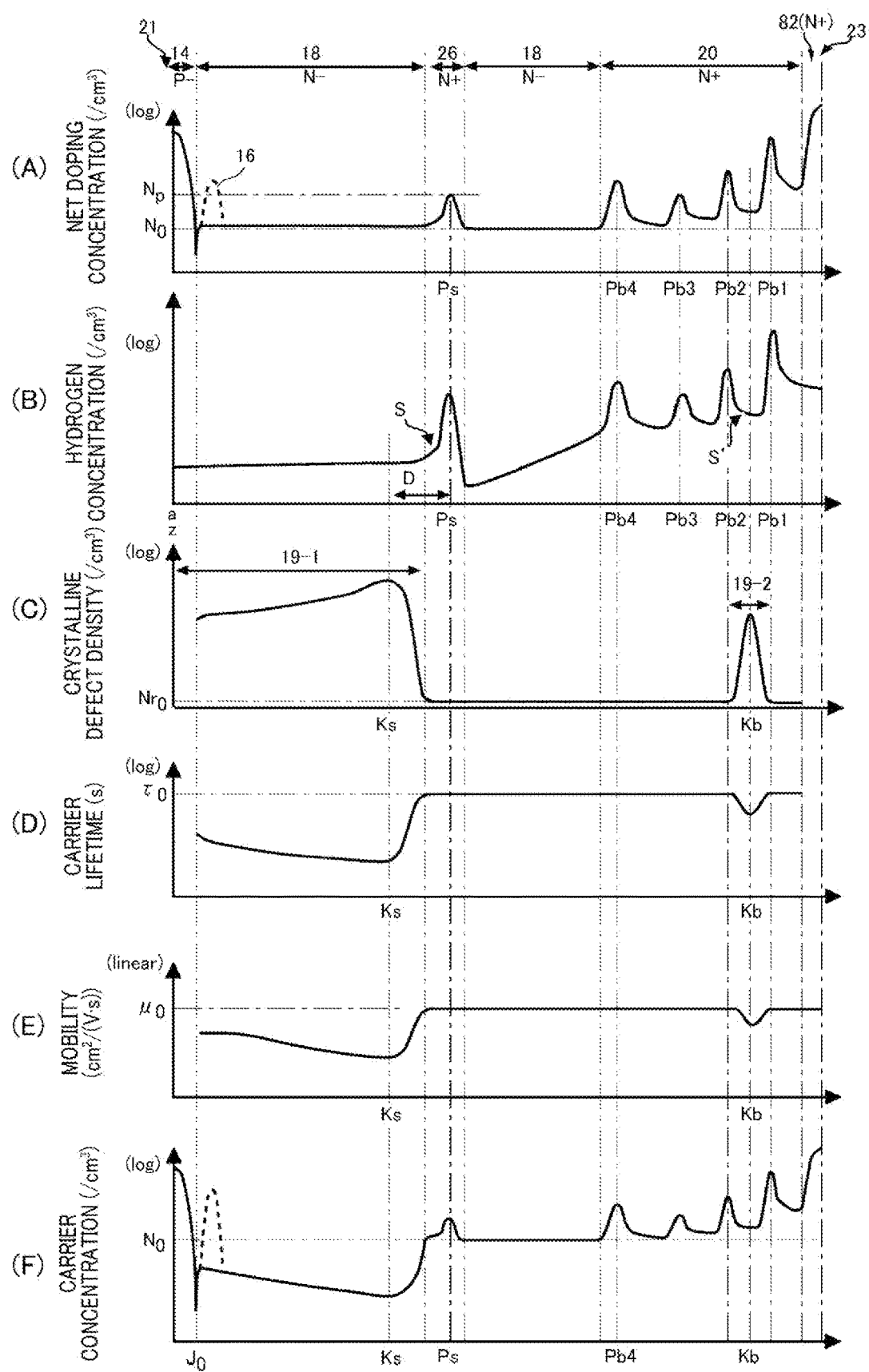
FIG. 7A shows distributions of each of the net doping concentration (A), the hydrogen concentration (B), the crystalline defect density (C), the carrier lifetime (D), the carrier mobility (E), and the carrier concentration (F), along the line c-c' in the semiconductor device 100 according to the embodiment shown in FIG. 5.

FIG. 7A shows distributions of each of the net doping concentration (A), the hydrogen concentration (B), the crystalline defect density (C), the carrier lifetime (D), the carrier mobility (E), and the carrier concentration (F), along the line c-c' in the semiconductor device 100 according to the embodiment shown in FIG. 5. The vertical axis and horizontal axis in each distribution drawing are the same as in the corresponding distribution drawing in FIG. 3.

The distribution drawing (A) shows the net doping concentration distribution of donors and acceptors that have been electrically activated. As shown in FIG. 5, the buffer region 20 has doping concentration peaks (donor peaks) at the positions Pb4, Pb3, Pb2, and Pb1. The high concentration region 26 has a doping concentration peak (donor peak) at the position Ps. The doping concentrations between respective donor peaks may be higher than the doping concentration $N_0$ of the semiconductor substrate 10, or may be the same as this doping concentration $N_0$. In the present example, the doping concentration of at least a portion of the region between the position Ps and the position Pb4 is the doping concentration $N_0$. The dopant of the semiconductor substrate 10 may be phosphorus or the like. The doping concentration $N_0$ may be the $N_0$ described in the distribution drawing (A) of FIG. 3.

In the distribution drawing (A), the N type region in which the doping concentration is higher than the doping concentration of the drift region 18 is N+ type. The doping concentration of at least a partial region of the drift region 18 between the position Ps and the position Pb4 may be lower than the doping concentration of the drift region 18 farther on the top surface 21 side than where the position Ps is located. The hydrogen ions implanted through the top surface 21 of the semiconductor substrate 10 pass through the drift region 18 on the top surface 21 side. Therefore, the doping concentration of this drift region 18 may become higher than the doping concentration $N_0$ of the semiconductor substrate 10 due to the remaining hydrogen. The average value of the doping concentration of the drift region 18 on the top surface 21 side may be less than or equal to three times the doping concentration $N_0$ of the semiconductor substrate 10.

Hydrogen ions are implanted from the bottom surface 23 of the semiconductor substrate 10 to the positions Pb4, Pb3, Pb2, and Pb1. Therefore, the doping concentration in a region farther on the bottom surface 23 side than where the position Pb4 is located may be higher overall than the doping concentration $N_0$ of the semiconductor substrate 10. That is, the doping concentration (donor concentration in the present example) of the drift region 18 in the region sandwiched in the depth direction by two hydrogen donor peaks (the hydrogen donor peaks respectively at the position Ps and the position Pb4 in the present example) is the lowest. The doping concentration (donor concentration in the present example) of the region sandwiched by these two hydrogen donor peaks is the doping concentration $N_0$ of the semiconductor substrate 10, and the doping concentration distribution may be substantially flat. At these two hydrogen donor peaks, the doping concentration on the top surface 21 side from the position Ps and on the bottom surface 23 side from the position Pb4 may become higher than the doping concentration $N_0$ of the semiconductor substrate 10. The cathode region 82 in the present example is formed by implanting and diffusing phosphorus.

The distribution drawing (B) shows the chemical concentration of the implanted hydrogen. Each peak of the hydrogen concentration has a tail on the side of the main surface through which the hydrogen ions were implanted. In the present example, the hydrogen concentration peak at the position Ps has a tail S on the top surface 21 side. In other words, the hydrogen concentration distribution of the present example decreases gently and monotonically from the first position Ps to the top surface 21, on the top surface 21 side. The tail S may be provided across the drift region 18 and the anode region 14.

The hydrogen concentration distribution of the present example has a tail where the change of the concentration distribution is steeper than in the tail S, on the bottom surface 23 side from the first position Ps. In other words, the hydrogen distribution exhibits an asymmetric distribution on the top surface 21 side of the first position Ps and the bottom surface 23 side of the first position Ps.

The hydrogen concentration peaks respectively at the positions Pb4, Pb3, Pb2, and Pb1 each have a tail S' on the bottom surface 23 side. The hydrogen concentration peaks respectively at the positions Pb4, Pb3, Pb2, and Pb1 each have a tail where the change of the concentration distribution is steeper than in the tail S', on the top surface 21 side. In other words, the hydrogen concentration peaks respectively at the positions Pb4, Pb3, Pb2, and Pb1 each exhibit an asymmetric distribution on the top surface 21 side of the corresponding position Pb4, Pb3, Pb2, or Pb1 and the bottom surface 23 side of the corresponding position Pb4, Pb3, Pb2, or Pb1.

The hydrogen concentration may have a minimum value between a position (position Ps in the present example) farthest on the bottom surface 23 side among the positions where hydrogen ions have been implanted from the top surface 21 side and a position (position Pb4 in the present example) farthest on the top surface 21 side among the positions where hydrogen ions have been implanted from the bottom surface 23 side. The position where the sum of the distribution of the diffusion of the hydrogen implanted to the position Ps and the distribution of the diffusion of the hydrogen implanted to the position Pb4 is smallest is the position where the hydrogen concentration is at the minimum value. Alternatively, the position where the hydrogen concentration is at a minimum value may be in a region that is sandwiched by two hydrogen donor peaks (the position Ps and position Pb4 in the present example) and in which the doping concentration has the substantially flat doping concentration distribution indicating the doping concentration $N_0$ of the semiconductor substrate 10.

The distribution drawing (C) shows the crystalline defect density after the hydrogen ions were implanted into the semiconductor substrate 10 and annealing was then performed with prescribed conditions. The crystalline defect density distribution farther on the top surface 21 side than where the position Ps is located is similar to the crystalline defect density distribution of the semiconductor device 100 shown in the distribution drawing (C) of FIG. 3. The crystalline defect density $Nr_0$ may be the $Nr_0$ described in the distribution drawing (C) of FIG. 3. The crystalline defect density has a peak at the position Ks that is farther on the top surface 21 side than where the position Ps is located. The crystalline defect density may decrease monotonically farther on the top surface 21 side than where the position Ks is located. The crystalline defect density may decrease monotonically and more steeply on the bottom surface 23 side of the position Ks than on the top surface 21 side of the position Ks.

The crystalline defect density in the vicinity of the peak position Ps of the hydrogen concentration is much lower than the crystalline defect density at the peak position Ks of the crystalline defect density. The peak position Ks of the crystalline defect density may be provided at a position shallower than a range of the 1% full width centered on the peak position Ps. The distance D between the peak position Ks of the crystalline defect density and the peak position Ps of the hydrogen concentration may be less than or equal to 40 μm or less than or equal to 20 μm. The distance D may be greater than or equal to 5 μm and less than or equal to 10 μm. The distance D may be greater than or equal to the 1% full width of the hydrogen concentration. The distance D may be greater than or equal to the 1% full width of the net doping concentration at the position Ps. In this case, the 1% full width of the net doping concentration is the width of the peak at 0.01 Np.

In the present example, the peak of the crystalline defect density is arranged at the position Kb that is between the position Pb2 and the position Pb1. The crystalline defect density peak at the position Kb mainly includes crystalline defects formed when the hydrogen ions were implanted through the bottom surface 23 to the position Pb2. In the present example, crystalline defect density peaks are not provided anywhere other than the position Kb, farther on the bottom surface 23 side than where the position Pb4 is located.

For example, hydrogen ions are implanted to the positions Pb4, Pb3, and Pb1, and the semiconductor substrate 10 is annealed according to a first condition. In this way, hydrogen concentration distribution peaks are formed at the positions Pb4, Pb3, and Pb1. After this, hydrogen ions are implanted to the position Ps and the position Pb2, and the semiconductor substrate 10 is annealed according to a second condition. The second condition may have a lower annealing temperature than the first condition. The crystalline defects generated by the hydrogen ion implantation to the positions Pb4, Pb3, and Pb1 are mostly terminated by the annealing at a relatively high temperature. In contrast to this, among the crystalline defects generated by the hydrogen ion implantation to the position Ps and the position Pb2, the crystalline defects in the vicinity of the position Ps and the position Pb2 are terminated by the annealing at a relatively low temperature. Since there is also a large amount of hydrogen in the vicinity of the position Pb1, a large percent of the crystalline defects generated by the hydrogen ion implantation to the position Pb2 are also terminated in the vicinity of the position Pb1. Therefore, the crystalline defect density has a peak between the position Pb2 and the position Pb1.

In the present example, no hydrogen concentration peaks, other than the hydrogen concentration peak at the position Ps, are provided on the side from which the hydrogen ions were implanted (the top surface 21 side in the present example). On the other hand, in addition to the hydrogen concentration peak at the position Pb2, another hydrogen concentration peak (position Pb1) is provided on the side from which the hydrogen ions were implanted (the bottom surface 23 side in the present example). The integrated value of the crystalline defect density farther on the top surface 21 side than where the position Ps is located may be greater than the integrated value of the crystalline defect density farther on the bottom surface 23 side than where the position Pb2 is located.

The distribution drawing (D) shows the carrier lifetime distribution after the hydrogen ions were implanted into the semiconductor substrate 10 and annealing was then performed with prescribed conditions. The carrier lifetime distribution has a shape obtained by inverting the vertical axis of the crystalline defect density distribution. The carrier lifetime $\tau_0$ may be the $\tau_0$ described in the distribution diagram (D) of FIG. 3. For example, the position at which the carrier lifetime has a minimum value matches the center peak position Ks of the crystalline defect density. Furthermore, the position at which the carrier lifetime is a local minimum value matches the center peak Kb of the crystalline defect density. In the same manner as in the distribution drawing (D) of FIG. 3, in regions within ranges of FW1% M centered respectively on the hydrogen concentration peaks at the positions Ps, Pb4, Pb3, Pb2, and Pb1, the carrier lifetime of the semiconductor device 100 may be the maximum value $\tau_0$.

The distribution drawing (E) shows the carrier mobility distribution after the hydrogen ions were implanted into the semiconductor substrate 10 and annealing was then performed with prescribed conditions. The carrier mobility $\mu_0$ may be the $\mu_0$ described in the distribution drawing (E) of FIG. 3. For example, the position at which the carrier mobility has a minimum value matches the center peak position Ks of the crystalline defect density. Furthermore, the position at which the carrier mobility is a local minimum value matches the center peak Kb of the crystalline defect density. In the same manner as in the distribution drawing (E) of FIG. 3, in regions within ranges of FW1% M centered respectively on the hydrogen concentration peaks at the positions Ps, Pb4, Pb3, Pb2, and Pb1, the carrier mobility of the semiconductor device 100 may be the maximum value $\mu_0$.

The distribution drawing (F) shows the carrier concentration distribution after the hydrogen ions were implanted into the semiconductor substrate 10 and annealing was then performed with prescribed conditions. In the same manner as in the distribution drawing (F) of FIG. 3, the measured carrier concentration experiences an overall drop in the region through which the hydrogen ions pass (the region from the bottom end of the anode region 14 of the semiconductor substrate 10 to the vicinity of the position P). However, the region farther on the bottom surface 23 side than where the position Pb4 is located has an overall high hydrogen concentration, and therefore the carrier concentration is higher than the substrate concentration $N_0$.

In the semiconductor device 100 of the present example, the crystalline defect density after annealing decreases around the hydrogen concentration peak position Ps. Therefore, the carrier lifetime in the vicinity of the position Ps of the hydrogen concentration peak increases, and becomes approximately $\tau_0$.

Figure 7B:
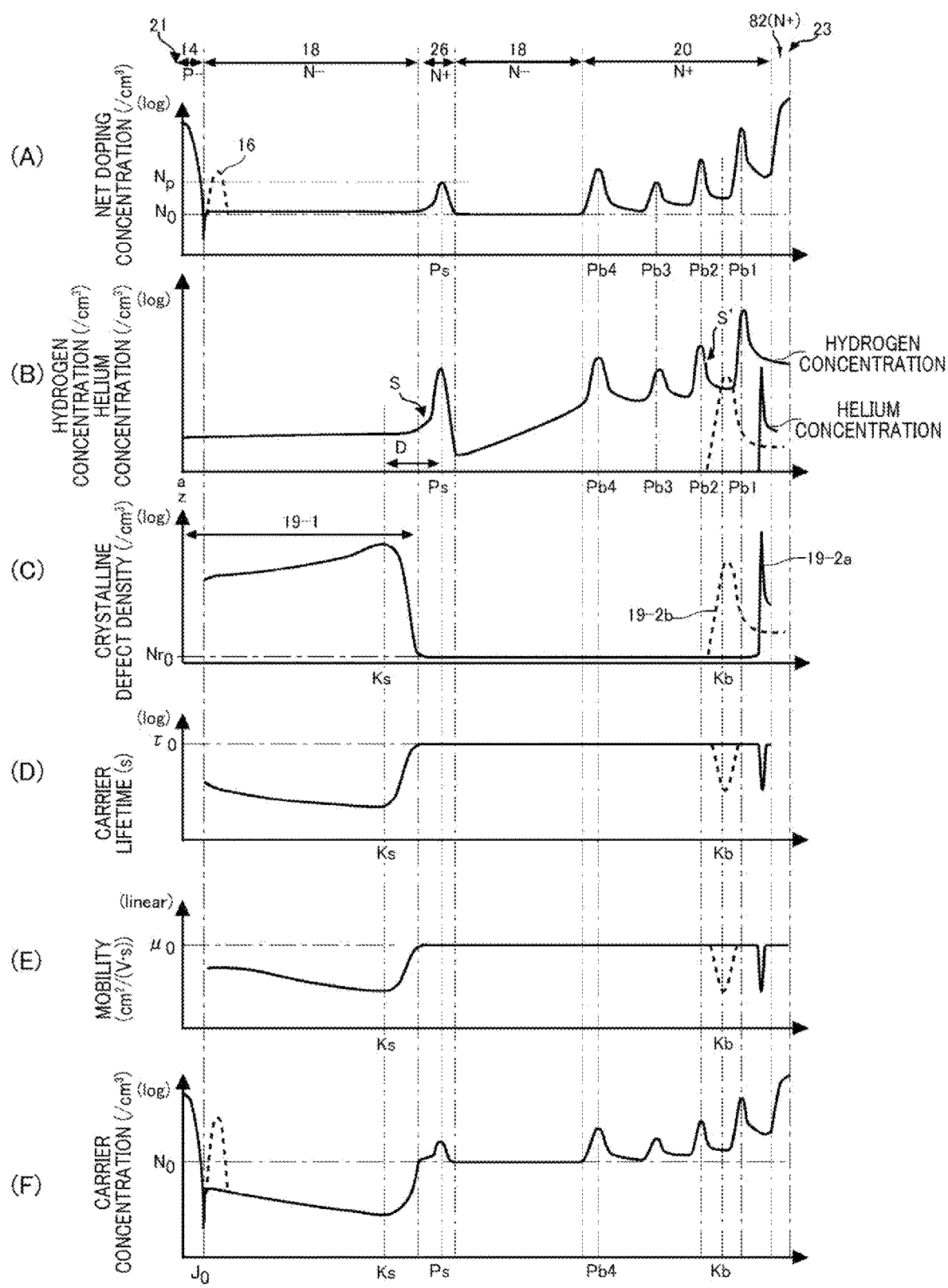
FIG. 7B shows distributions of each of the net doping concentration (A), the hydrogen concentration (B), the crystalline defect density (C), the carrier lifetime (D), the carrier mobility (E), and the carrier concentration (F), in a case where the crystalline defect region 19-2 on the bottom surface 23 side is formed by implanting helium ions.

FIG. 7B shows distributions of each of the net doping concentration (A), the hydrogen concentration and the helium concentration (B), the crystalline defect density (C), the carrier lifetime (D), the carrier mobility (E), and the carrier concentration (F), in a case where the crystalline defect region 19-2 on the bottom surface 23 side is formed by implanting helium ions. Aside from the crystalline defect region 19-2 on the bottom surface 23 side being formed by implanting helium ions, this example is the same as the example of FIG. 7A. The net doping concentration (A) and carrier concentration (F) distributions are similar to those in the example of FIG. 7A.

The distribution drawing (B) shows the chemical hydrogen concentration and helium concentration distributions. The hydrogen concentration distribution is the same as the hydrogen concentration distribution in FIG. 7A. However, in the present example, there is a helium distribution inside the buffer region 20. In the present example, the helium concentration peak is arranged farther on the bottom surface 23 side than where the position Pb1 is located.

The helium concentration peak may be positioned between adjacent hydrogen concentration peaks. Specifically, the helium concentration peak may be positioned between Pb4 and Pb3, between Pb3 and Pb2, or between Pb2 and Pb1. As an example, the helium concentration peak indicated by the dashed line in the distribution drawing (B) is positioned between Pb2 and Pb1. The helium may be introduced with one of the solid line distribution having a peak farther on the bottom surface 23 side that where Pb1 is located and the dashed line distribution having a peak between Pb2 and Pb1, or may be introduced with both of these distributions.

The distribution drawing (C) shows the crystalline defect density after the hydrogen ions and helium ions were implanted into the semiconductor substrate 10 and annealing was then performed with prescribed conditions. The crystalline defect density in the crystalline defect region 19-1 formed by implanting the hydrogen ions is the same as the crystalline defect density in the crystalline defect region 19-1 in the distribution drawing (C) of FIG. 7A. Furthermore, the crystalline defect region 19-2a indicated by the solid line in the distribution drawing (C) is a crystalline defect region in a case where helium ions have been implanted to the position indicated by the solid line in the distribution diagram (B). The crystalline defect region 19-2b is a crystalline defect region in a case where the helium ions have been implanted to the position indicated by the dashed line in the distribution drawing (B). In the distribution drawings (D) and (E) as well, the distributions corresponding to the crystalline defect region 19-2a are indicated by solid lines and the distributions corresponding to the crystalline defect region 19-2b are indicated by dashed lines. The crystalline defect density distributions of the crystalline defect regions 19-2a and 19-2b formed by implanting helium ions have the same shape as the helium concentration distributions. For example, the peak position of the crystalline defect density matches the peak position of the helium concentration.

The distribution drawing (D) shows the carrier lifetime distribution after the hydrogen ions and helium ions were implanted into the semiconductor substrate 10 and annealing was then performed with prescribed conditions. The carrier lifetime distribution has a shape obtained by inverting the vertical axis of the crystalline defect density distribution.

The distribution drawing (E) shows the carrier mobility distribution after the hydrogen ions and helium ions were implanted into the semiconductor substrate 10 and annealing was then performed with prescribed conditions.

In the semiconductor substrate 10, there is a large amount of hydrogen in the buffer region 20 and the region farther on the bottom surface 23 side than where the buffer region 20 is located. Therefore, dangling bonds are easily terminated, and there are cases where it is difficult to form the crystalline defect region 19. In contrast to this, by forming the crystalline defect region 19-2 by implanting helium ions, which have a greater mass than hydrogen ions, it becomes easier for crystalline defects such as vacancies and double vacancies to form. In this way, even when crystalline defects are terminated due to the annealing, it is possible for a certain density of crystalline defects to remain in the buffer region 20 and farther on the bottom surface 23 side than where the buffer region 20 is located. By providing the crystalline defect region 19 in the buffer region 20 and the like, it is possible to precisely control the tail current during the termination period of switching, such as turn-off or reverse recovery, of the semiconductor device 100, for example.

Figure 7C:
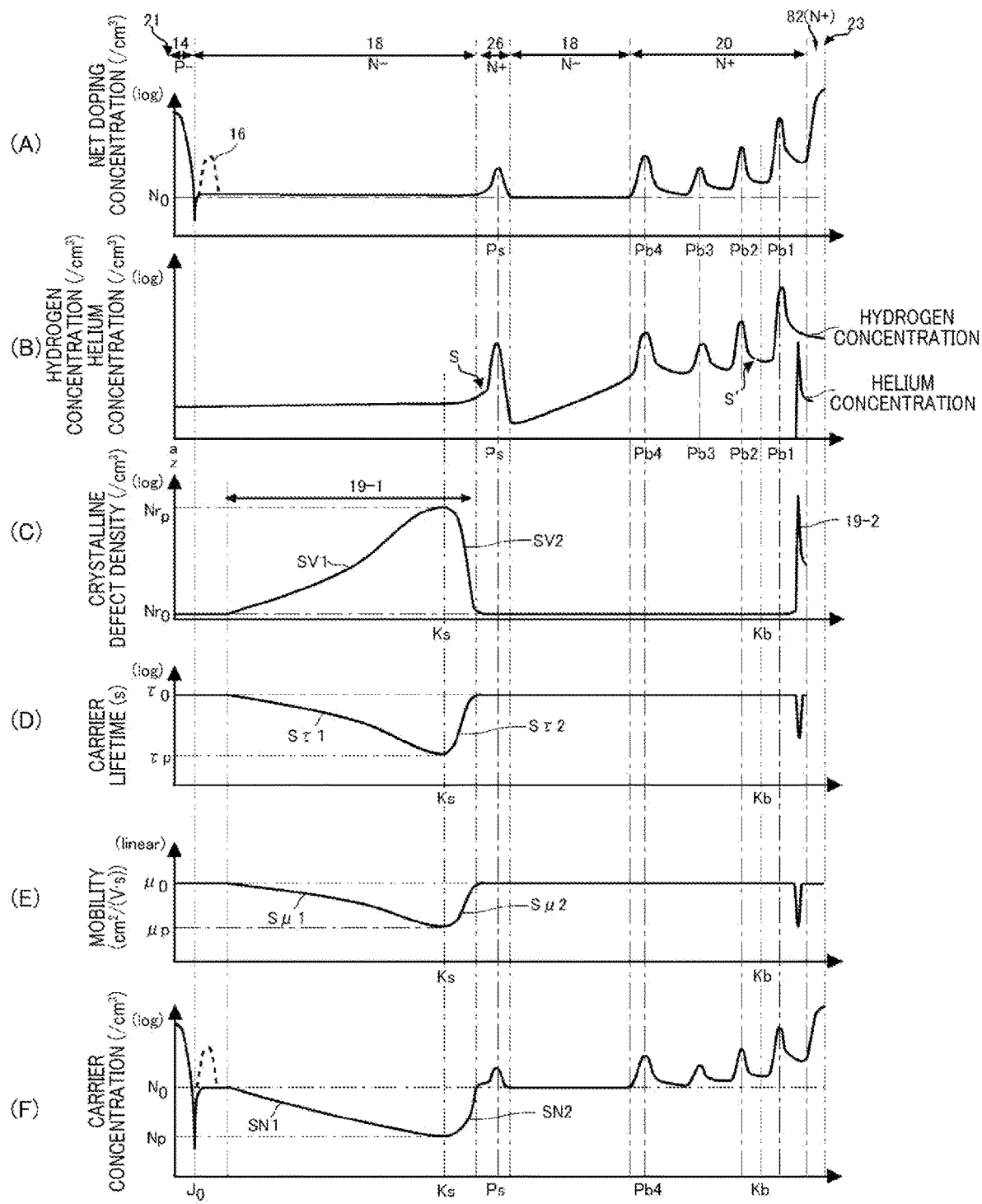
FIG. 7C shows distributions of each of the net doping concentration (A), the hydrogen concentration (B), the crystalline defect density (C), the carrier lifetime (D), the carrier mobility (E), and the carrier concentration (F) of another example.

FIG. 7C shows distributions of each of the net doping concentration (A), the hydrogen concentration (B), the crystalline defect density (C), the carrier lifetime (D), the carrier mobility (E), and the carrier concentration (F) of another example. The vertical axis and horizontal axis in each distribution drawing are the same as in the corresponding distribution drawing in FIG. 3. In the present example, the crystalline defect density (C), the carrier lifetime (D), the carrier mobility (E), and the carrier concentration (F) in the anode region 14 (a base region 17 in which channels are formed in a transistor portion 70, described further below) and the crystalline defect region 19-1 are different than in the examples of FIGS. 7A and 7B. Each distribution at other positions is the same as in the example of either FIG. 7A or 7B.

In the present example, the distributions of the crystalline defect density (C), the carrier lifetime (D), the carrier mobility (E), and the carrier concentration (F) each have a peak in the crystalline defect region 19-1. The crystalline defect density distribution peak has a tail SV1 farther on the top surface 21 side than where the center peak position Ks is located and a tail SV2, which his steeper than the tail SV1, farther on the bottom surface 23 side than where the center peak position Ks is located. The carrier lifetime distribution peak has a tail Sτ1 farther on the top surface 21 side than where the center peak position Ks is located and a tail Sτ2, which is steeper than the tail Sτ1, farther on the bottom surface 23 side than where the center peak position Ks is located. The carrier mobility distribution peak has a tail Sμ1 farther on the top surface 21 side than where the center peak position Ks is located and a tail Sμ2, which is steeper than the tail Sμ1, farther on the bottom surface 23 side than where the center peak position Ks is located. The carrier concentration distribution peak has a tail SN1 farther on the top surface 21 side than where the center peak position Ks is located and a tail SN2, which is steeper than the tail SN1, farther on the bottom surface 23 side than where the center peak position Ks is located.

Each tail may be a portion in the corresponding distribution from the apex of the peak to where the value is the same as a prescribed reference value. This reference value may use the minimum value $Nr_0$ in the drift region 18 for the crystalline defect density, the maximum value $τ_0$ in the drift region for the carrier lifetime, the maximum value $N_0$ in the drift region 18 for the carrier mobility, and the minimum value $N_0$ in a portion from the hydrogen concentration peak position Ps to the buffer region 20 for the carrier concentration. In this specification, "the same as" may include a case where the difference therebetween is less than or equal to 10%.

None of the tails SV1, Sτ1, Sμ1, and SN1 of the present example reach the anode region 14 (the base region 17 in the transistor portion 70). In other words, the crystalline defect density, the carrier lifetime, the carrier mobility, and the carrier concentration of the anode region 14 and the base region 17 are the same as the reference values $Nr_0$, $τ_0$, $μ_0$, and $N_0$ described above. In this way, it is possible to reduce the effect of forming the crystalline defects on the anode region 14 and the base region 17. In particular, fluctuation of the gate threshold value is restricted. The gate threshold value is determined by the position of the peak concentration of the base region 17. When the crystalline defect density of the base region 17 at the peak position is higher than $Nr_0$, there are cases where the interface state or the like that affects the gate threshold value increases, and the gate threshold value changes. By causing the crystalline defect density of the base region 17 at the peak position to be $Nr_0$, it is possible to minimize the effect on the gate threshold value. By adjusting the hydrogen ion implantation position and the annealing conditions after the hydrogen ion implantation, for example, each tail can be restricted so as not to reach the anode region 14 and the base region 17.

Figure 7D:
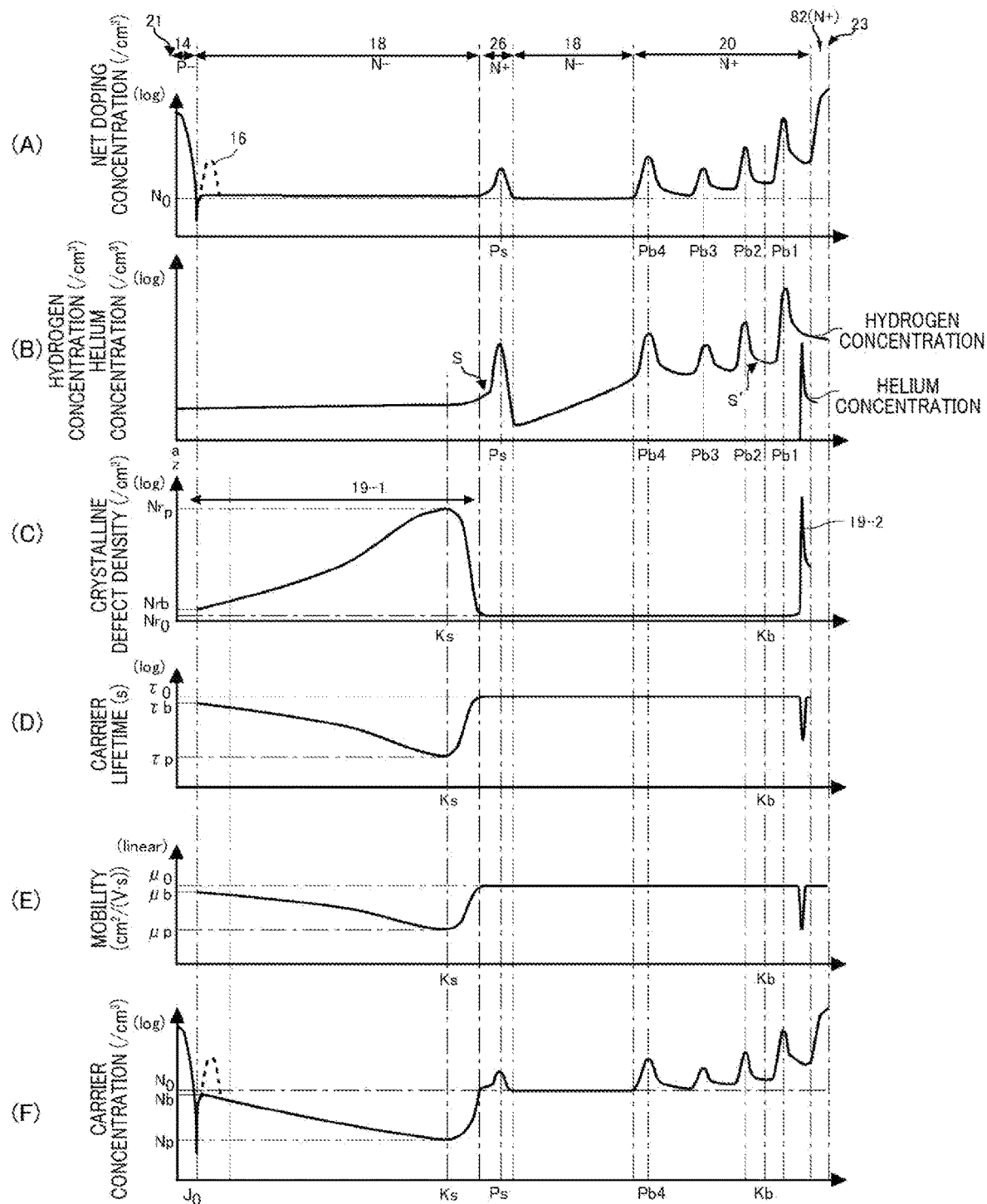
FIG. 7D shows distributions of each of the net doping concentration (A), the hydrogen concentration (B), the crystalline defect density (C), the carrier lifetime (D), the carrier mobility (E), and the carrier concentration (F) of another example.

FIG. 7D shows distributions of each of the net doping concentration (A), the hydrogen concentration (B), the crystalline defect density (C), the carrier lifetime (D), the carrier mobility (E), and the carrier concentration (F) of another example. The vertical axis and horizontal axis in each distribution drawing are the same as in the corresponding distribution drawing in FIG. 3. In the present example, the crystalline defect density (C), the carrier lifetime (D), the carrier mobility (E), and the carrier concentration (F) in the anode region 14 (the base region 17 in the transistor portion 70) and the crystalline defect region 19-1 are different than in the example of FIG. 7C. Each distribution at other positions is the same as in the example of FIG. 7C.

In the present example, at least one of the tails SV1, Sτ1, Sμ1, and SN1 reaches the anode region 14 or the base region 17. However, the crystalline defect density, the carrier lifetime, the carrier mobility, and the carrier concentration of the anode region 14 and the base region 17 are sufficiently close to the reference values $Nr_0$, $τ_0$, $μ_0$, and $N_0$ described above.

In the present example, the crystalline defect density, the carrier lifetime, the carrier mobility, and the carrier concentration at the center peak position Ks are represented by Nrp, τp, μp, and Np. Furthermore, the crystalline defect density, the carrier lifetime, the carrier mobility, and the carrier concentration in the anode region 14 or base region 17 are represented by Nrb, τb, μb, and Nb. The crystalline defect density Nrb, the carrier lifetime τb, the carrier mobility μb, and the carrier concentration Nb may be the values at a position of the PN junction between the anode region 14 or base region 17 and the N type region such as the drift region 18. For the carrier concentration Nb, a local maximum value of the carrier concentration in the N type region in contact with the PN junction may be used.

The crystalline defect density Nrb, the carrier lifetime τb, the carrier mobility μb, and the carrier concentration Nb may be less than or equal to ½, less than or equal to ¼, less than or equal to 1/10, or less than or equal to 1/100 of the corresponding crystalline defect density Nrp, the carrier lifetime τp, the carrier mobility τp, and the carrier concentration Np at the center peak position Ks. In this way, it is possible to reduce the effect of forming the crystalline defects on the anode region 14 and the base region 17.

Figure 8A:
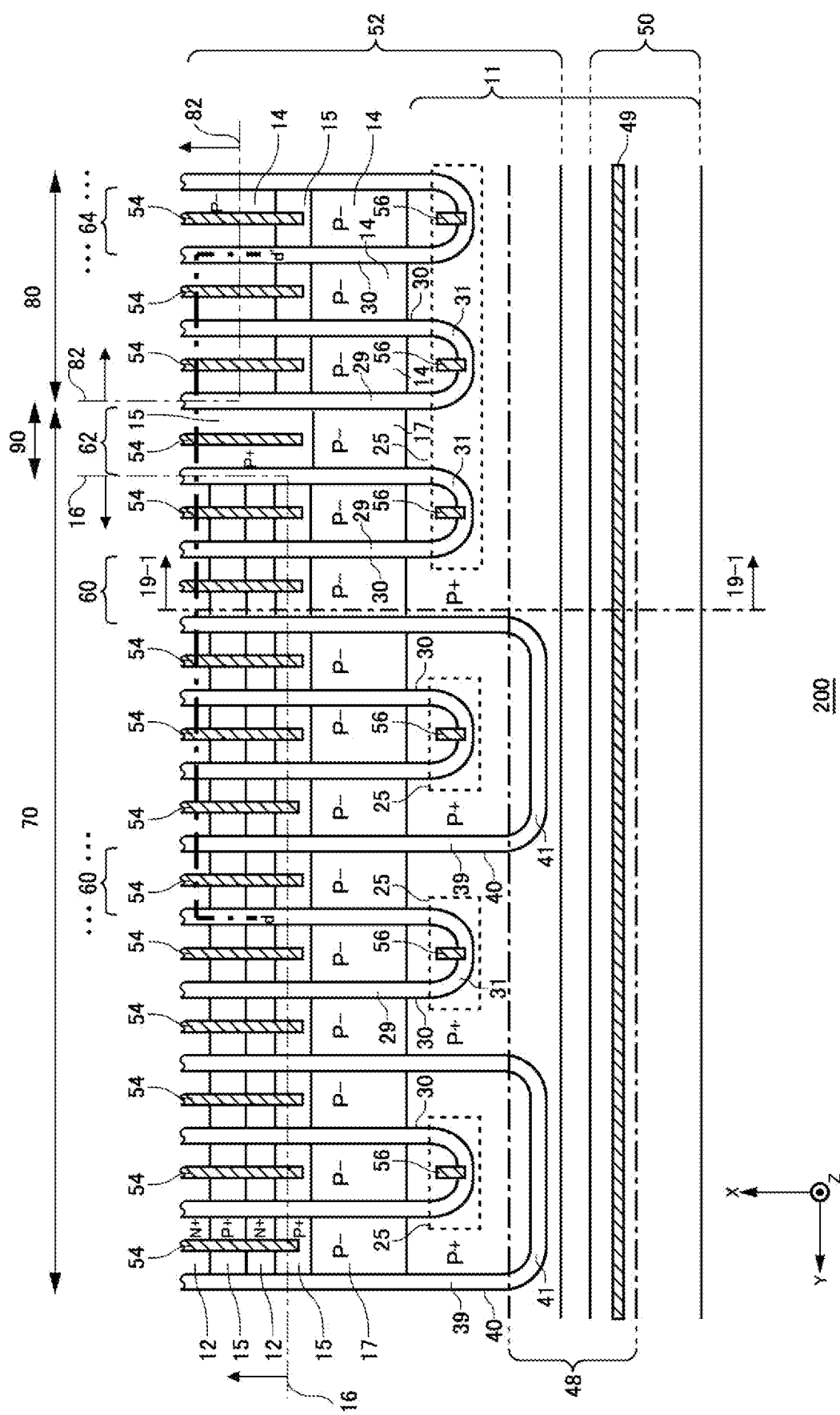
FIG. 8A is a partial view of an example of a top surface of a semiconductor device 200 according to the present embodiment.

FIG. 8A is a partial view of an example of a top surface of a semiconductor device 200 according to the present embodiment. The semiconductor device 200 of the present example is a semiconductor chip including a transistor portion 70 and a diode portion 80 provided adjacent to the transistor portion 70. The top surface of the semiconductor device 200 may be the same as the top surface of the semiconductor device 100 shown in FIG. 1A. The transistor portion 70 includes a transistor such as an IGBT. The interface portion 90 is a region of the transistor portion 70 adjacent to the diode portion 80. The diode portion 80 includes a diode such as an FWD (Free Wheel Diode) on the top surface of the semiconductor substrate 10. In FIG. 8A, the top surface of the chip near the chip edge portion is shown, and other regions are omitted.

Furthermore, in FIG. 8A the active region of the semiconductor substrate 10 in the semiconductor device 200 is shown, but the semiconductor device 200 may include an edge termination structure portion that surrounds the active region. The active region refers to a region through which current flows when the semiconductor device 200 is controlled to be in the ON state. The edge termination structure portion relaxes the electrical field concentration on the top surface 21 side of the semiconductor substrate 10. The edge termination structure portion has a guard ring, a field plate, a RESURF, and a structure in which these components are combined, for example.

The semiconductor device 200 of the present example includes a gate trench portion 40, the dummy trench portion 30, a well region 11, an emitter region 12, the base region 17, and the contact region 15 that are provided within the semiconductor substrate 10 and exposed on the top surface of the semiconductor substrate 10. Furthermore, the semiconductor device 200 of the present example includes the emitter electrode 52 and the gate metal layer 50 provided above the top surface 21 of the semiconductor substrate 10. The emitter electrode 52 and the gate metal layer 50 are provided separated from each other.

An interlayer dielectric film is provided between the emitter electrode 52 and gate metal layer 50 and the top surface 21 of the semiconductor substrate 10, but this interlayer dielectric film is omitted from FIG. 8A. The interlayer dielectric film of the present example is provided with a contact hole 56, a contact hole 49, and a contact hole 54 that penetrate through this interlayer dielectric film.

Furthermore, the emitter electrode 52 is connected to the dummy conducting portion within the dummy trench portion 30, via the contact hole 56. A connecting section 25 formed of a conductive material, such as polysilicon doped with impurities, may be provided between the emitter electrode 52 and the dummy conducting portion. A dielectric such as an oxide film is provided between the connecting section 25 and the top surface 21 of the semiconductor substrate 10.

The gate metal layer 50 contacts the gate runner 48, via the contact hole 49. The gate runner 48 is formed of polysilicon or the like doped with impurities. The gate runner 48 is connected to a gate conducting portion inside the gate trench portion 40, on the top surface 21 of the semiconductor substrate 10. The gate runner 48 is not connected to the dummy conducting portion within the dummy trench portion 30.

The gate runner 48 of the present example is formed from below the contact hole 49 to a tip portion of the gate trench portion 40. A dielectric such as an oxide film is formed between the gate runner 48 and the top surface 21 of the semiconductor substrate 10.

The gate conducting portion is exposed in the top surface 21 of the semiconductor substrate 10, at the tip portion of the gate trench portion 40. The gate trench portion 40 contacts the gate runner 48 at the exposed portion of the gate conducting portion.

The emitter electrode 52 and the gate metal layer 50 are formed of a material including metal. At least a partial region of the emitter electrode 52 may be formed by aluminum or an aluminum-silicon alloy.

At least a partial region of the gate metal layer 50 may be formed by aluminum or an aluminum-silicon alloy. The emitter electrode 52 and the gate metal layer 50 may include a barrier metal formed of titanium, a titanium compound, or the like, in an underlayer of the region formed of aluminum or the like. Furthermore, the emitter electrode 52 and the gate metal layer 50 may include a plug formed of tungsten or the like within the contact hole.

One or more gate trench portions 40 and one or more dummy trench portions 30 are arranged at prescribed intervals along a prescribed arrangement direction (Y-axis direction in the present example). The gate trench portion 40 may include two extending portions 39 that extend along an extension direction (X-axis direction in the present example) perpendicular to the arrangement direction, which is parallel to the top surface 21 of the semiconductor substrate 10, and a connecting portion 41 that connects the two extending portions 39. At least part of the connecting portion 41 is preferably formed to be U-shaped. By connecting the end portions of the two extending portions 39 of the gate trench portion 40, it is possible to relax the electrical field concentration at the end portions of the extending portions 39. In this specification, there are cases where each extending portion 39 of the gate trench portion 40 is treated as a single gate trench portion 40. The gate runner 48 may be connected to the gate conducting portion at the connecting portion 41 of the gate trench portion 40.

The dummy trench portion 30 of the present example may be U-shaped in the top surface 21 of the semiconductor substrate 10, in the same manner as the gate trench portion 40. In other words, the dummy trench portion 30 of the present example may include two extending portions 29 that extend along the extension direction and a connecting portion 31 that connects the two extending portions 29.

The emitter electrode 52 is formed above the gate trench portion 40, the dummy trench portion 30, the well region 11, the emitter region 12, the base region 17, and the contact region 15. The well region 11 has a second conductivity type. The well region 11 is P+ type, for example. The well region 11 is formed in a predetermined range from an end portion of the active region on the side where the gate metal layer 50 is provided. The diffusion depth of the well region 11 may be greater than the depth of the gate trench portion 40 and the dummy trench portion 30. A region of parts of the gate trench portion 40 and the dummy trench portion 30 on the gate metal layer 50 side is formed in the well region 11. Floors of the ends of the gate trench portion 40 and the dummy trench portion 30 in the extension direction may be covered by the well region 11.

A mesa portion is provided adjacent to each trench portion in the Y-axis direction, within a plane parallel to the top surface 21 of the semiconductor substrate 10. The mesa portion is a portion of the semiconductor substrate sandwiched between two adjacent trench portions. The mesa portion may be a portion from the top surface 21 of the semiconductor substrate 10 to the depth of a deepest floor portion of each trench portion. A region sandwiched by extending portions of two adjacent trench portions may be a mesa portion.

In the transistor portion 70, a first mesa portion 60 is provided adjacent to each trench portion. At the interface portion 90, which is the portion of the transistor portion 70 forming an interface with the diode portion 80, a second mesa portion 62 is provided in a region sandwiched by adjacent dummy trench portions 30. In the diode portion 80, a third mesa portion 64 is provided in a region sandwiched by adjacent dummy trench portions 30.

A base region 17 of a second conductivity type is provided, in a manner to be exposed in the top surface 21 of the semiconductor substrate 10, at both ends in the X-axis direction of each of the first mesa portion 60, the second mesa portion 62, and the third mesa portion 64. The base region 17 of the present example is P− type, for example. FIG. 8A shows only one end portion of the base region 17 in the X-axis direction.

The emitter region 12 is provided in contact with the gate trench portion 40, on the top surface of the first mesa portion 60. The emitter region 12 may be provided in the Y-axis direction, from one to the other of two trench portions extending in the X-axis direction and sandwiching the first mesa portion 60. The emitter region 12 is also provided below the contact hole 54.

The emitter region 12 may contact the dummy trench portion 30, but does not need to contact the dummy trench portion 30. In the present example, the emitter region 12 is provided in contact with the dummy trench portion 30. The emitter region 12 of the present example is a first conductivity type. The emitter region 12 of the present example is N+ type, for example.

The contact region 15 of a second conductivity type, which has a higher doping concentration than the base region 17, is provided on the top surface of the first mesa portion 60. The contact region 15 of the present example is P+ type, for example. In the first mesa portion 60, the emitter region 12 and the contact region 15 may be provided in an alternating manner in the extension direction of the gate trench portion 40. The contact region 15 may be provided in the Y direction, from one to the other of two trench portions extending in the X-axis direction and sandwiching the first mesa portion 60. The contact region 15 may also be provided below the contact hole 54.

The contact region 15 may contact the gate trench portion 40, but does not need to contact the gate trench portion 40. Furthermore, the contact region 15 may contact the dummy trench portion 30, but does not need to contact the dummy trench portion 30. In the present example, the contact region 15 is provided in contact with the dummy trench portion 30 and the gate trench portion 40.

The contact region 15 is provided on the top surface of the second mesa portion 62. The surface area of the contact region 15 provided on the top surface of one second mesa portion 62 may be greater than the surface area of the contact region 15 provided on the top surface of one first mesa portion 60. The surface area of the contact region 15 provided on the top surface of one second mesa portion 62 may be greater than the surface area of the contact region 15 provided on the top surface of one third mesa portion 64. On the second mesa portion 62, the contact region 15 is also provided below the contact hole 54.

The contact region 15 on the top surface of the second mesa portion 62 may be provided on the entire region sandwiched between the base regions 17 provided at the respective end portions of the second mesa portion 62 in the X-axis direction. With the second mesa portion 62, the carriers are more effectively withdrawn during turn-off, compared to the first mesa portion 60.

The contact region 15 is provided on the top surface of the third mesa portion 64, at both end portions in the X-axis direction. Furthermore, at the top surface of the third mesa portion 64, the base region 17 is provided in the region sandwiched by the contact regions 15 provided at the respective end portions of the third mesa portion 64 in the X-axis direction. The base region 17 may be provided on the entire region sandwiched by these contact regions 15 in the X-axis direction. On the third mesa portion 64, the base region 17 may also be provided below the contact hole 54. The contact region 15 may also be provided below the contact hole 54.

On the third mesa portion 64, the contact region 15 and the base region 17 are formed from one of the dummy trench portions 30 sandwiching the third mesa portion 64 to the other dummy trench portion 30. In other words, on the top surface of the semiconductor substrate, the width of the third mesa portion 64 in the Y-axis direction and the width of the contact region 15 or the base region 17 in the Y-axis direction provided on this third mesa portion 64 are equal.

The emitter region 12 may be formed, but does not need to be formed, on the third mesa portion 64. In the present example, the emitter region 12 is not formed on the third mesa portion 64.

In the semiconductor device 200 of the present example, the dummy trench portion 30 is formed in the diode portion 80. The linear extending portions 29 of respective adjacent dummy trench portions 30 may be connected to each other by a connecting portion 31. The third mesa portion 64 is a region sandwiched by the respective dummy trench portions 30.

The diode portion 80 includes the cathode region 82 of a first conductivity type, on the bottom surface 23 side of the semiconductor substrate 10. The cathode region 82 of the present example is N+ type, for example. In FIG. 8A, the region where the cathode region 82 is provided, in the top surface view of the semiconductor substrate 10, is indicated by a single-dot chain line. The diode portion 80 may be a region where the cathode region 82 is projected onto the top surface 21 of the semiconductor substrate 10. Furthermore, the entirety of the third mesa portion 64 where a portion of the cathode region 82 is provided and the dummy trench portions 30 adjacent to this third mesa portion 64 may be included in the diode portion 80. The region where the cathode region 82 is projected into the top surface 21 of the semiconductor substrate 10 may be distanced from the contact region 15 in the positive X-axis direction.

A collector region of a second conductivity type may be formed in a region where the cathode region 82 is not formed on the bottom surface 23 of the semiconductor substrate 10. The collector region of the present example is P+ type, for example. The collector region may be formed at a position on the diode portion 80 where the end portion of the contact hole 54 on the negative X-axis direction side is projected onto the bottom surface 23 of the semiconductor substrate 10.

In the portion of the transistor portion 70 excluding the interface portion 90, the contact hole 54 is formed above each region of the contact region 15 and the emitter region 12. In each first mesa portion 60, excluding the first mesa portions 60 adjacent to the interface portion 90, the contact hole 54 is provided in a manner to not overlap with the gate trench portion 40 and the dummy trench portion 30 extending in the X-axis direction, in the top surface view of FIG. 8A. The width of the contact hole 54 in the Y-axis direction may be less than the widths of the emitter region 12 and the contact region 15 in the Y-axis direction.

In the portion of the transistor portion 70 excluding the interface portion 90, each contact hole 54 is provided continuously from above the contact region 15 provided farthest on the negative X-axis direction side of a first mesa portion 60 to above the contact region 15 provided farthest on the negative X-axis direction side of the first mesa portion 60, in the top surface view of the semiconductor substrate 10 semiconductor substrate 10 shown in FIG. 8A. The contact hole 54 may be provided in a manner to not overlap with at least a portion of the contact region 15 provided farthest on the negative X-axis direction side of the first mesa portion 60, in the top surface view of the semiconductor substrate 10 shown in FIG. 8A. The contact hole 54 may be provided in a manner to not overlap with at least a portion of the contact region 15 provided farthest on the positive X-axis direction side of the first mesa portion 60, in the top surface view of the semiconductor substrate 10 shown in FIG. 8A.

In the interface portion 90, the contact hole 54 is formed above the contact region 15. In the second mesa portion 62, the contact hole 54 may be formed in a manner to not overlap with the dummy trench portion 30 extending in the X-axis direction, in the top surface view of the semiconductor substrate 10 shown in FIG. 8A. The width of the contact hole 54 in the Y-axis direction may be less than the width of the contact region 15 in the Y-axis direction.

In the interface portion 90, the contact hole 54 may be provided continuously in the X-axis direction to a region above the contact region 15 provided to the second mesa portion 62, in the top surface view shown in FIG. 8A. The contact hole 54 may be provided in a manner to overlap with at least a portion of the contact region 15 provided on the second mesa portion 62, in the top surface view of FIG. 8A.

In the diode portion 80, the contact hole 54 is formed above the base region 17 and the contact region 15. In the third mesa portion 64, the contact hole 54 may be provided in a manner to not overlap with the dummy trench portion 30 extending in the X-axis direction, in the top surface view shown in FIG. 8A. The width of the contact hole 54 in the Y-axis direction may be less than the widths of the base region 17 and the contact region 15 in the Y-axis direction.

In the diode portion 80, the contact hole 54 may be provided continuously from above the contact region 15 provided farthest on the negative X-axis direction side of the third mesa portion 64 to above the contact region 15 provided farthest on the positive X-axis direction side of the third mesa portion 64, in the top surface view shown in FIG. 8A. The contact hole 54 may be provided in a manner to overlap with at least a portion of the contact region 15 provided farthest on the negative X-axis direction side of the third mesa portion 64, in the top surface view shown in FIG. 8A. The contact hole 54 may be provided in a manner to overlap with at least a portion of the contact region 15 provided farthest on the positive X-axis direction side of the third mesa portion 64, in the top surface view shown in FIG. 8A.

In the transistor portion 70, the accumulation region 16 of a first conductivity type may be provided below the base region 17. The accumulation region 16 of the present example is N+ type, for example. In FIG. 8A, the ranges in which the accumulation region 16 is formed are indicated by dashed lines. The accumulation region 16 may be formed from a region where the contact region 15 on the −X-axis direction end overlaps with a contact hole 54 to the +X-axis direction, in the top surface view of the semiconductor substrate. The accumulation region 16 may be provided, but does not need to be provided, in the diode portion 80.

The semiconductor device 200 of the present example includes a crystalline defect region 19 inside the semiconductor substrate 10. As shown in FIGS. 1A to 6, the semiconductor device 200 may include one of the crystalline defect region 19-1 on the top surface 21 side and the crystalline defect region 19-2 on the bottom surface 23 side, or may include both of these crystalline defect regions. The semiconductor device 200 of the present invention includes both of the crystalline defect regions 19-1 and 19-2. The crystalline defect region 19-2 may be provided to all of the transistor portion 70 and all of the diode portion 80. The crystalline defect region 19-1 may be provided to all of the diode portion 80 and a portion of the transistor portion 70.

In FIG. 8A, the region where the crystalline defect region 19-1 is provided is indicated by a single-dot chain line and arrow symbols. In the present example, the crystalline defect region 19-1 is arranged in a region where none of the diode portion 80 in the XY-plane overlaps with a gate trench portion 40 in the transistor portion 70. The crystalline defect region 19-1 may be provided continuously in the Y-axis direction from the diode portion 80 to the first mesa portion 60 in contact with the gate trench portion 40 closest to the diode portion 80 in the transistor portion 70. In another example, the crystalline defect region 19-1 may be arranged discretely in the Y-direction, so as not to overlap with any gate trench portions 40 in the transistor portion 70.

Figure 8B:
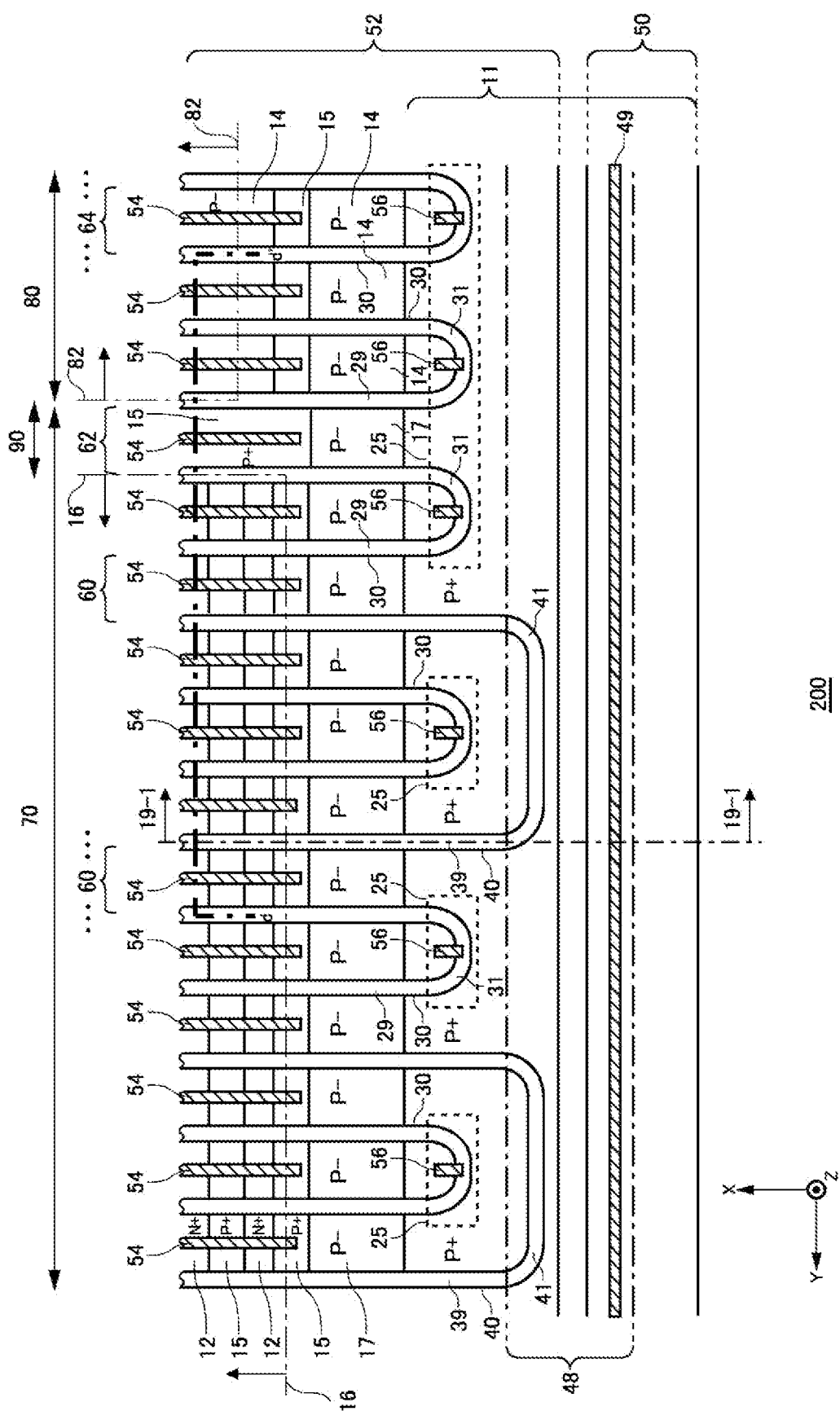
FIG. 8B is a partial view of another example of a top surface of the semiconductor device 200.

FIG. 8B is a partial view of another example of a top surface of the semiconductor device 200. In the semiconductor device 200 of the present example, the arrangement of the crystalline defect region 19-1 is different from the arrangement in the example of FIG. 8A. Other structures are the same as in the example of FIG. 8A.

In the semiconductor device 200 of the present example, the crystalline defect region 19-1 is arranged overlapping with a gate trench portion 40 of the transistor portion 70. More specifically, the crystalline defect region 19-1 is arranged overlapping with one or more gate trench portions 40 arranged closest to the diode portion 80, among the gate trench portions 40 of the transistor portion 70. The crystalline defect region 19-1 may be arranged in a manner to not overlap with at least the first mesa portion 60 arranged in the center in the Y-axis direction, in each gate trench portion 40 of the transistor portion 70.

Figure 8C:
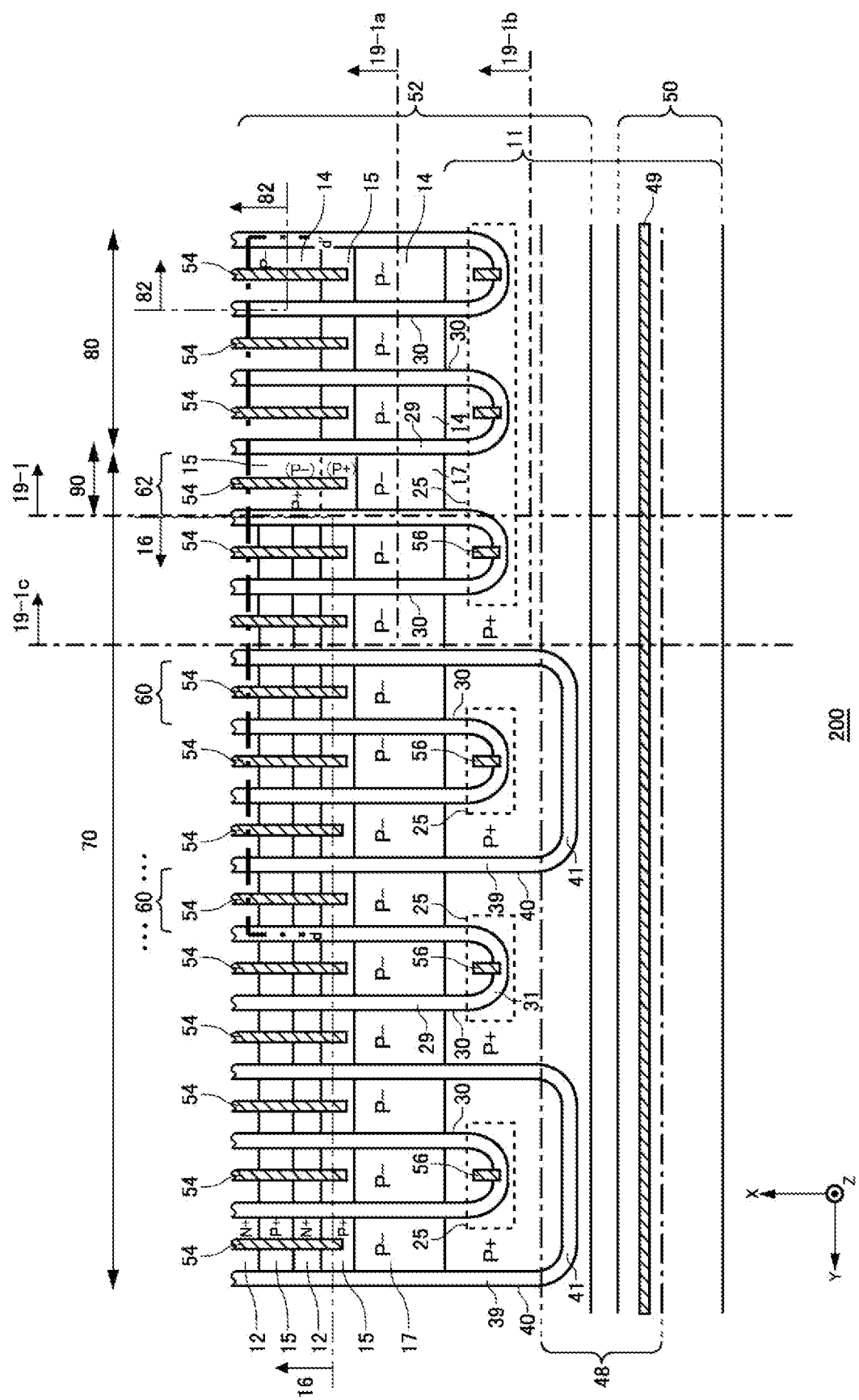
FIG. 8C is a partial view of another example of a top surface of the semiconductor device 200.

FIG. 8C is a partial view of another example of a top surface of the semiconductor device 200. In the semiconductor device 200 of the present example, the arrangement of the crystalline defect region 19-1 and the cathode region 82 is different from the arrangement in the example of FIG. 8A. The other structures are the same as in the example of FIG. 8A.

The crystalline defect region 19-1 may be provided in a wider range than the cathode region 82 in the X-axis direction and the Y-axis direction. In FIG. 8C, the crystalline defect region 19-1 is arranged in the interface portion 90 and the diode portion 80 but is not arranged in the portion of the transistor portion 70 that is not the interface portion 90, in the Y-axis direction. The surface area of the contact region 15 exposed in the top surface of one second mesa portion 62 of the interface portion 90 is greater than the surface area of the contact region 15 exposed in the top surface of one first mesa portion 60 in the transistor portion 70. The second mesa portion 62 may have a configuration obtained by replacing the emitter region 12 in the first mesa portion 60 with the contact region 15. The cathode region 82 is provided in at least a portion of the diode portion 80 in the Y-axis direction. In the present example, the region sandwiched by transistor portions 70 in the Y-axis direction is the diode portion 80. The cathode region 82 of FIG. 8C is not provided in one or more of the third mesa portions 64 closest to the interface portion 90 in the diode portion 80. The cathode region 82 of FIG. 8C is provided distanced in the X-axis direction from the contact region 15 in the diode portion 80.

An end portion of the crystalline defect region 19-1 in the X-axis direction is arranged between an end portion of the cathode region 82 in the X-axis direction and the gate metal layer 50. The end portion of the crystalline defect region 19-1 in the X-axis direction may be arranged between the contact hole 54 and the gate metal layer 50 (the crystalline defect region 19-1a in FIG. 8C). In another example, the end portion of the crystalline defect region 19-1 in the X-axis direction may be arranged between the dummy trench portion 30 and the gate metal layer 50 (the crystalline defect region 19-1b in FIG. 8C).

The end portion of the crystalline defect region 19-1 in the X-axis direction may be arranged inside the well region 11, in the top surface view (the crystalline defect region 19-1b in FIG. 8C). The P type well region 11 has a higher doping concentration than the P type anode region 14 or base region 17. By providing the crystalline defect region 19-1 in the well region 11 as well, it is possible to restrict the implantation of holes from the well region 11 toward the cathode region 82.

An end portion of the crystalline defect region 19-1 in the Y-axis direction may be arranged in a dummy trench portion 30 or a first mesa portion 60 farther on the diode portion 80 side than where the gate trench portion 40 provided farthest on the diode portion 80 side, among the gate trench portions 40 of the transistor portion 70, is located (the crystalline defect region 19-1c in FIG. 8C). In this way, it is possible to restrict the implantation of holes from the transistor portion 70 toward the cathode region 82, without affecting the gate threshold value.

The crystalline defect region 19-1 may extend to the gate runner 48 or the gate metal layer 50 in the Y-axis direction. The end portion of the crystalline defect region 19-1 in the Y-axis direction may reach the gate runner 48, reach the gate metal layer 50, or be positioned to extend beyond the gate metal layer 50. In this way, the carriers remaining in the gate runner 48 or the gate metal layer 50 can be reduced, and the effect on the switching operation can be restricted.

A gate dielectric is formed on the bottom surface 23 side of the gate runner 48 or gate metal layer 50, but this is also a region where an inversion layer channel is not formed. During the ion implantation for forming the crystalline defect region 19-1, the implanted ions are also introduced into or pass through the gate dielectric on the bottom surface 23 side of the gate runner 48 or gate metal layer 50. Therefore, there are cases where damage is formed in the gate dielectric as well, during the ion implantation. However, since the inversion layer channel is not formed on the bottom surface 23 side of the gate runner 48 or gate metal layer 50, the effect on the gate threshold value is sufficiently small.

The contact region 15 in the top surface of the second mesa portion 62 does not need to be provided in the entire region sandwiched by the base regions 17 provided at the respective end portions of the second mesa portion 62 in the X-axis direction. Specifically, the contact regions 15 in the top surface of the second mesa portion 62 cover only both ends of the contact hole 54, and the base region 17 may be exposed in the top surface of the second mesa portion 62 sandwiched by these contact regions 15. In the top surface of the second mesa portion 62, this exposed surface area of the base region 17 may be greater than, or 10 times or more greater than, the surface are of the contact regions 15 that cover both ends of the contact hole 54. Furthermore, the configuration may be the same as that of the diode portion 80.

Figure 8D:
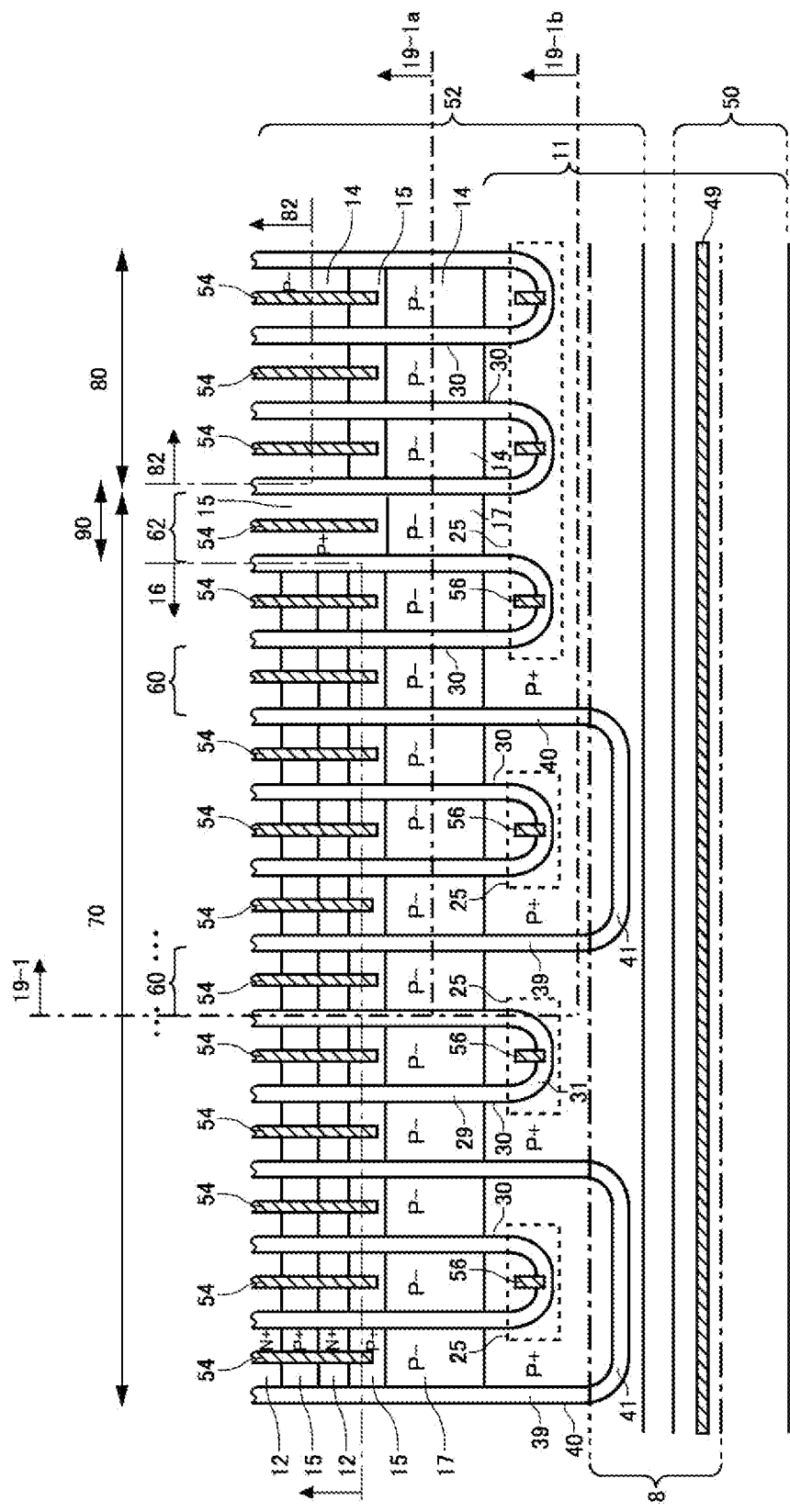
FIG. 8D is a partial view of another example of a top surface of the semiconductor device 200.

FIG. 8D is a partial view of another example of a top surface of the semiconductor device 200. In the semiconductor device 200 of the present example, the arrangement of the cathode region 82 in the Y-axis direction is different from the arrangement in the example of FIG. 8C. The other structures are the same as in the example of FIG. 8C. The position of an end portion of the crystalline defect region 19-1 in the Y-axis direction may be the same as in the example of FIG. 8C.

The cathode region 82 of the present example is provided in the entirety of the diode portion 80 in the Y-axis direction. Furthermore, in the Y-axis direction, the crystalline defect region 19-1 is provided in a partial region of the transistor portion 70 in contact with the diode portion 80. The crystalline defect region 19-1 is also provided to the first mesa portions 60 outside the interface portion 90. However, the crystalline defect region 19-1 is not provided in a prescribed range that includes the center of the transistor portion 70 in the Y-axis direction. With such a configuration, it is possible to restrict the flow of carriers from the cathode region 82 to the top surface side of the transistor portion 70.

Figure 9A:
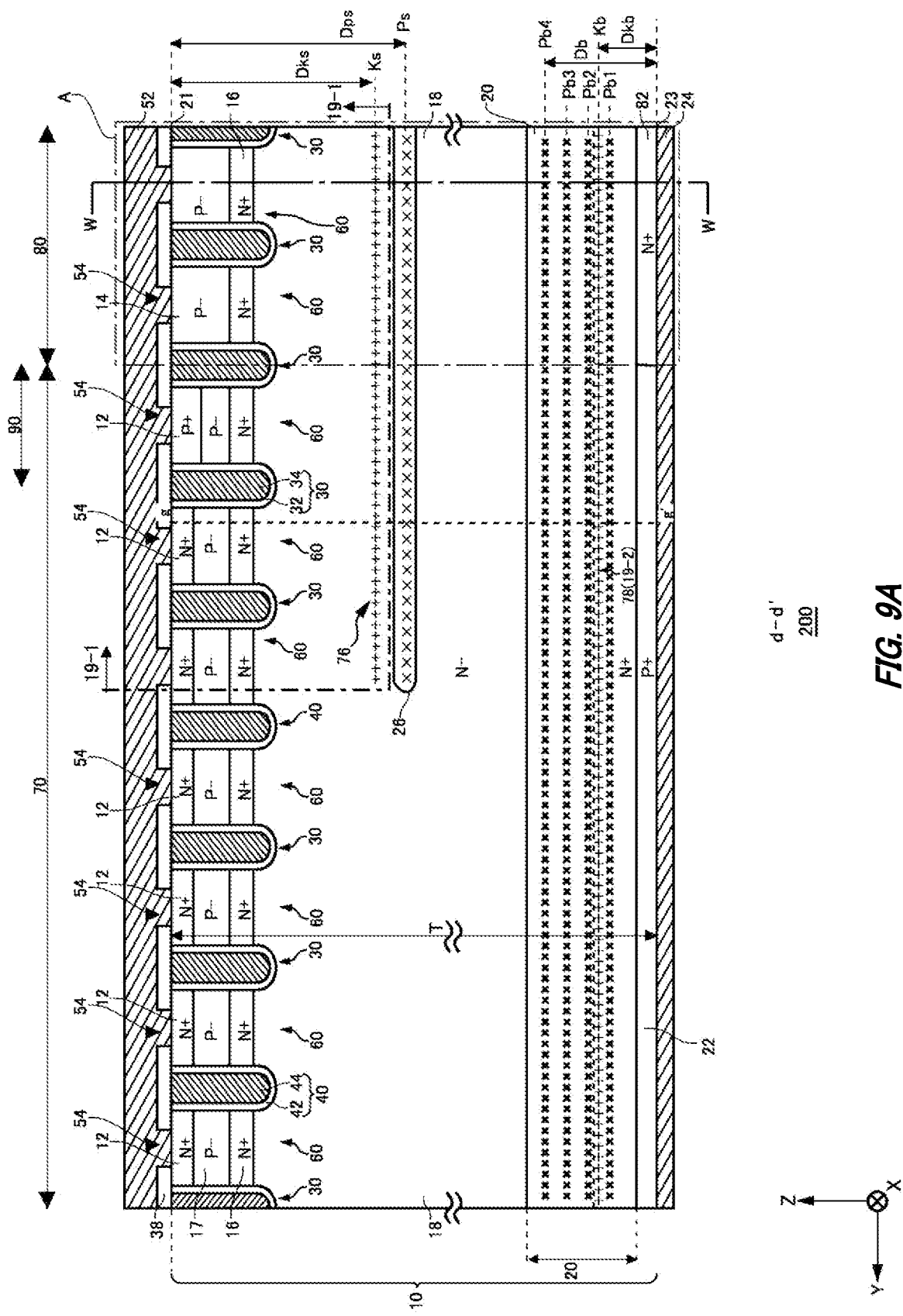
FIG. 9A shows an example of the d-d' cross section in FIG. 8A.

FIG. 9A shows an example of the d-d' cross section in FIG. 8A. The d-d' cross section is a YZ-plane that passes through the emitter region 12 and the contact region 15 in the transistor portion 70 and the diode portion 80. The semiconductor device 200 of the present example includes the semiconductor substrate 10, the interlayer dielectric film 38, the emitter electrode 52, and the collector electrode 24, in the d-d' cross section. The emitter electrode 52 is provided on the top surface 21 of the semiconductor substrate 10 and the top surface of the interlayer dielectric film 38.

The region A corresponds to the semiconductor device 100 shown in FIG. 5. However, in the semiconductor device 100 shown in FIG. 5, the dummy trench portions 30 and the interlayer dielectric film 38 of FIG. 9A are not provided. Furthermore, the emitter electrode 52 in FIG. 9A corresponds to the top-surface-side electrode 53 in FIG. 5.

The collector electrode 24 is provided on the bottom surface 23 of the semiconductor substrate 10. The emitter electrode 52 and the collector electrode 24 are formed of a conductive material such as metal.

The semiconductor substrate 10 may be a silicon substrate, a silicon carbide substrate, or a nitride semiconductor substrate such as a gallium nitride substrate. The semiconductor substrate 10 of the present example is a silicon substrate.

The semiconductor substrate 10 includes the drift region 18 of a first conductivity type. The drift region 18 of the present example is N− type. The drift region 18 may be a remaining region in the semiconductor substrate 10 where no other doping region is provided.

One or more gate trench portions 40 and one or more dummy trench portions 30 are provided on the top surface 21 of the semiconductor substrate 10. Each trench portion is provided from the top surface 21, penetrates through the base region 17, and reaches the drift region 18.

The gate trench portion 40 includes a gate trench provided in the top surface 21, as well as a gate dielectric 42 and a gate conducting portion 44 provided within the gate trench. The gate dielectric 42 is provided covering an inner wall of the gate trench. The gate dielectric 42 may be formed by oxidizing or nitriding the semiconductor of the inner wall of the gate trench. The gate conducting portion 44 is provided farther inward than the gate dielectric 42 inside the gate trench. In other words, the gate dielectric 42 insulates the gate conducting portion 44 and the semiconductor substrate 10 from each other. The gate conducting portion 44 is formed of a conductive material such as polysilicon.

The gate conducting portion 44 is provided surrounded by the gate dielectric 42, inside the gate trench portion 40. The gate conducting portion 44 includes a region that, in the depth direction, sandwiches the gate dielectric 42 and is opposite at least the adjacent base region 17. The gate trench portion 40 in this cross section is covered by the interlayer dielectric film 38 on the top surface 21. When a prescribed voltage is applied to the gate conducting portion 44, a channel is formed by the electron inversion layer in the surface layer of the interface surface where the base region 17 contacts the gate trench.

The dummy trench portion 30 may have the same structure as the gate trench portion 40, in this cross section. The dummy trench portion 30 includes a dummy trench provided on the top surface 21 side, as well as a dummy dielectric 32 and a dummy conducting portion 34 provided inside the dummy trench. The top end of the dummy trench may be at the same position as the top surface 21 in the Z-axis direction. The dummy dielectric 32 is provided covering the inner wall of the dummy trench. The dummy conducting portion 34 is provided surrounded by the dummy dielectric 32, inside the dummy trench portion 30. The dummy dielectric 32 insulates the dummy conducting portion 34 and the semiconductor substrate 10 from each other.

The dummy conducting portion 34 may be formed of the same material as the gate conducting portion 44. For example, the dummy conducting portion 34 is formed of a conductive material such as polysilicon. The dummy conducting portion 34 may have the same length as the gate conducting portion 44 in the depth direction. The floor portions of the dummy trench portion 30 and the gate trench portion 40 may be curved surfaces (curved shapes in the cross section) that bulge downward.

In the first mesa portion 60, the accumulation region 16 is provide in contact with the gate trench portion 40, above the drift region 18. In a case where a plurality of accumulation regions 16 are provided, the respective accumulation regions 16 are arranged along the Z-axis direction. The accumulation region 16 is N+ type, for example. The doping concentration of the accumulation region 16 is higher than the doping concentration of the drift region 18, and the dopant is accumulated in the accumulation region 16 with a higher concentration than in the drift region 18. By providing the accumulation region 16, it is possible to increase the carrier implantation enhancement effect (IE effect) and reduce the ON voltage.

In the first mesa portion 60, the accumulation region 16 may be in contact with the dummy trench portion 30 or separated from the dummy trench portion 30. FIG. 9A shows an example in which the accumulation region 16 is provided in contact with the dummy trench portion 30.

In the first mesa portion 60, the base region 17 of a second conductivity type is provided in contact with the gate trench portion 40, above the accumulation region 16. The base region 17 is N− type, for example. In the first mesa portion 60, the base region 17 may be provided in contact with the dummy trench portion 30.

In the second mesa portion 62 of the interface portion 90, the base region 17 of a second conductivity type is provided in contact with the dummy trench portion 30, above the drift region 18. In the third mesa portion 64 of the diode portion 80, the anode region 14 of a second conductivity type is provided in contact with the dummy trench portion 30, above the drift region 18. The anode region 14 is provided in contact with the top surface 21.

In the first mesa portion 60, the emitter region 12 is provided in contact with the top surface 21 and in contact with the gate trench portion 40, in the d-d' cross section. The doping concentration of the emitter region 12 is higher than the doping concentration of the drift region 18. In the first mesa portion 60, the contact region 15 is provided in contact with the top surface 21 and in contact with the gate trench portion 40, on the positive and negative X-direction sides in this d-d' cross section.

In the second mesa portion 62, the contact region 15 is provided in contact with the dummy trench portion 30 on the top surface 21. The contact region 15 may be in contact with the dummy trench portion 30 or separated from the dummy trench portion 30. FIG. 9A shows an example in which the contact region 15 is provided in contact with the dummy trench portion 30.

In the transistor portion 70, the collector region 22 of a second conductivity type is provided below the drift region 18. The collector region 22 of the present example is P+ type, for example. The collector region 22 is provided in contact with the bottom surface 23. In the diode portion 80, the cathode region 82 of a first conductivity type, with a higher doping concentration than the drift region 18, is provided below the drift region 18. The cathode region 82 of the present example is N+ type, for example. The cathode region 82 is provided in contact with the bottom surface 23.

In the semiconductor device 200 of the present example, the semiconductor substrate 10 may include the buffer region 20 of a first conductivity type, with a higher doping concentration than the drift region 18, between the drift region 18 and the bottom surface 23 of the semiconductor substrate 10. The buffer region 20 is provided to include a first position Ps'. The buffer region of the present example is N+ type, for example. In the present example, the buffer region 20 is provided in contact with the drift region 18.

In the semiconductor device 200 of the present example, a region including hydrogen is provided inside the semiconductor substrate 10. In the semiconductor device 200 of the present example, the hydrogen concentration distribution in the depth direction of the semiconductor substrate 10 has a concentration distribution peak at a first position Ps, which is a predetermined distance Dps in the depth direction of the semiconductor substrate 10 away from one main surface of the semiconductor substrate 10, i.e. the top surface 21.

In FIG. 9A, the hydrogen concentration distribution peak at the first position Ps is indicated by the symbol (marker) "x". The first position Ps is arranged farther on the top surface 21 side than where ½ the thickness of the semiconductor substrate 10 is located. The semiconductor substrate 10 is provided with the high concentration region 26, as a region including the hydrogen implanted to the first position Ps. The high concentration region 26 is provided in the same range as the crystalline defect region 19-1 shown in FIG. 8A, in the XY-plane. In other words, in the XY plane, the high concentration region 26 is provided in the entire diode portion 80 and at least a region of the transistor portion 70 that does not overlap with the gate trench portion 40.

In the semiconductor device 200 of the present example, the hydrogen concentration distribution has peaks at a plurality of positions in the buffer region 20. Specifically, there are concentration distribution peaks at four locations that are a position Pb4, a position Pb3, a position Pb2, and a position Pb1, in order from the top surface side toward the bottom surface side of the buffer region 20. In FIG. 9A, the peaks of the hydrogen concentration distribution at the plurality of positions in the Z-axis direction are indicated by the symbol (marker) "x".

The buffer region 20 of the present example may be a region formed by annealing the hydrogen that has been implanted through the bottom surface 23 into the semiconductor substrate 10 at the position Pb4, the position Pb3, the position Pb2, and the position Pb1. By annealing the semiconductor substrate 10 into which the hydrogen has been implanted, the hydrogen is activated as a donor, and the buffer region 20 with the higher doping concentration than the drift region 18 is formed. The formation of the buffer region 20 is described further below.

The first position Ps may be the doping concentration peak position of the high concentration region 26 after the annealing of the semiconductor substrate 10 into which the hydrogen has been implanted. After the annealing, the doping concentration at the first position Ps may be greater than or equal to $1 \times 10^{14}$ (/cm$^3$) and less than or equal to $1 \times 10^{15}$ (/cm$^3$).

In the semiconductor device 200 of the present example, the buffer region 20 has a higher doping concentration than the drift region 18. Therefore, the buffer region 20 can function as a field stop region that prevents the depletion layer, which spreads from the bottom surface side of the anode region 14 and the base region 17, from reaching the cathode region 82 and the collector region 22.

The semiconductor device 200 of the present example is provided with the crystalline defect regions 19-1 and 19-2. As shown in FIG. 8A, the crystalline defect region 19-1 is provided in the entire diode portion 80 and at least a portion of the region of the transistor portion 70 that does not overlap with the gate trench portion 40. The crystalline defect region 19-2 may be provided in the entire diode portion 80 and the entire transistor portion 70, in the XY-plane.

Figure 9B:
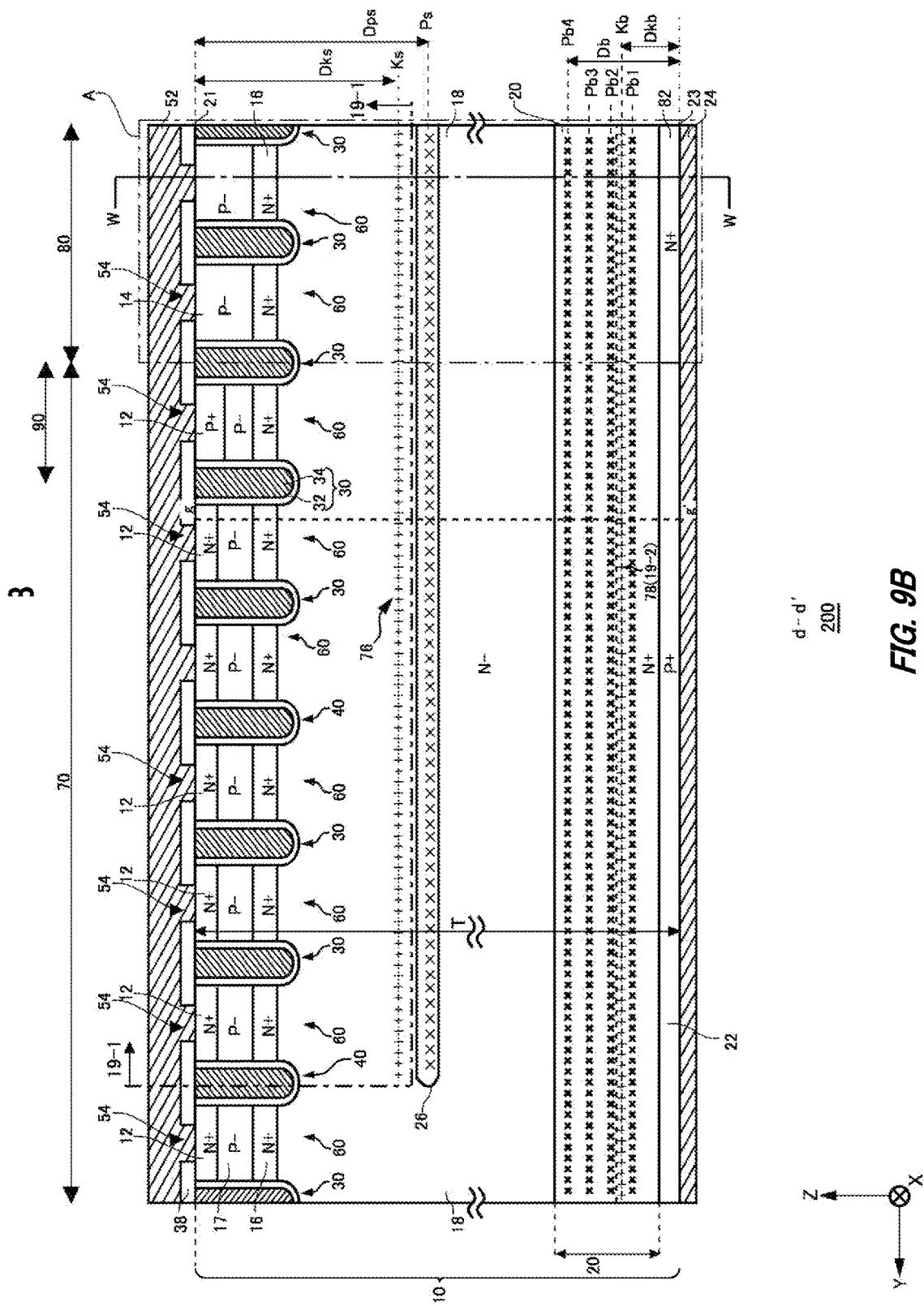
FIG. 9B shows an example of the d-d' cross section in FIG. 8B.

FIG. 9B shows an example of the d-d' cross section in FIG. 8B. The semiconductor device 200 of the present example differs from the semiconductor device 200 shown in FIG. 9A in terms of the range in which the crystalline defect region 19-1 and the high concentration region 26 are provided in the XY-plan. The other structures are the same as in the example shown in FIG. 9A.

In the present embodiment, the crystalline defect region 19-1 and the high concentration region 26 are provided in the entire diode portion 80 and a portion of the transistor portion 70, in the XY plane. In the transistor portion 70, the crystalline defect region 19-1 and the high concentration region 26 are provided in a region that is in contact with the diode portion 80 and overlaps with one or more gate trench portions 40.

Figure 9C:
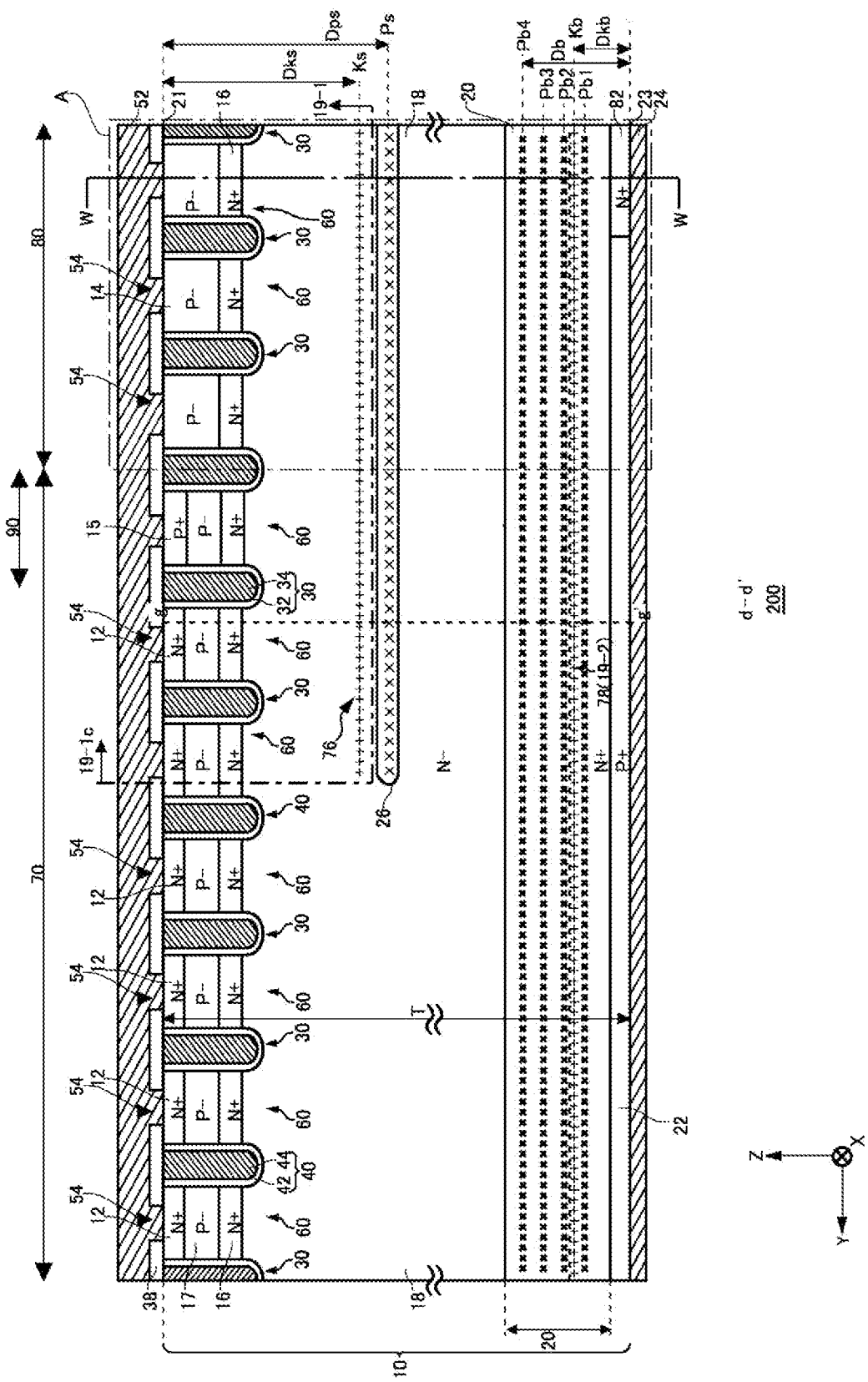
FIG. 9C shows an example of the d-d' cross section in FIG. 8C.

FIG. 9C shows an example of the d-d' cross section in FIG. 8B. The semiconductor device 200 of the present example differs from the semiconductor device 200 shown in FIG. 9A in terms of the range in which the crystalline defect region 19-1c and the high concentration region 26 are provided in the XY-plan, and in terms of the interface position between the collector region 22 and the cathode region 82. The other structures are the same as in the example shown in FIG. 9A.

Figure 10A:
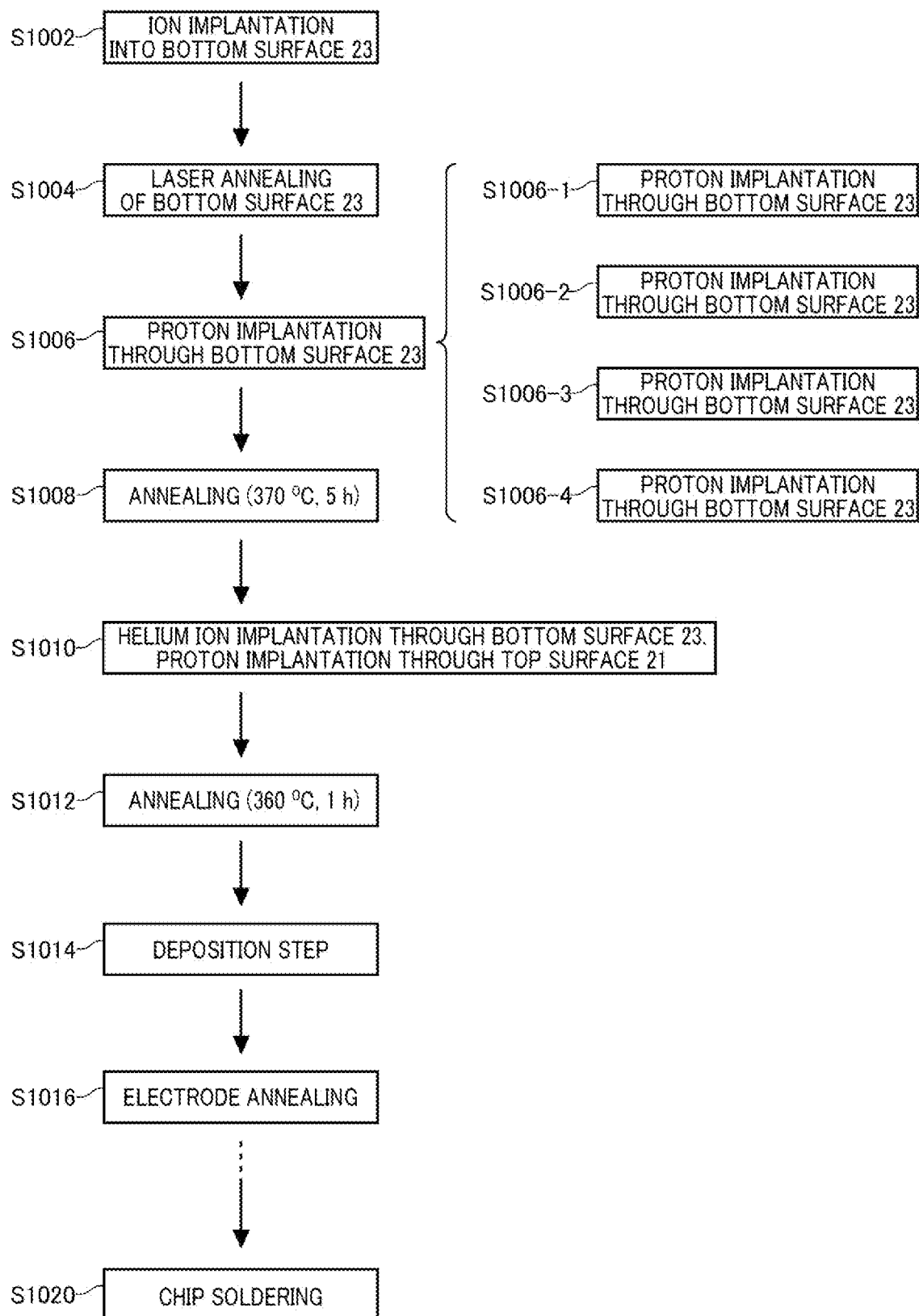
FIG. 10A shows an example of an outline of a semiconductor device manufacturing method according to the present embodiment.

FIG. 10A shows an example of an outline of a semiconductor device manufacturing method according to the present embodiment. In the present example, the crystalline defect region 19-1 on the top surface 21 side is formed by implanting hydrogen ions (protons in the present example) and the crystalline defect region 19-2 on the bottom surface 23 side is formed by implanting helium ions. As shown in FIG. 10A, in the semiconductor device manufacturing method, before the proton implantation in step S1006 and onward, the ion implantation into the bottom surface 23 in step S1002 and laser annealing of the bottom surface 23 in step S1004 are performed, for example.

The ions implanted into the bottom surface 23 in step S1002 are B (boron) and P (phosphorus), for example. In step S1002, using boron and phosphorus as an example, these elements are implanted respectively into the region to be P type and the region to be N type in the bottom surface 23.

In step S1004, laser annealing is performed on the boron and phosphorus implanted in step S1002. Due to step S1004, the collector region 22 is formed in the region where boron was implanted and the cathode region 82 is formed in the region where phosphorus was implanted.

Next, in step S1006, protons are implanted through the bottom surface 23. The proton implantation of step S1006 is performed a plurality of times, as shown by step S1006-1, step S1006-2, step S1006-3, and step S1006-4. The present example shows an example in which proton implantation is performed four times in step S1006. In step S1006, protons are implanted into the region where the buffer region 20 is to be formed.

In step S1008, the semiconductor substrate 10 into which the protons have been implanted is annealed at a second temperature. In the present example, the second temperature may be greater than or equal to 330° C. and less than or equal to 450° C., and may be 370° C. for example. Furthermore, the second temperature may be greater than or equal to 350° C. and less than or equal to 420° C. or may be greater than or equal to 370° C. and less than or equal to 400° C. The annealing time in step S1008 may be greater than or equal to 30 minutes and less than or equal to 10 hours, and is 5 hours in the present example. Furthermore, the annealing time in step S1008 may be greater than or equal to 1 hour and less than or equal to 7 hours.

Next, in step S1010, helium ions are implanted through the bottom surface 23. Furthermore, protons are implanted through the top surface 21. The helium ions are implanted to a depth at which the defect density peak of the crystalline defect region 19-2 is to be formed. The protons are implanted to a position deeper than the region in which the defect density peak of the crystalline defect region 19-1 is to be formed. The protons may be implanted to a depth at which the high concentration region 26 is to be formed. Either the helium ion implantation or the proton implantation may be performed first.

In step S1012, the semiconductor substrate 10 into which the protons and helium ions have been implanted is annealed at a first temperature. The first temperature is lower than the second temperature. In the present example, the first temperature may be 360° C.

The first temperature in step S1012 may be a temperature that causes the hydrogen to terminate the dangling bonds included in the vacancies and double vacancies, at and near (e.g. the FW1% region) the peak position Ps of the hydrogen ions implanted in step S1010. The first temperature may be greater than or equal to 300° C. and less than or equal to 420° C., for example, and is 360° C. in the present example. Furthermore, the first temperature may be greater than or equal to 330° C. and less than or equal to 400° C. or may be greater than or equal to 350° C. and less than or equal to 380° C. Yet further, the first temperature may be less than 370° C., or may be less than or equal to 360° C.

The annealing time in step 1012 may be shorter than the annealing time in step S1008. The annealing time in step S1012 may be greater than or equal to 30 minutes and less than or equal to 8 hours, and is 1 hour in the present example. Furthermore, the annealing time in step S1012 may be greater than or equal to 1 hour and less than or equal to 5 hours. By causing at least one of the annealing temperature and the annealing time in step S1012 to be less than the annealing temperature or the annealing time in step S1008, it becomes easy for the crystalline defects generated by implanting the protons and helium ions to remain. With such a process, it is possible to form the semiconductor device such as shown in FIG. 7B.

Furthermore, after step S1012, a step (not shown in the drawing) of forming an electrode on the bottom surface 23 may be performed. This electrode formation step includes one or more steps of depositing a metal film. After this metal film deposition step, an electrode annealing step may be performed. The temperature in the electrode annealing step is lower than the first temperature. For example, the temperature in the electrode annealing step may be greater than or equal to 140° C. and less than or equal to 330° C. The temperature in the electrode annealing step may be greater than or equal to 220° C.

There are cases where the semiconductor device is soldered to a circuit board such as a DCB (Direct Copper Bond) substrate after the semiconductor substrate is formed into chips by dicing. The soldering temperature at this time is a third temperature. The first temperature of the annealing in step S1012 is higher than the third temperature during the soldering. For example, the soldering temperature may be greater than or equal to 280° C. and less than or equal to 400 C. As long as the third temperature is lower than the first temperature, the third temperature may be lower than, equal to, or higher than the temperature in the electrode annealing step.

The soldering time may be greater than or equal to 100 seconds and less than or equal to 500 seconds. The annealing time in step S1012 may be longer than the soldering time.

Due to such conditions, it is possible to terminate the crystalline defects with the hydrogen during the soldering. The annealing time in step S1012 may be greater than or equal to 10 minutes or may be greater than or equal to 30 minutes. This annealing time may be less than or equal to 2 hours or less than or equal to 1 hour. Based on the above, with the second temperature being T2, the first temperature being T1, and the third temperature being T3, it is preferable that T2>T1>T3.

Figure 10B:
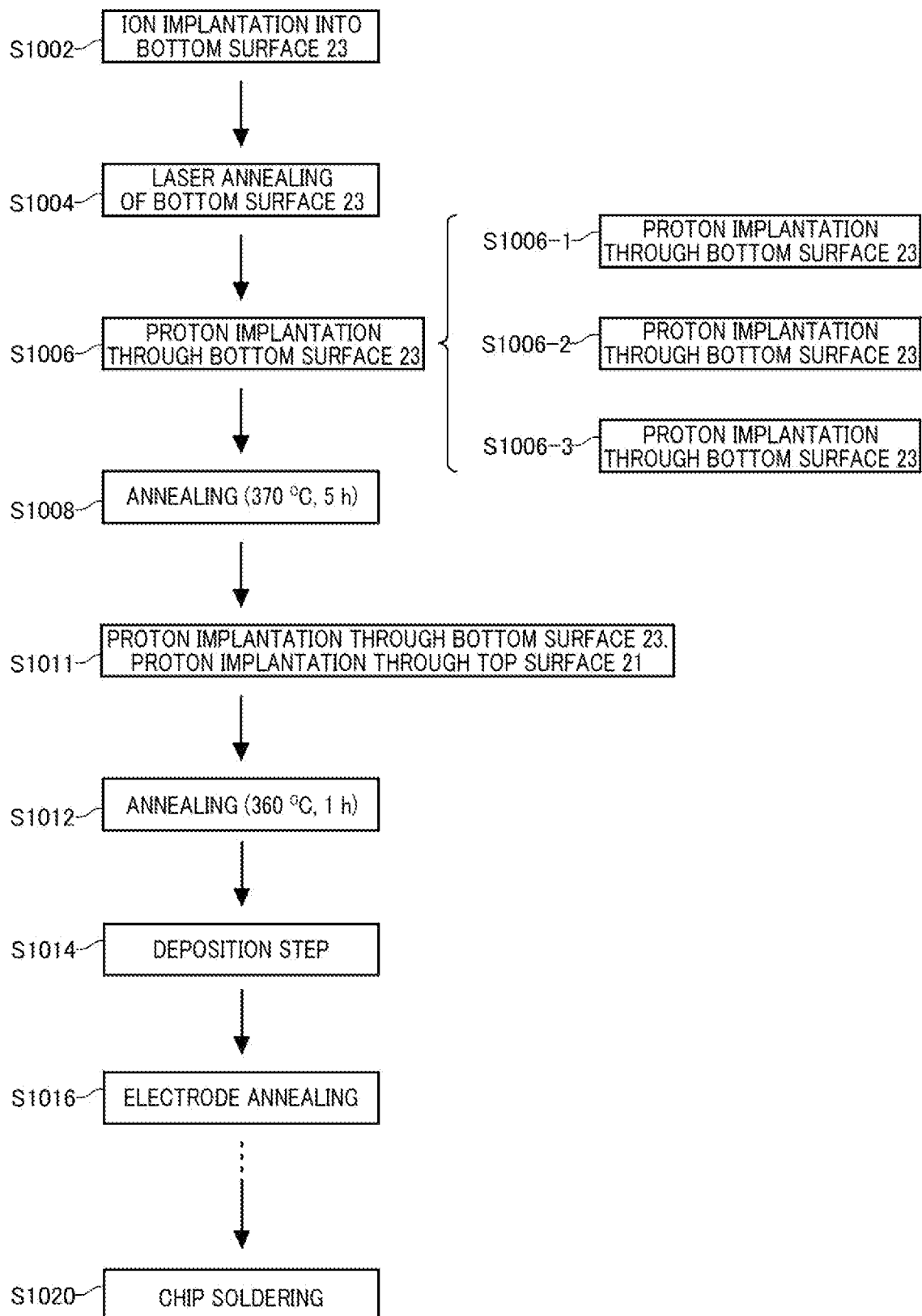
FIG. 10B shows another example of the semiconductor device manufacturing method.

FIG. 10B shows another example of the semiconductor device manufacturing method. In the present example, the crystalline defect region 19-1 on the top surface 21 side and the crystalline defect region 19-2 on the bottom surface 23 side are formed by proton implantation. Step S1002 and step S1004 of the present example are the same as S1002 and S1004 shown in FIG. 10A.

In step S1006, protons are implanted through the bottom surface 23. The proton implantation of step S1006 may be performed a plurality of times, as shown by step S1006-1, step S1006-2, and step S1006-3. In step S1006, the protons are implanted to the positions of all but one of the plurality of hydrogen peaks to be formed in the buffer region 20. The present example shows an example in which the proton implantation is performed three times in step S1006.

In step S1008, the semiconductor substrate 10 into which the protons have been implanted is annealed at a second temperature. In the present example, the second temperature may be 370° C. The annealing time may be 5 hours.

Next, at step S1011, the protons are implanted through the top surface 21 and the bottom surface 23. The protons implanted through the bottom surface 23 are implanted to the position of the hydrogen peak where protons were not implanted in step S1006, among the plurality hydrogen peaks to be formed in the buffer region 20. The protons implanted through the top surface 21 are implanted to a position deeper than the region where the defect density peak of the crystalline defect region 19-1 is to be formed. Either the proton implantation through the top surface 21 or the proton implantation through the bottom surface 23 may be performed first.

In step S1012, the semiconductor substrate 10 into which the protons and helium ions have been implanted is annealed at the first temperature. Step S1012 is the same as step S1012 shown in FIG. 10A. The semiconductor device such as shown in FIG. 7A can be formed by such a process.

Figure 11:
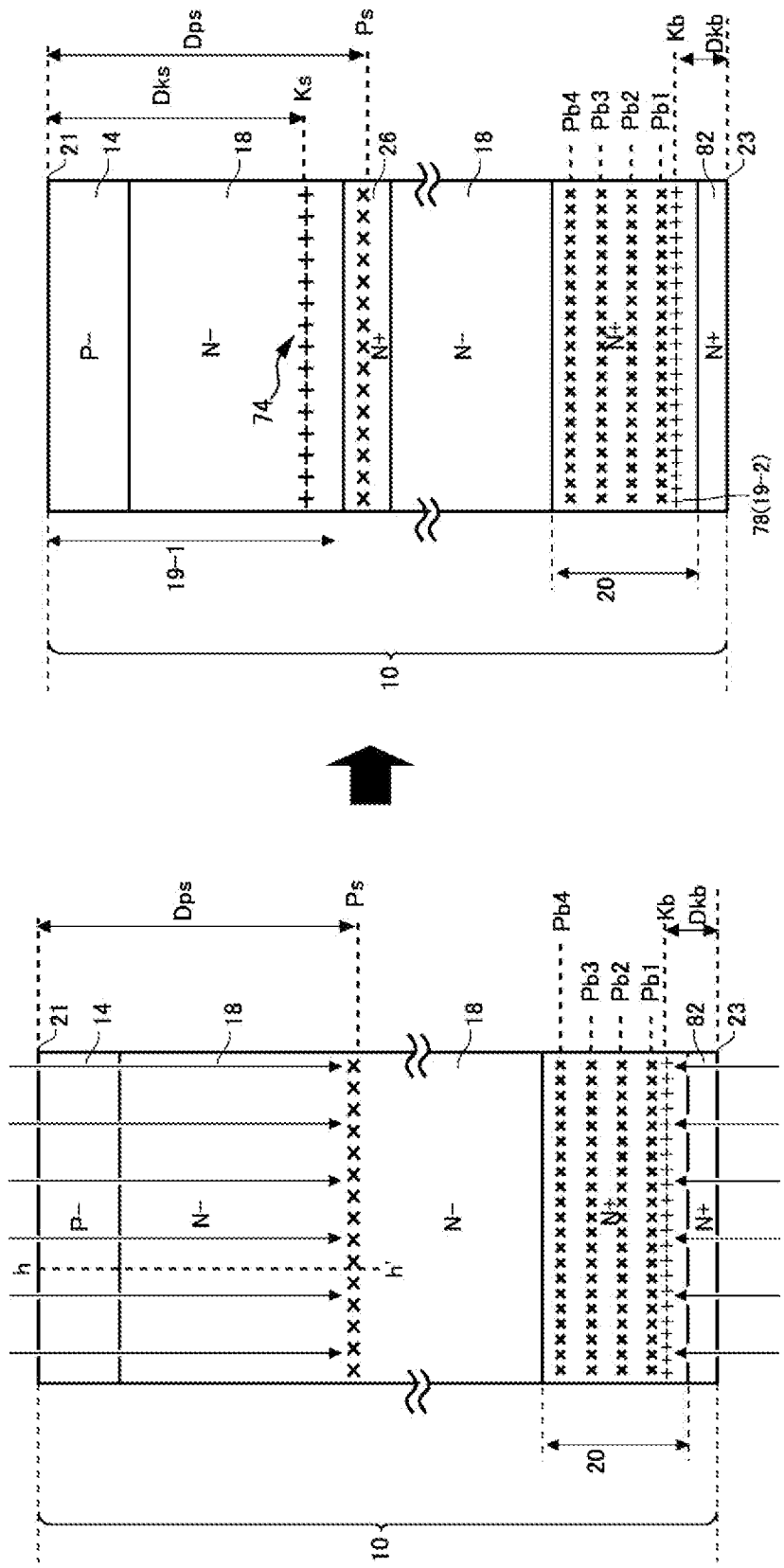
FIG. 11 shows another example of the semiconductor device manufacturing method according to the present embodiment.

FIG. 11 shows another example of the semiconductor device manufacturing method according to the present embodiment. FIG. 11 shows the details of step S1010 and step S1012 shown in FIG. 10A. As shown in FIG. 11, in step S1010, the protons are implanted in the depth direction of the semiconductor substrate 10, through one main surface of the semiconductor substrate 10, i.e. the top surface 21. In the present example, the protons are implanted in the depth direction of the semiconductor substrate 10 to the depth of the first position Ps that is the distance Dps away from the top surface 21. In FIG. 11, the protons implanted to the depth of the first position Ps are indicated by "x". In step S1010, the proton implantation amount may be greater than or equal to $1 \times 10^{12}$ (/cm$^2$) and less than or equal to $1 \times 10^{13}$ (/cm$^2$).

Due to the proton implantation from the top surface 21, crystalline defects are generated from the top surface 21 of the semiconductor substrate 10 to the first position Ps. Furthermore, due to the proton implantation from the top surface 21, the hydrogen concentration forms a distribution in the depth direction of the semiconductor substrate 10 with the first position Ps as a peak. Yet further, in step S1010, the helium ions are implanted in the depth direction of the semiconductor substrate 10 from the bottom surface 23. In the present example, the helium ions are implanted to the position Kb.

Next, in step S1012, the semiconductor substrate 10 into which the protons and helium ions have been implanted is annealed at the first temperature. The first temperature may be 360° C. The annealing time may be 1 hour. Due to step S1012, the crystalline defects generated by the implantation of the protons and helium ions are terminated by the hydrogen. In this way, the crystalline defect density peaks are formed at the position Ks and the position Kb. Furthermore, due to this annealing, the hydrogen implanted to the first position Ps is activated as a donor.

The semiconductor device of the present example uses, as the top-surface-side lifetime control region 74, the crystalline defect region 19-1 which ranges in the depth direction of the semiconductor device with the position Ks as the concentration distribution peak. Furthermore, the semiconductor device of the present example uses, as the high concentration region 26, the region that includes the first position Ps and in which the hydrogen has been activated as a donor.

Figure 12:
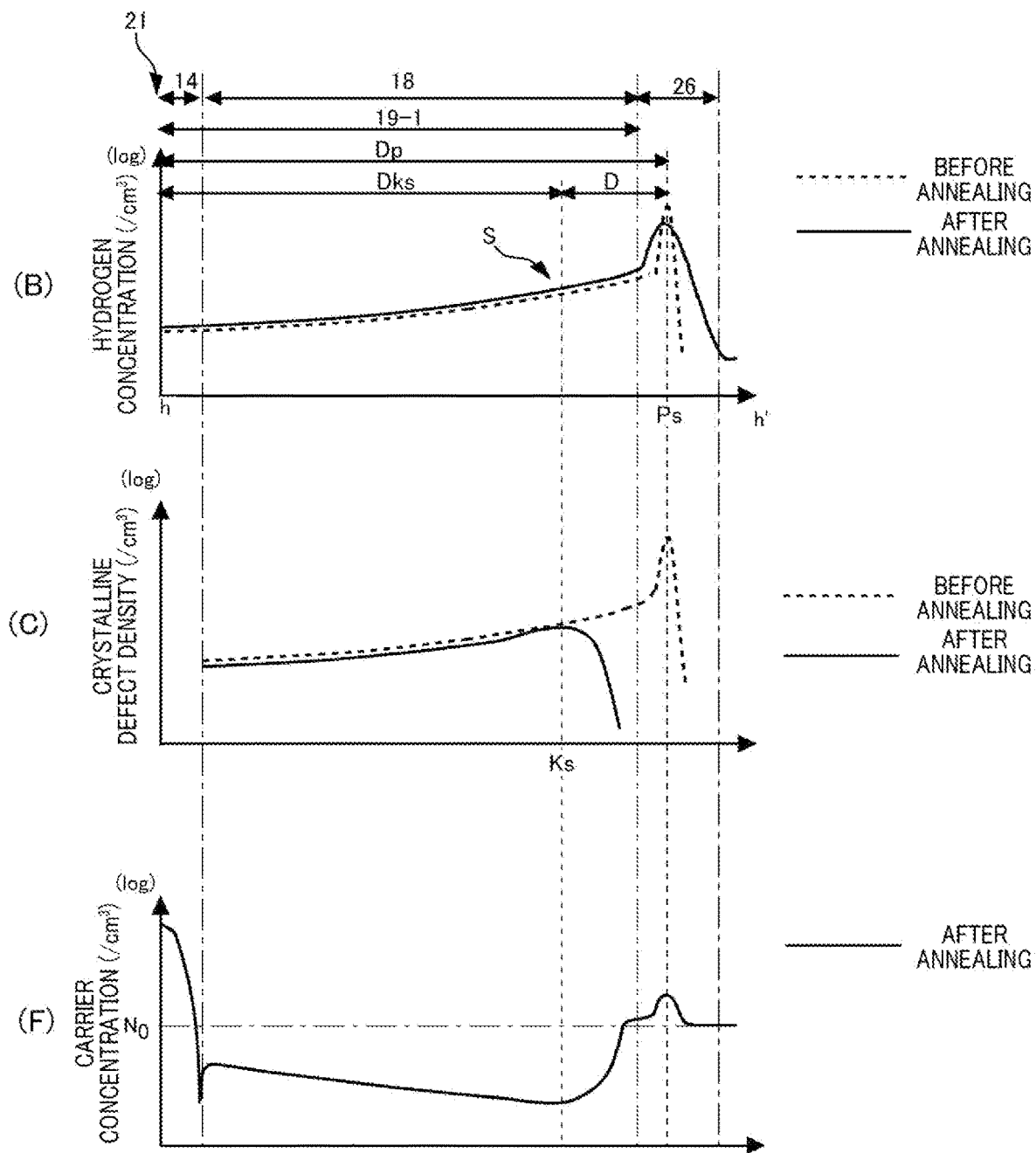
FIG. 12 shows distributions of each of the hydrogen concentration (B), the crystalline defect density (C), and the carrier concentration (F), along the h-h' line in FIG. 11.

FIG. 12 shows distributions of each of the hydrogen concentration (B), the crystalline defect density (C), and the carrier concentration (F), along the h-h' line in FIG. 11. In FIG. 12, the distributions before the annealing in step S1010 of FIG. 11 are indicated by dashed lines, and the distributions after the annealing in step S1012 are shown by solid lines.

As shown by the distribution drawing (B), the hydrogen concentration is distributed with the first position Ps as the peak, before the annealing. By diffusing the hydrogen with the annealing, the hydrogen concentration distribution spreads in the Z-axis direction. The hydrogen concentration distribution after the annealing has a concentration distribution tail S farther on the top surface 21 side than where the first position Ps is located. The hydrogen concentration has a distribution that is gentler on the top surface 21 side of the first position Ps than on the bottom surface 23 side of the first position Ps.

As shown in the distribution drawing (C), the crystalline defect density distribution before the annealing has a shape similar to that of the hydrogen concentration distribution before the annealing. For example, the peak position of the crystalline defect density before the annealing is the same as the peak position Ps of the hydrogen concentration before the annealing. By annealing the semiconductor substrate 10, the hydrogen diffuses in the Z-axis direction and terminates the dangling bonds. As described above, a large amount of hydrogen is present in the vicinity of the hydrogen concentration peak, and therefore almost all of the crystalline defects in the vicinity of the peak position Ps are terminated.

The distribution drawing (F) shows the carrier concentration distribution after the annealing. The distribution drawing (F) is the same as a portion of the distribution drawing (F) in FIG. 7. As shown by the distribution drawings (B) and (C), the by implanting the hydrogen ions from the top surface 21 side and performing annealing, the high concentration region 26 and the crystalline defect region 19-1, which is farther on the top surface 21 side than where the high concentration region 26 is located, are formed.

Figure 13:
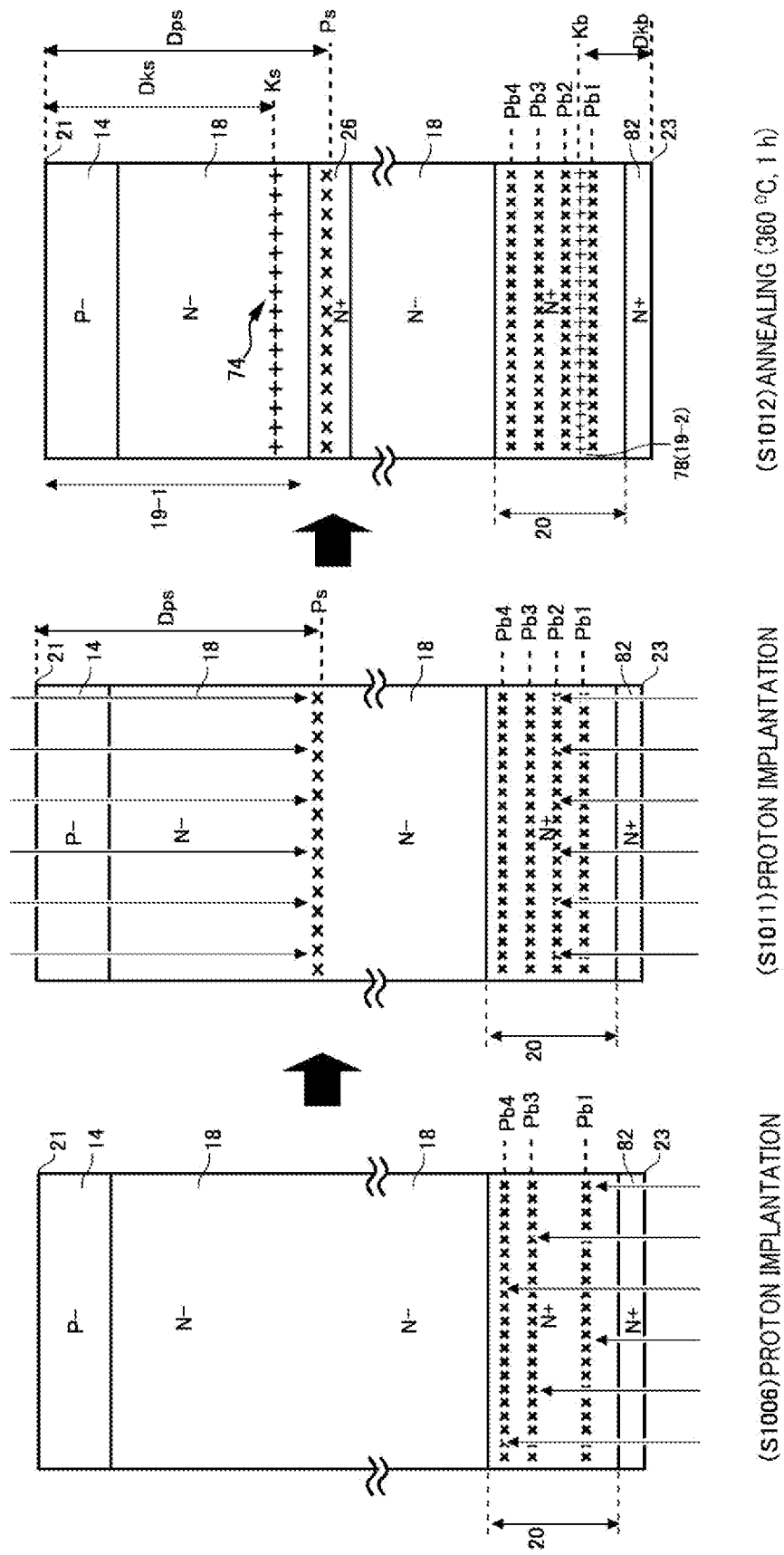
FIG. 13 shows another example of the semiconductor device manufacturing method according to the present embodiment.

FIG. 13 shows another example of the semiconductor device manufacturing method according to the present embodiment. FIG. 13 shows the details of step S1006, step S1008, step S1011, and step S1012 shown in FIG. 10B.

As shown in FIG. 13, the semiconductor device manufacturing method of the present example includes the step of implanting protons a plurality of times, such that the positions of the hydrogen concentration distribution peaks in the depth direction of the semiconductor substrate 10 are different. Specifically, in step S1006, the protons are implanted in the depth direction of the semiconductor substrate 10 through the other main surface of the semiconductor substrate 10, i.e. the bottom surface 23. In step S1006, the protons are implanted to the positions of all but one of the plurality of hydrogen peaks to be formed in the buffer region 20. In the present example, in step S1006, the protons are implanted in order to the positions Pb4, Pb3, and Pb1. After the proton implantation of step S1006, the semiconductor substrate 10 is annealed in step S1008. As an example, the annealing temperature is 370° C. and the annealing time is 5 hours.

Next, in step S1011, protons are implanted through the bottom surface 23 to the position Pb2. Furthermore, protons are implanted through the top surface 21 to the position Ps.

Next, in step S1012, the semiconductor substrate 10 is annealed. As an example, the annealing temperature is 360° C. and the annealing temperature is 1 hour. Due to step S1012, the crystalline defect region 19-1, the crystalline defect region 19-2, and the high concentration region 26 are formed.

Figure 14:
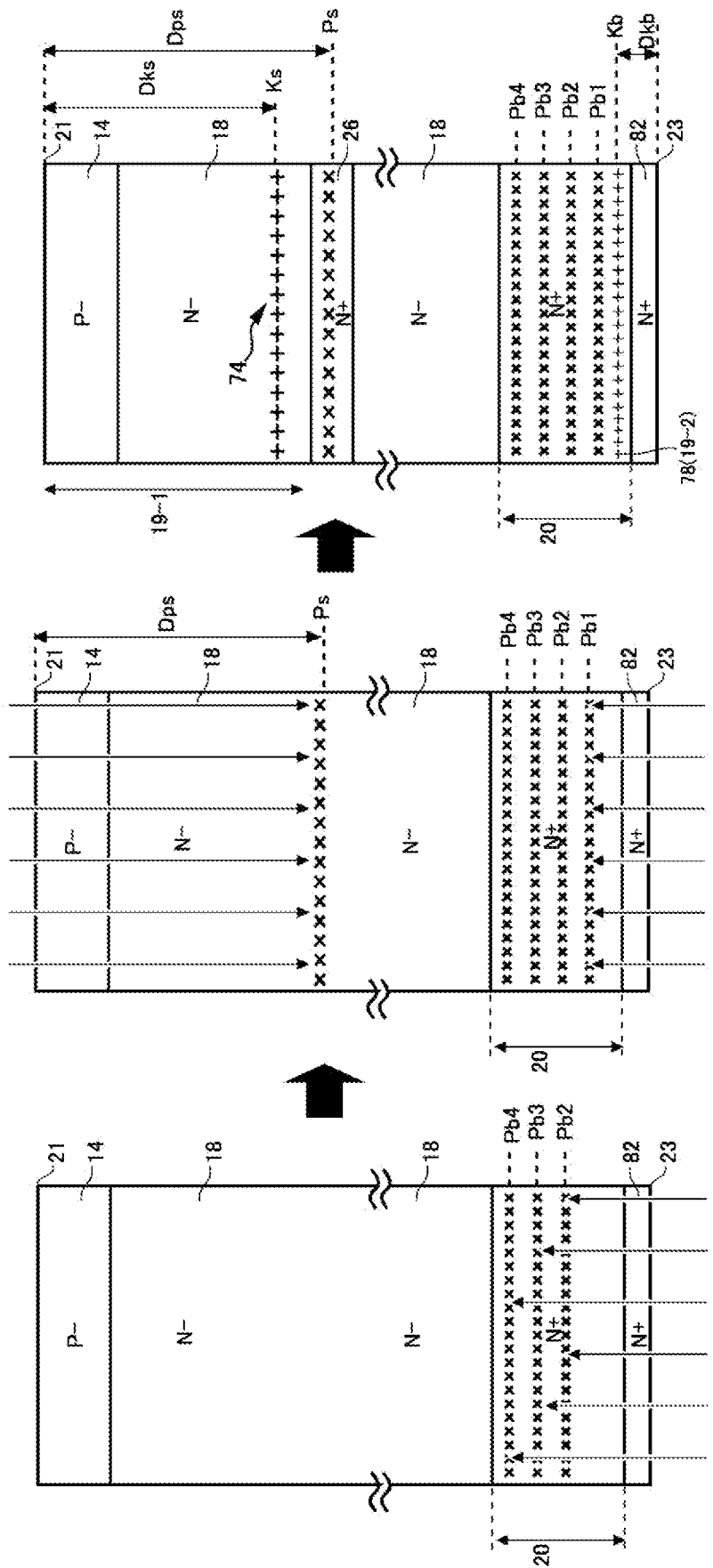
FIG. 14 shows another example of the semiconductor device manufacturing method according to the present embodiment.

FIG. 14 shows another example of the semiconductor device manufacturing method according to the present embodiment. The semiconductor device manufacturing method shown in FIG. 14 differs from the semiconductor device manufacturing method shown in FIG. 13 in that the protons are implanted to the position Pb2 instead of the position Pb1, as in step S1006 shown in FIG. 13, and also in that the protons are implanted to the position Pb1 in step S1011. In the present example, the peak position Kb of the crystalline defect density of the crystalline defect region 19-2 is arranged farther on the bottom surface 23 side than where the position Pb1 is located. In this way, by adjusting the positions of the proton implantations in step S1006 and step S1011, it is possible to adjust the peak position Kb of the crystalline defect density.

Figure 15:
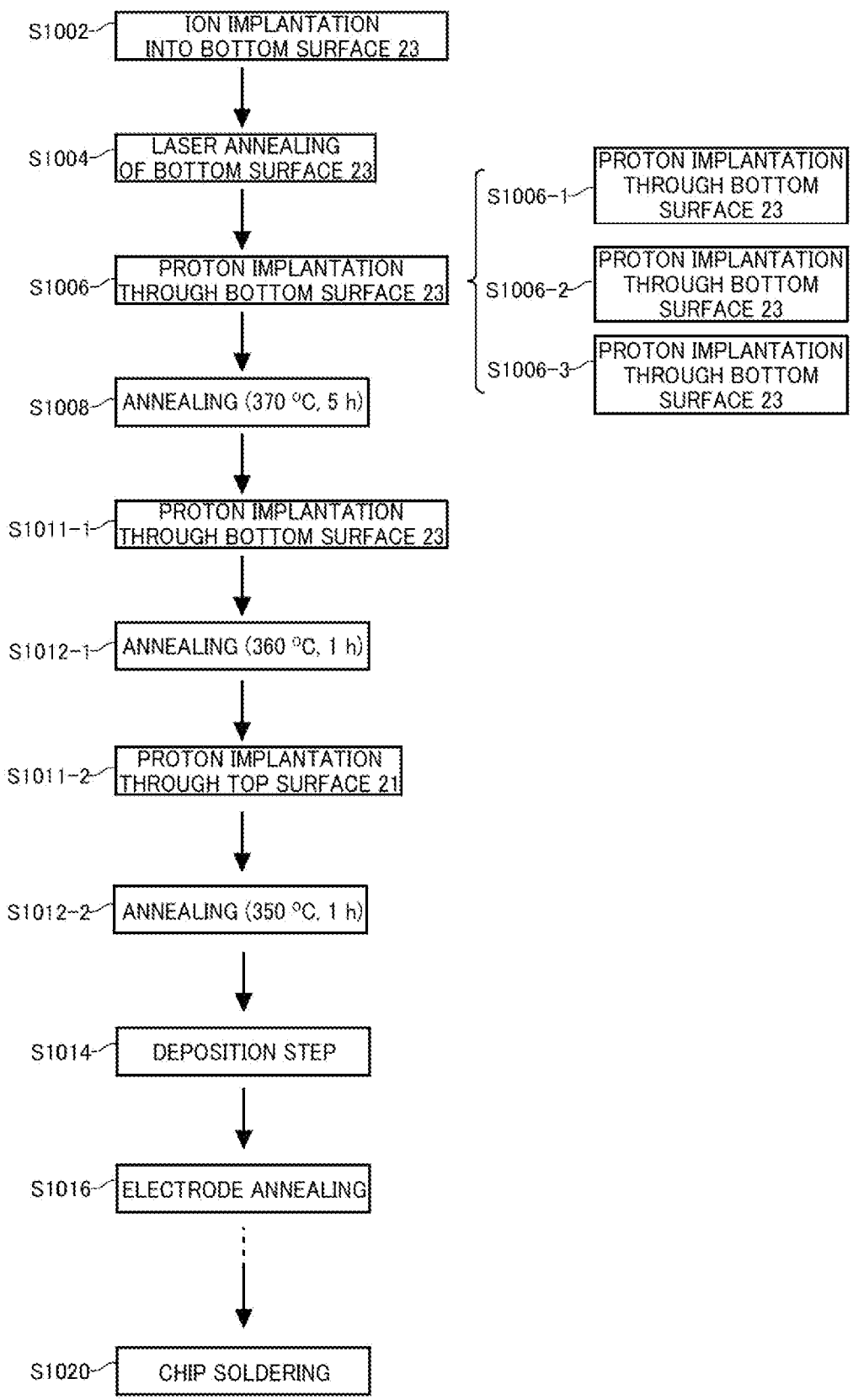
FIG. 15 shows another example of an outline of the semiconductor device manufacturing method according to the present embodiment.

FIG. 15 shows another example of an outline of the semiconductor device manufacturing method according to the present embodiment. The semiconductor device manufacturing method of the present example differs from the example of FIG. 10B in that an annealing step is included between the step of implanting the protons from the top surface 21 and the step of implanting the protons from the bottom surface 23 in step S1011 shown in FIG. 10B. Steps S1002 to S1008 are the same as in the example shown in FIG. 10B.

In step S1011-1 in the present example, the protons are implanted from the bottom surface 23. After step S1011-1, annealing is performed in step S1012-1. The annealing temperature in step S1012-1 is lower than the annealing temperature in step S1008. The annealing time in step S1012-1 may be shorter than the annealing time in step S1008. This annealing may be at 360° C. for 1 hour, for example.

Next, in step S1011-2, the protons are implanted through the top surface 21. After step S1011-2, annealing is performed in step S1012-2. The annealing temperature in step S1012-2 is lower than the annealing temperature in step S1012-1. It should be noted that the annealing temperature in step S1012-2 is preferably higher than the soldering temperature in the chip soldering process. Furthermore, the order of step S1011-1 and step S1011-2 may be switched.

Figure 16:
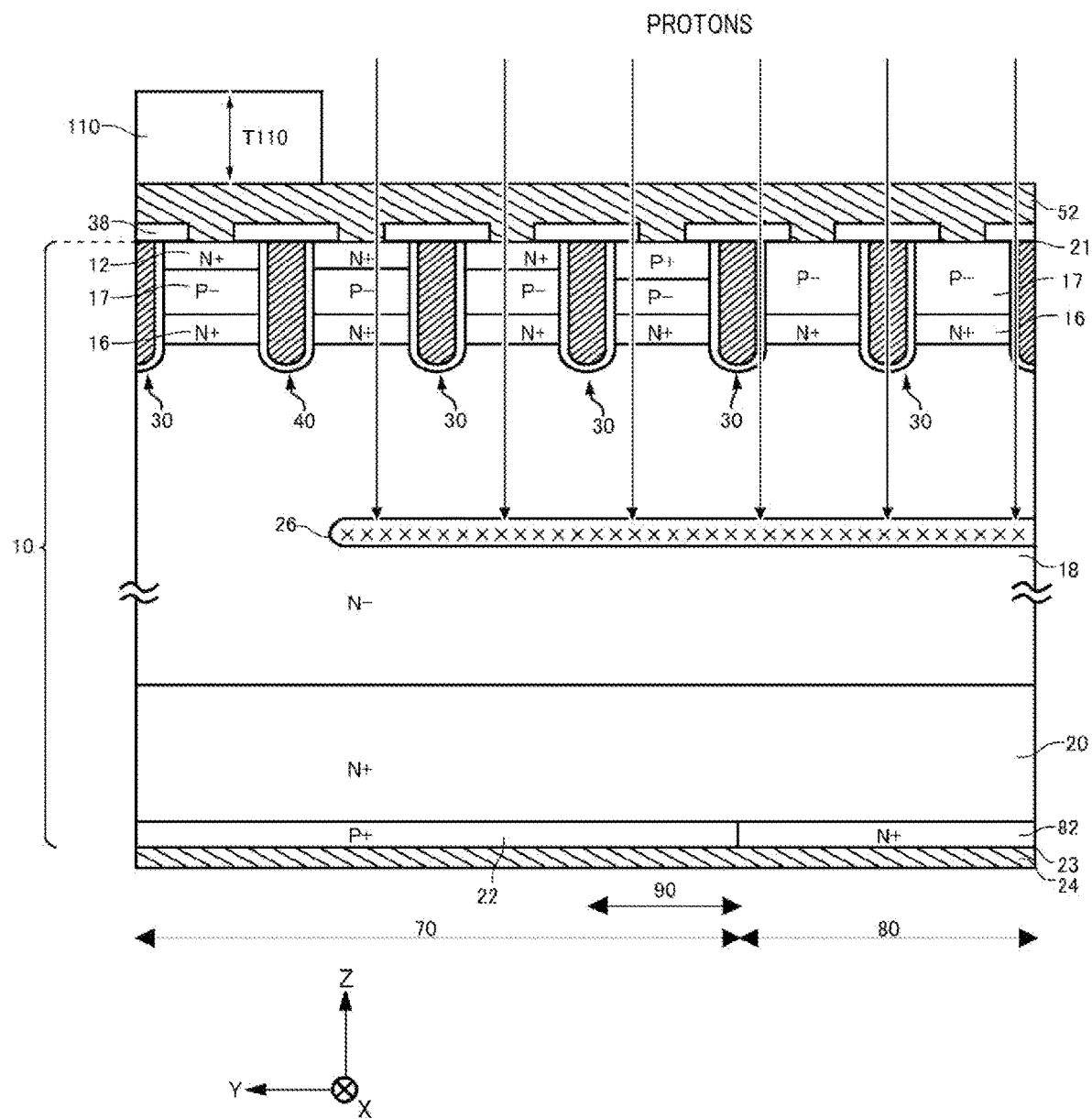
FIG. 16 is a diagram describing the step of forming the crystalline defect region 19 and the high concentration region 26 by implanting hydrogen ions (protons in the present example) from the top surface 21 side of the semiconductor substrate 10.

FIG. 16 is a diagram describing the step of forming the crystalline defect region 19 and the high concentration region 26 by implanting hydrogen ions (protons in the present example) from the top surface 21 side of the semiconductor substrate 10. The region into which protons are not to be implanted is covered by a mask 110 such as a photoresist. The mask 110 may be provided on the emitter electrode 52. The thickness T110 of the mask 110 is sufficiently greater than the depth (range) to which the protons are implanted into the semiconductor substrate 10. For example, in a case where the proton range is 8 µm, the thickness T110 is greater than or equal to 33 µm.

In the proton implantation step, the hydrogen ions may be implanted with an acceleration energy causing a range of 8 µm or more from the top surface 21 of the semiconductor substrate 10. In this way, it is possible to form the crystalline defect region 19 below the bottom end of each trench portion. The proton acceleration energy may be greater than or equal to 600 keV, greater than or equal to 1.0 MeV, or greater than or equal to 1.5 MeV. In this way, it is possible to make the range of the protons greater than or equal to 8 µm. In a case where the acceleration energy is 1.0 MeV, the proton range is approximately 16 µm, for example. In a case where the acceleration energy is 1.5 MeV, the proton range is approximately 30 µm, for example.

The proton acceleration energy may be greater than or equal to 5.0 MeV. In a case where the acceleration energy is 5.0 MeV, the proton range is approximately 215 µm, for example. In this case, the protons can be implanted to a deeper position. Furthermore, even when the protons are implanted from the bottom surface 23 side of the semiconductor substrate 10, the protons can be implanted to the vicinity of the bottom ends of the trench portions. Yet further, even before the process of thinning by grinding the bottom surface 23 of the semiconductor substrate 10, it is possible to implant the protons through the bottom surface 23 of the semiconductor substrate 10 and implant the protons to the vicinity of the bottom ends of the trench portions. After the proton implantation through the bottom surface 23 of the semiconductor substrate 10, the bottom surface 23 of the semiconductor substrate 10 may be ground.

The proton acceleration energy may be less than or equal to 11.0 MeV or less than or equal to 5.0 MeV. In this way, it is possible to restrict the implantation of protons to an excessively deep position. Furthermore, it is possible to restrict protons from penetrating through the semiconductor substrate 10. The proton acceleration energy may be less than or equal to 2.0 MeV. In a case where the acceleration energy is 2.0 MeV, the proton range is approximately 47 µm, for example.

The proton dose amount may be greater than or equal to $1.0 \times 10^{12}/cm^2$. In this way, the defects are formed with a sufficient density. Furthermore, the proton dose amount may be less than or equal to $1.0 \times 10^{15}/cm^2$. In this way, even when the protons are implanted from the top surface 21 in a range of 8 µm, for example, it is possible to restrict the effect that the crystalline defect density has on the anode region 14 or the base region 17.

Figure 17:
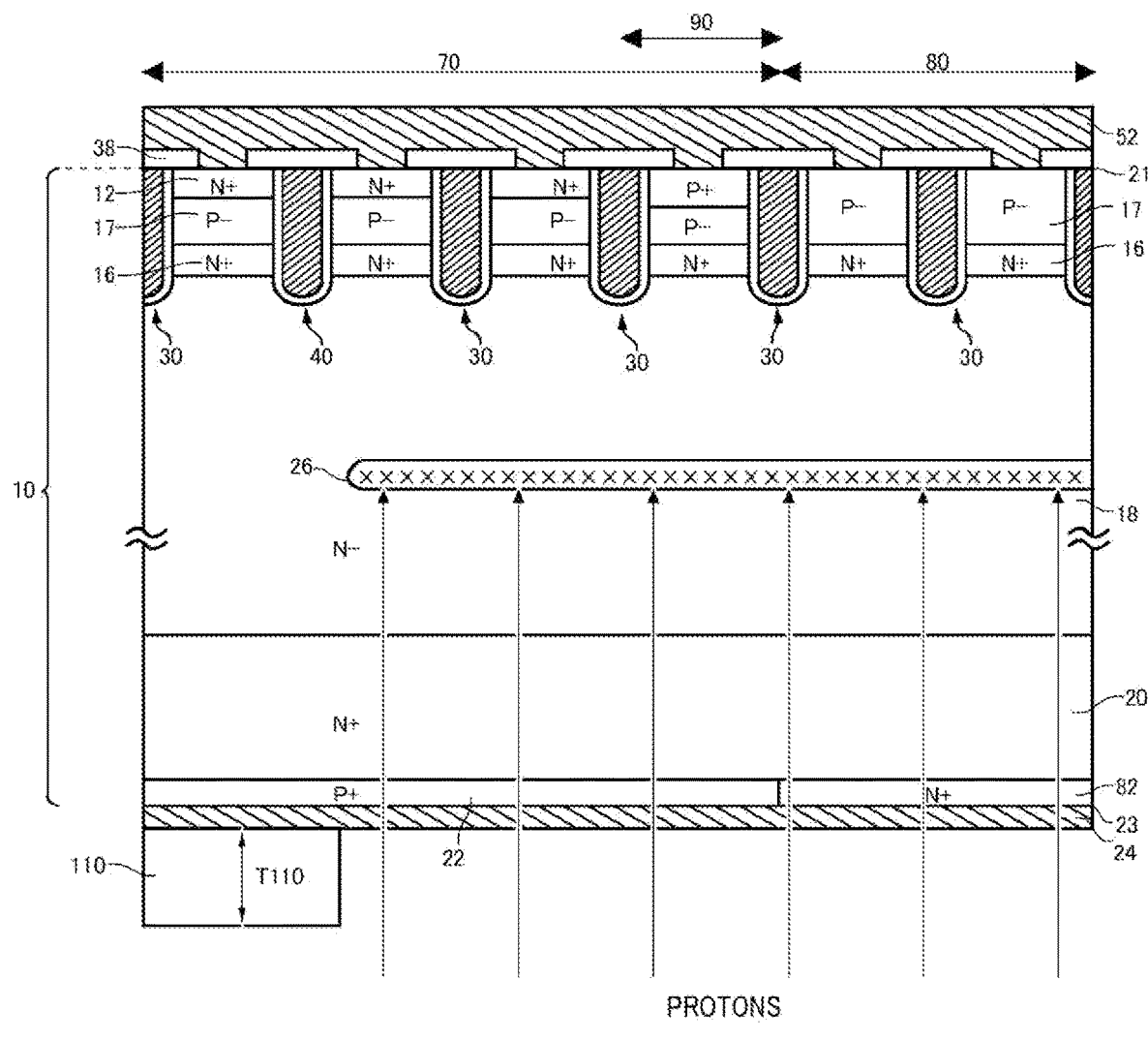
FIG. 17 is s a diagram describing the step of forming the crystalline defect region 19 and the high concentration region 26 by implanting hydrogen ions (protons in the present example) from the bottom surface 23 side of the semiconductor substrate 10.

FIG. 17 is s a diagram describing the step of forming the crystalline defect region 19 and the high concentration region 26 by implanting hydrogen ions (protons in the present example) from the bottom surface 23 side of the semiconductor substrate 10. The region into which protons are not to be implanted is covered by the mask 110 such as a photoresist. The mask 110 may be provided on the collector electrode 24. The thickness T110 of the mask 110 is sufficiently greater than the depth (range) to which the protons are implanted into the semiconductor substrate 10.

In a case where the mask 110 is an organic film such as a photoresist, with the hydrogen ion implantation depth being X1 (μm), the lower limit value Y1 (μm) for the thickness T110 of the mask 110 may be expressed relative to X1 (μm), as shown by the relational expression (Expression 1) shown below.

$$Y1 = 5.52317 \times (X1)^{0.79538} \qquad \text{Expression 1:}$$

In this way, the region covered by the mask 110 can be sufficiently shielded from the hydrogen ions. In a case where the mask 110 is an organic film such as a photoresist, with the acceleration energy at the time of the hydrogen ion implantation being E1 (eV), the lower limit value Y2 (μm) of the thickness T110 of the mask 110 may be expressed relative to E1 (eV), as shown by the relational expression (Expression 2) shown below.

$$Y2 = 1.07515 \times 10^{-11} \times (E1)^2 + 3.83637 \times 10^{-5} \times (E1) \qquad \text{Expression 2:}$$

Based on the above, the region covered by the mask 110 can be sufficiently shielded from the hydrogen ions.

In the proton implantation step, the hydrogen ions may be implanted with an acceleration energy that causes the distance between the proton implantation position and the top surface 21 of the semiconductor substrate 10 to be greater than or equal to 8 μm. The proton acceleration energy may be greater than or equal to 2.0 MeV, greater than or equal to 3.0 MeV, or greater than or equal to 4.0 MeV. By adjusting the acceleration energy, it is possible to form the high concentration region 26 on the top surface 21 side of the semiconductor substrate 10. The high concentration region 26 may be formed at the position of the accumulation region 16.

Figure 18:
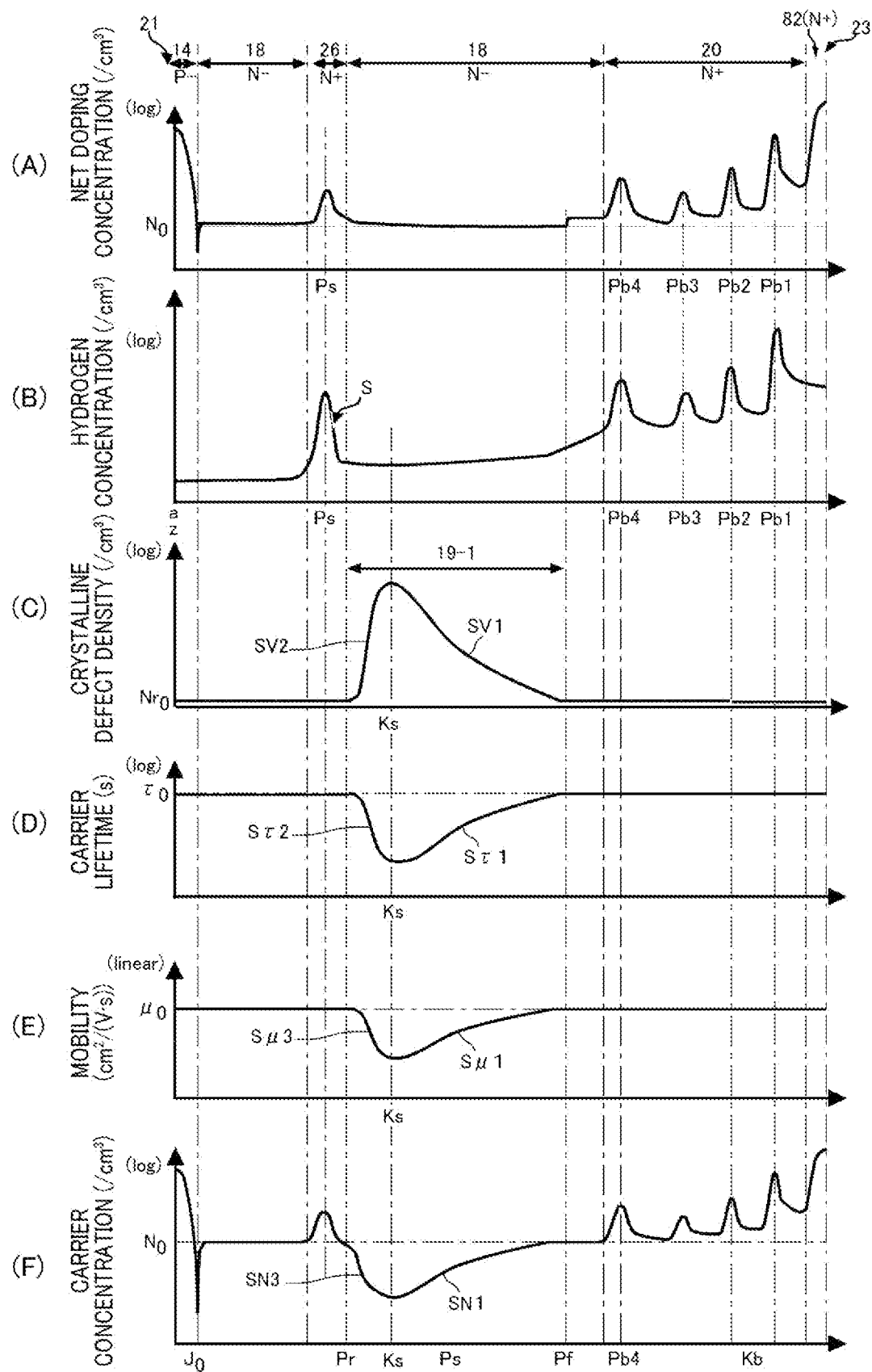
FIG. 18 shows distribution diagrams, in the depth direction, of the net doping concentration (A), the hydrogen concentration (B), the crystalline defect density (C), the carrier lifetime (D), the carrier mobility (E), and the carrier concentration (F) in the semiconductor device 100 shown in FIG. 17.

FIG. 18 shows distribution diagrams, in the depth direction, of the net doping concentration (A), the hydrogen concentration (B), the crystalline defect density (C), the carrier lifetime (D), the carrier mobility (E), and the carrier concentration (F) in the semiconductor device 100 shown in FIG. 17. As described above, in the present example, the high concentration region 26 is formed by implanting hydrogen ions from the bottom surface 23 of the semiconductor substrate 10.

As shown by the distribution drawing (A), there may be a region in which the net doping concentration is higher than the concentration $N_0$, to a position Pf that is farther on the top surface 21 side than where the position Pb4 is located. The hydrogen ions pass through the semiconductor substrate 10, from the bottom surface 23 side to the position Ps, and crystalline defects that are mainly vacancies and double vacancies are formed. Since the hydrogen concentration from the position Pb4 to the position Pf is sufficiently high, the dangling bonds of the crystalline defects are terminated by the hydrogen, and hydrogen donors are formed.

As shown by the distribution drawing (B), the hydrogen concentration has a peak at the position Ps. The hydrogen concentration distribution of the present example has a tail S from the peak position Ps toward one main surface (the bottom surface 23 in the present example). The hydrogen concentration between the position Ps and the position Pb4 may be higher than the hydrogen concentration in the anode region 14.

As shown by the distribution drawing (C), the crystalline defect density distribution has a peak at the position Ks. The crystalline defect density distribution has a tail SV1 from the position Ks toward the bottom surface 23, and a tail SV2 from the position Ks toward the top surface 21. The tail SV1 of the present example is gentler than the tail SV2. The region in which the crystalline defect density is higher than the concentration $Nr_0$ is the region from the position Pr to the position Pf.

As shown by the distribution drawing (D), the carrier lifetime distribution has a peak at the position Ks. The carrier lifetime distribution has a tail Sτ1 from the position Ks toward the bottom surface 23, and a tail Sτ2 from the position Ks toward the top surface 21. The tail Sτ1 of the present example is gentler than the tail Sτ2. The region in which the carrier lifetime is lower than $\tau_0$ is the region from the position Pr to the position Pf.

As shown by the distribution drawing (E), the carrier mobility distribution has a peak at the position Ks. The carrier mobility distribution has a tail Sμ1 from the position Ks toward the bottom surface 23, and a tail Sμ3 from the position Ks toward the top surface 21. The tail Sμ1 of the present example is gentler than the tail Sμ3. The region in which the carrier mobility is less than $\mu_0$ is the region from the position Pr to the position Pf.

As shown by the distribution drawing (F), the carrier concentration distribution has a peak at the position Ks. The carrier concentration distribution has a tail SN1 from the position Ks toward the bottom surface 23, and a tail SN3 from the position Ks toward the top surface 21. The tail SN1 of the present example is gentler than the tail SN3. The tails SV1, Sτ1, Sμ1, and SN1 of the present example may reach the buffer region 20, but do not need to reach the buffer region 20.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: semiconductor substrate, 11: well region, 12: emitter region, 14: anode region, 15: contact region, 16: accumulation region, 17: base region, 18: drift region, 19: crystalline defect region, 19-1: crystalline defect region, 19-2: crystalline defect region, 20: buffer region, 21: top surface, 22: collector region, 23: bottom surface, 24: collector electrode, 26: high concentration region, 27: bottom-surface-side electrode, 29: extending portion, 30: dummy trench portion, 31: connecting portion, 32: dummy dielectric, 34: dummy conducting portion, 38: interlayer dielectric film, 39: extending portion, 40: gate trench portion, 41: connecting portion, 42: gate dielectric, 44: gate conducting portion, 48: gate runner, 49: contact hole, 50: gate metal layer, 52: emitter electrode, 53: top-surface-side electrode, 54: contact hole, 56: contact hole, 58: barrier metal, 60: first mesa portion, 62: second mesa portion, 64: third mesa portion, 70: transistor portion, 74: top-surface-side lifetime control region, 78: bottomsurface-side lifetime control region, 80: diode portion, 81: extending region, 82: cathode region, 90: interface portion, 92: edge termination structure portion, 100: semiconductor device, 110: mask, 116: gate pad, 118: emitter pad, 120: active portion, 140: peripheral edge, 150: semiconductor device, 200: semiconductor device, 274: top-surface-side lifetime control region

What is claimed is:

1. A semiconductor device manufacturing method, comprising:
   a step of implanting hydrogen ions in a depth direction of a semiconductor substrate through one main surface of the semiconductor substrate; and
   a step of annealing the semiconductor substrate at a first temperature to reduce crystalline defects generated at a position where the hydrogen ion implantation causes a maximum hydrogen concentration, thereby forming a position where a defect density of crystalline defects formed by the hydrogen ion implantation is at a maximum value to be closer to the one main surface than where a position of the maximum hydrogen concentration is located.

2. The semiconductor device manufacturing method according to claim 1, further comprising:
   before the step of implanting hydrogen ions in the depth direction of the semiconductor substrate through the one main surface side of the semiconductor substrate:
      a step of implanting hydrogen ions in the depth direction of the semiconductor substrate through the other main surface side of the semiconductor substrate; and
      a step of annealing the semiconductor substrate, into which the hydrogen ions have been implanted through the other main surface, at a second temperature that is higher than the first temperature.

3. The semiconductor device manufacturing method according to claim 2, wherein
   the step of implanting hydrogen ions in the depth direction of the semiconductor substrate through the other main surface of the semiconductor substrate includes a step of implanting the hydrogen ions a plurality of times, such that peaks of a concentration distribution of the hydrogen ions are at different positions in the depth direction of the semiconductor substrate.

4. The semiconductor device manufacturing method according to claim 1, further comprising:
   a step of forming the semiconductor substrate into chips after the step of annealing at the first temperature; and
   a soldering step of soldering the semiconductor substrate that has been formed into chips at a third temperature onto a circuit board, wherein
   the third temperature is lower than the first temperature.

5. The semiconductor device manufacturing method according to claim 1, wherein
   in the step of implanting the hydrogen ions, the hydrogen ions are implanted with an acceleration energy resulting in a range of 8 μm or more from the one main surface of the semiconductor substrate.

6. The semiconductor device manufacturing method according to claim 1, wherein
   an acceleration energy in the step of implanting the hydrogen ions is greater than or equal to 1.0 MeV.

7. The semiconductor device manufacturing method according to claim 6, wherein
   the acceleration energy is greater than or equal to 1.5 MeV.

8. The semiconductor device manufacturing method according to claim 1, wherein
   an acceleration energy in the step of implanting the hydrogen ions is less than or equal to 11.0 MeV.

9. The semiconductor device manufacturing method according to claim 8, wherein
   the acceleration energy is less than or equal to 5.0 MeV.

10. The semiconductor device manufacturing method according to claim 8, wherein
    the acceleration energy is less than or equal to 2.0 MeV.

11. The semiconductor device manufacturing method according to claim 1, wherein
    a dose amount of the hydrogen ions in the step of implanting the hydrogen ions is greater than or equal to $1.0 \times 10^{12}/\text{cm}^2$.

12. The semiconductor device manufacturing method according to claim 1, wherein
    a dose amount of the hydrogen ions in the step of implanting the hydrogen ions is less than or equal to $1.0 \times 10^{15}/\text{cm}^2$.

* * * * *